US011567200B2

(12) United States Patent
Eichenholz et al.

(10) Patent No.: US 11,567,200 B2
(45) Date of Patent: Jan. 31, 2023

(54) LIDAR SYSTEM WITH POLYGON MIRROR

(71) Applicant: Luminar, LLC, Orlando, FL (US)

(72) Inventors: Jason M. Eichenholz, Orlando, FL (US); Scott R. Campbell, Sanford, FL (US); John E. McWhirter, Winter Park, FL (US); Matthew D. Weed, Orlando, FL (US); Lane A. Martin, Vancouver, WA (US)

(73) Assignee: Luminar, LLC, Orlando, FL (US)

( * ) Notice: Subject to any disclaimer, the term of this patent is extended or adjusted under 35 U.S.C. 154(b) by 388 days.

(21) Appl. No.: 16/879,091

(22) Filed: May 20, 2020

(65) Prior Publication Data
US 2020/0284906 A1 Sep. 10, 2020

Related U.S. Application Data

(63) Continuation of application No. 15/965,519, filed on Apr. 27, 2018, now Pat. No. 10,663,585.
(Continued)

(51) Int. Cl.
*G02B 26/08* (2006.01)
*G01S 17/08* (2006.01)
(Continued)

(52) U.S. Cl.
CPC ............ *G01S 17/08* (2013.01); *G01S 7/4813* (2013.01); *G01S 7/4817* (2013.01); *G01S 17/42* (2013.01);
(Continued)

(58) Field of Classification Search
CPC ...... G01S 17/08; G01S 7/4813; G01S 7/4817; G01S 17/42; G01S 17/931; G01S 17/87;
(Continued)

(56) References Cited

U.S. PATENT DOCUMENTS 5,006,721 A 4/1991 Cameron et al.
5,546,188 A 8/1996 Wangler et al.
(Continued)

FOREIGN PATENT DOCUMENTS

WO 2013/087799 6/2013

OTHER PUBLICATIONS

Kurdej et al., "Map Aided Evidential Grids for Driving Scene Understanding," IEEE Intelligent Transportation Systems Magazine, IEEE, 2015, pp. 30-41.
(Continued)

*Primary Examiner* — Euncha P Cherry

(57) ABSTRACT

A lidar system includes one or more light sources configured to generate a first beam of light and a second beam of light, a scanner configured to scan the first and second beams of light across a field of regard of the lidar system, and a receiver configured to detect the first beam of light and the second beam of light scattered by one or more remote targets. The scanner includes a rotatable polygon mirror that includes multiple reflective surfaces angularly offset from one another along a periphery of the polygon mirror, the reflective surfaces configured to reflect the first and second beams of light to produce a series of scan lines as the polygon mirror rotates. The scanner also includes a pivotable scan mirror configured to (i) reflect the first and second beams of light and (ii) pivot to distribute the scan lines across the field of regard.

25 Claims, 36 Drawing Sheets

Related U.S. Application Data

(60) Provisional application No. 62/590,235, filed on Nov. 22, 2017.

(51) Int. Cl.

| | | |
|---|---|---|
| *G01S 7/481* | (2006.01) | |
| *G02B 26/10* | (2006.01) | |
| *G02B 26/12* | (2006.01) | |
| *H01L 27/146* | (2006.01) | |
| *G01S 17/42* | (2006.01) | |
| *G01S 17/931* | (2020.01) | |
| *G02B 5/09* | (2006.01) | |
| *G02B 7/182* | (2021.01) | |
| *G02B 27/09* | (2006.01) | |
| *G02B 27/10* | (2006.01) | |
| *G02B 27/30* | (2006.01) | |
| *H01L 25/16* | (2006.01) | |
| *G01S 17/87* | (2020.01) | |
| *G02B 5/08* | (2006.01) | |
| *G02B 5/18* | (2006.01) | |
| *G02B 5/22* | (2006.01) | |

(52) U.S. Cl.
CPC .............. *G01S 17/931* (2020.01); *G02B 5/09* (2013.01); *G02B 7/1821* (2013.01); *G02B 26/101* (2013.01); *G02B 26/105* (2013.01); *G02B 26/123* (2013.01); *G02B 26/125* (2013.01); *G02B 27/0955* (2013.01); *G02B 27/0977* (2013.01); *G02B 27/1086* (2013.01); *G02B 27/30* (2013.01); *H01L 25/167* (2013.01); *H01L 27/14643* (2013.01); *H01L 27/14647* (2013.01); *G01S 17/87* (2013.01); *G02B 5/0841* (2013.01); *G02B 5/1857* (2013.01); *G02B 5/22* (2013.01); *H01L 27/14694* (2013.01)

(58) Field of Classification Search
CPC ...... G02B 5/09; G02B 7/1821; G02B 26/101; G02B 26/105; G02B 26/123; G02B 26/125; G02B 27/0955; G02B 27/0977; G02B 27/1086; G02B 27/30; G02B 5/0841; G02B 5/1857; G02B 5/22; H01L 25/167; H01L 27/14643; H01L 27/14647; H01L 27/14694
See application file for complete search history.

(56) References Cited

U.S. PATENT DOCUMENTS

| | | | |
|---|---|---|---|
| 5,692,287 A * | 12/1997 | Nakamura | G02B 5/09 |
| | | | 359/850 |
| 5,793,491 A | 8/1998 | Wangler et al. | |
| 5,838,239 A | 11/1998 | Stern et al. | |
| 6,317,202 B1 | 11/2001 | Hosokawa et al. | |
| 6,449,384 B2 | 9/2002 | Laumeyer et al. | |
| 6,710,324 B2 | 3/2004 | Hipp | |
| 6,723,975 B2 | 4/2004 | Saccomanno | |
| 6,747,747 B2 | 6/2004 | Hipp | |
| 6,759,649 B2 | 7/2004 | Hirm | |
| 6,864,498 B2 | 3/2005 | Katzir et al. | |
| 7,092,548 B2 | 8/2006 | Laumeyer et al. | |
| 7,209,221 B2 | 4/2007 | Breed et al. | |
| 7,345,271 B2 | 3/2008 | Boehlau et al. | |
| 7,405,676 B2 | 7/2008 | Janssen | |
| 7,443,903 B2 | 10/2008 | Leonardo et al. | |
| 7,532,311 B2 | 5/2009 | Henderson et al. | |
| 7,541,943 B2 | 6/2009 | Manor | |
| 7,541,944 B2 | 6/2009 | Konya et al. | |
| 7,570,793 B2 | 8/2009 | Lages et al. | |
| 7,583,364 B1 | 9/2009 | Mayor et al. | |
| 7,649,920 B2 | 1/2010 | Welford | |
| 7,652,752 B2 | 1/2010 | Fetzer et al. | |
| 7,839,491 B2 | 11/2010 | Harris et al. | |
| 7,872,794 B1 | 1/2011 | Minelly et al. | |
| 7,902,570 B2 | 3/2011 | Itzler et al. | |
| 7,945,408 B2 | 5/2011 | Dimsdale et al. | |
| 7,969,558 B2 | 6/2011 | Hall | |
| 7,995,796 B2 | 8/2011 | Retterath et al. | |
| 8,009,186 B2 | 8/2011 | Tomioka | |
| 8,059,263 B2 | 11/2011 | Haberer et al. | |
| 8,072,663 B2 | 12/2011 | O'Neill et al. | |
| 8,081,301 B2 | 12/2011 | Stann et al. | |
| 8,116,968 B2 | 2/2012 | Jou et al. | |
| 8,138,849 B2 | 3/2012 | West et al. | |
| 8,248,272 B2 | 8/2012 | Arnold et al. | |
| 8,279,420 B2 | 10/2012 | Ludwig et al. | |
| 8,280,623 B2 | 10/2012 | Trepagnier et al. | |
| 8,299,957 B2 | 10/2012 | Tseng | |
| 8,346,480 B2 | 1/2013 | Trepagnier et al. | |
| 8,364,334 B2 | 1/2013 | Au et al. | |
| 8,452,561 B2 | 5/2013 | Dimsdale et al. | |
| 8,548,014 B2 | 10/2013 | Fermann et al. | |
| 8,625,080 B2 | 1/2014 | Heizman et al. | |
| 8,629,977 B2 | 1/2014 | Phillips et al. | |
| 8,659,643 B2 | 2/2014 | Purvis et al. | |
| 8,675,181 B2 | 3/2014 | Hall | |
| 8,723,955 B2 | 5/2014 | Klehn et al. | |
| 8,767,190 B2 | 7/2014 | Hall | |
| 8,796,605 B2 | 8/2014 | Mordarski et al. | |
| 8,836,922 B1 | 9/2014 | Pennecot et al. | |
| 8,842,356 B2 | 9/2014 | Sandner et al. | |
| 8,880,296 B2 | 11/2014 | Breed | |
| 8,896,818 B2 | 11/2014 | Walsh et al. | |
| 8,918,270 B2 | 12/2014 | Wang | |
| 8,934,509 B2 | 1/2015 | Savage-Leuchs et al. | |
| 8,976,339 B2 | 3/2015 | Phillips et al. | |
| 9,000,347 B2 | 4/2015 | Woodward et al. | |
| 9,041,136 B2 | 5/2015 | Chia | |
| 9,048,370 B1 | 6/2015 | Urmson et al. | |
| 9,063,549 B1 | 6/2015 | Pennecot et al. | |
| 9,069,060 B1 | 6/2015 | Zbrozek et al. | |
| 9,074,878 B2 | 7/2015 | Steffey et al. | |
| 9,086,273 B1 | 7/2015 | Gruver et al. | |
| 9,086,481 B1 | 7/2015 | Dowdall et al. | |
| 9,091,754 B2 | 7/2015 | d'Aligny | |
| 9,103,669 B2 | 8/2015 | Giacotto et al. | |
| 9,121,703 B1 | 9/2015 | Droz et al. | |
| 9,160,140 B2 | 10/2015 | Gusev et al. | |
| 9,170,333 B2 | 10/2015 | Mheen et al. | |
| 9,188,674 B2 | 11/2015 | Suzuki et al. | |
| 9,199,641 B2 | 12/2015 | Ferguson et al. | |
| 9,213,085 B2 | 12/2015 | Kanter | |
| 9,239,260 B2 | 1/2016 | Bayha et al. | |
| 9,239,959 B1 | 1/2016 | Evans et al. | |
| 9,246,041 B1 | 1/2016 | Clausen et al. | |
| 9,285,464 B2 | 3/2016 | Pennecot et al. | |
| 9,285,477 B1 | 3/2016 | Smith et al. | |
| 9,297,901 B2 | 3/2016 | Bayha et al. | |
| 9,299,731 B1 | 3/2016 | Lenius et al. | |
| 9,304,154 B1 | 4/2016 | Droz et al. | |
| 9,304,203 B1 | 4/2016 | Droz et al. | |
| 9,304,316 B2 | 4/2016 | Weiss et al. | |
| 9,310,471 B2 | 4/2016 | Sayyah et al. | |
| 9,335,255 B2 | 5/2016 | Retterath et al. | |
| 9,360,554 B2 | 6/2016 | Retterath et al. | |
| 9,368,933 B1 | 6/2016 | Nijjar et al. | |
| 9,383,201 B2 | 7/2016 | Jachman et al. | |
| 9,383,445 B2 | 7/2016 | Lu et al. | |
| 9,383,753 B1 | 7/2016 | Templeton et al. | |
| 9,476,968 B2 | 10/2016 | Anderson et al. | |
| 9,477,007 B2 | 10/2016 | Magnus et al. | |
| 9,606,222 B2 | 3/2017 | Bayha et al. | |
| 9,618,742 B1 | 4/2017 | Droz et al. | |
| 9,625,580 B2 | 4/2017 | Kotelnikov et al. | |
| 9,753,351 B2 | 9/2017 | Eldada | |
| 9,791,555 B2 | 10/2017 | Zhu | |
| 9,798,003 B2 | 10/2017 | Hammes et al. | |
| 9,817,121 B2 | 11/2017 | Inoue et al. | |
| 9,823,351 B2 | 11/2017 | Haslim et al. | |

(56) References Cited

U.S. PATENT DOCUMENTS

| | | |
|---|---|---|
| RE46,672 E | 1/2018 | Hall |
| 9,857,472 B2 | 1/2018 | Mheen et al. |
| 9,869,753 B2 | 1/2018 | Eldada et al. |
| 9,923,329 B2 | 3/2018 | Savage-Leuchs et al. |
| 9,989,755 B2 | 6/2018 | Fujimura et al. |
| 9,995,820 B2 | 6/2018 | Jachmann et al. |
| 10,018,724 B2 | 7/2018 | Royo et al. |
| 10,048,381 B2 | 8/2018 | Koehler |
| 10,073,166 B2 | 9/2018 | Dussan |
| 10,107,914 B2 | 10/2018 | Kalscheur et al. |
| 10,180,517 B2 | 1/2019 | Wiersema |
| 10,203,399 B2 | 2/2019 | Retterath et al. |
| 2001/0043717 A | 1/2001 | Laumeyer et al. |
| 2002/0149760 A1 | 10/2002 | Hipp |
| 2002/0149761 A1 | 10/2002 | Saccomanno |
| 2003/0066954 A1 | 4/2003 | Hipp |
| 2003/0080285 A1 | 5/2003 | Hipp |
| 2004/0062442 A1 | 4/2004 | Laumeyer et al. |
| 2005/0034036 A1 | 2/2005 | Lages et al. |
| 2005/0195383 A1 | 9/2005 | Breed et al. |
| 2006/0145062 A1 | 7/2006 | Boehlau et al. |
| 2006/0227317 A1 | 10/2006 | Henderson et al. |
| 2006/0290920 A1 | 12/2006 | Kampchen et al. |
| 2007/0024840 A1 | 2/2007 | Fetzer et al. |
| 2007/0248136 A1 | 10/2007 | Leonardo et al. |
| 2008/0210881 A1 | 9/2008 | Harris et al. |
| 2008/0247425 A1 | 10/2008 | Welford |
| 2008/0264164 A1 | 10/2008 | Solheim |
| 2009/0099813 A1 | 4/2009 | Dimsdale et al. |
| 2009/0102313 A1 | 4/2009 | West et al. |
| 2009/0252376 A1 | 10/2009 | Retterath et al. |
| 2009/0273770 A1 | 11/2009 | Bauhahn et al. |
| 2009/0324293 A1 | 12/2009 | Tomioka |
| 2010/0007870 A1 | 1/2010 | Haberer et al. |
| 2010/0020306 A1 | 1/2010 | Hall |
| 2010/0025798 A1 | 2/2010 | Itzler et al. |
| 2010/0034221 A1 | 2/2010 | Dragic |
| 2010/0053715 A1 | 3/2010 | O'Neill et al. |
| 2010/0114416 A1 | 5/2010 | Au et al. |
| 2010/0128248 A1 | 5/2010 | Heizman et al. |
| 2010/0165082 A1 | 7/2010 | Kiehn et al. |
| 2010/0302528 A1 | 12/2010 | Hall |
| 2011/0032508 A1 | 2/2011 | Ludwig et al. |
| 2011/0085155 A1 | 4/2011 | Stann et al. |
| 2011/0102764 A1 | 5/2011 | Walsh et al. |
| 2011/0122895 A1 | 5/2011 | Savage-Leuchs et al. |
| 2011/0161031 A1 | 6/2011 | Dimsdale et al. |
| 2011/0216304 A1 | 9/2011 | Hall |
| 2012/0035788 A1 | 2/2012 | Trepagnier et al. |
| 2012/0101680 A1 | 4/2012 | Trepagnier et al. |
| 2012/0162373 A1 | 6/2012 | Mheen et al. |
| 2012/0188625 A1 | 7/2012 | Sandner |
| 2012/0219020 A1 | 8/2012 | Fermann et al. |
| 2012/0227263 A1 | 9/2012 | Leclair et al. |
| 2013/0033742 A1 | 2/2013 | Rogers et al. |
| 2013/0050676 A1 | 2/2013 | d'Aligny |
| 2013/0087689 A1 | 4/2013 | Woodward et al. |
| 2013/0235366 A1 | 9/2013 | Giacotto et al. |
| 2014/0027607 A1 | 1/2014 | Mordarski et al. |
| 2014/0063255 A1 | 3/2014 | Breed |
| 2014/0063489 A1 | 3/2014 | Steffey et al. |
| 2014/0111805 A1 | 4/2014 | Albert et al. |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0233942 A1 | 8/2014 | Kanter |
| 2014/0293263 A1 | 10/2014 | Justice et al. |
| 2014/0293266 A1 | 10/2014 | Hsu et al. |
| 2014/0300952 A1 | 10/2014 | Gusev et al. |
| 2014/0319638 A1 | 10/2014 | Chia |
| 2014/0320845 A1 | 10/2014 | Bayha et al. |
| 2014/0327945 A1 | 11/2014 | Weiss et al. |
| 2014/0332676 A1 | 11/2014 | Bayha et al. |
| 2015/0015868 A1 | 1/2015 | Jachmann et al. |
| 2015/0055117 A1 | 2/2015 | Pennecot et al. |
| 2015/0092184 A1 | 4/2015 | Schultz |
| 2015/0131080 A1 | 5/2015 | Retterath et al. |
| 2015/0153271 A1 | 6/2015 | Retterath et al. |
| 2015/0177368 A1 | 6/2015 | Bayha et al. |
| 2015/0185244 A1 | 7/2015 | Inoue et al. |
| 2015/0185313 A1 | 7/2015 | Zhu |
| 2015/0192676 A1 | 7/2015 | Kotelnikov et al. |
| 2015/0192677 A1 | 7/2015 | Yu et al. |
| 2015/0204978 A1 | 7/2015 | Hammes et al. |
| 2015/0214690 A1 | 7/2015 | Savage-Leuchs et al. |
| 2015/0266472 A1 | 9/2015 | Ferguson et al. |
| 2015/0293228 A1 | 10/2015 | Retterath et al. |
| 2015/0301182 A1 | 10/2015 | Geiger et al. |
| 2015/0323654 A1 | 11/2015 | Jachmann et al. |
| 2015/0332102 A1 | 11/2015 | Lu et al. |
| 2015/0378012 A1 | 12/2015 | Sayyah et al. |
| 2015/0378023 A1 | 12/2015 | Royo Royo et al. |
| 2015/0378241 A1 | 12/2015 | Eldada |
| 2016/0025842 A1 | 1/2016 | Anderson et al. |
| 2016/0047895 A1 | 2/2016 | Dussan |
| 2016/0047896 A1 | 2/2016 | Dussan |
| 2016/0047901 A1 | 2/2016 | Pacala et al. |
| 2016/0049765 A1 | 2/2016 | Eldada |
| 2016/0146939 A1 | 5/2016 | Shpunt et al. |
| 2016/0146940 A1 | 5/2016 | Koehler |
| 2016/0161600 A1 | 6/2016 | Eldada et al. |
| 2016/0245919 A1 | 8/2016 | Kalscheur et al. |
| 2017/0031066 A1 | 2/2017 | Wiersema |
| 2017/0038541 A1 | 2/2017 | Fujimura et al. |
| 2017/0242442 A1 | 8/2017 | Minster |
| 2018/0032042 A1 | 2/2018 | Turpin et al. |
| 2018/0188355 A1* | 7/2018 | Bao .................. G02B 19/0076 |
| 2018/0284277 A1* | 10/2018 | LaChapelle ............. G01S 17/89 |

OTHER PUBLICATIONS

Non-Final Office Action dated Mar. 29, 2019 for U.S. Appl. No. 15/965,197.

Non-Final Office Action dated Sep. 13, 2018 for U.S. Appl. No. 15/965,288.

Non-Final Office Action dated Oct. 9, 2018 for U.S. Appl. No. 15/965,471.

Non-Final Office Action dated Feb. 26, 2019 for U.S. Appl. No. 16/046,584.

Non-Final Office Action dated Mar. 11, 2019 for U.S. Appl. No. 16/107,521.

Non-Final Office Action dated Mar. 8, 2019 for U.S. Appl. No. 15/958,749.

* cited by examiner

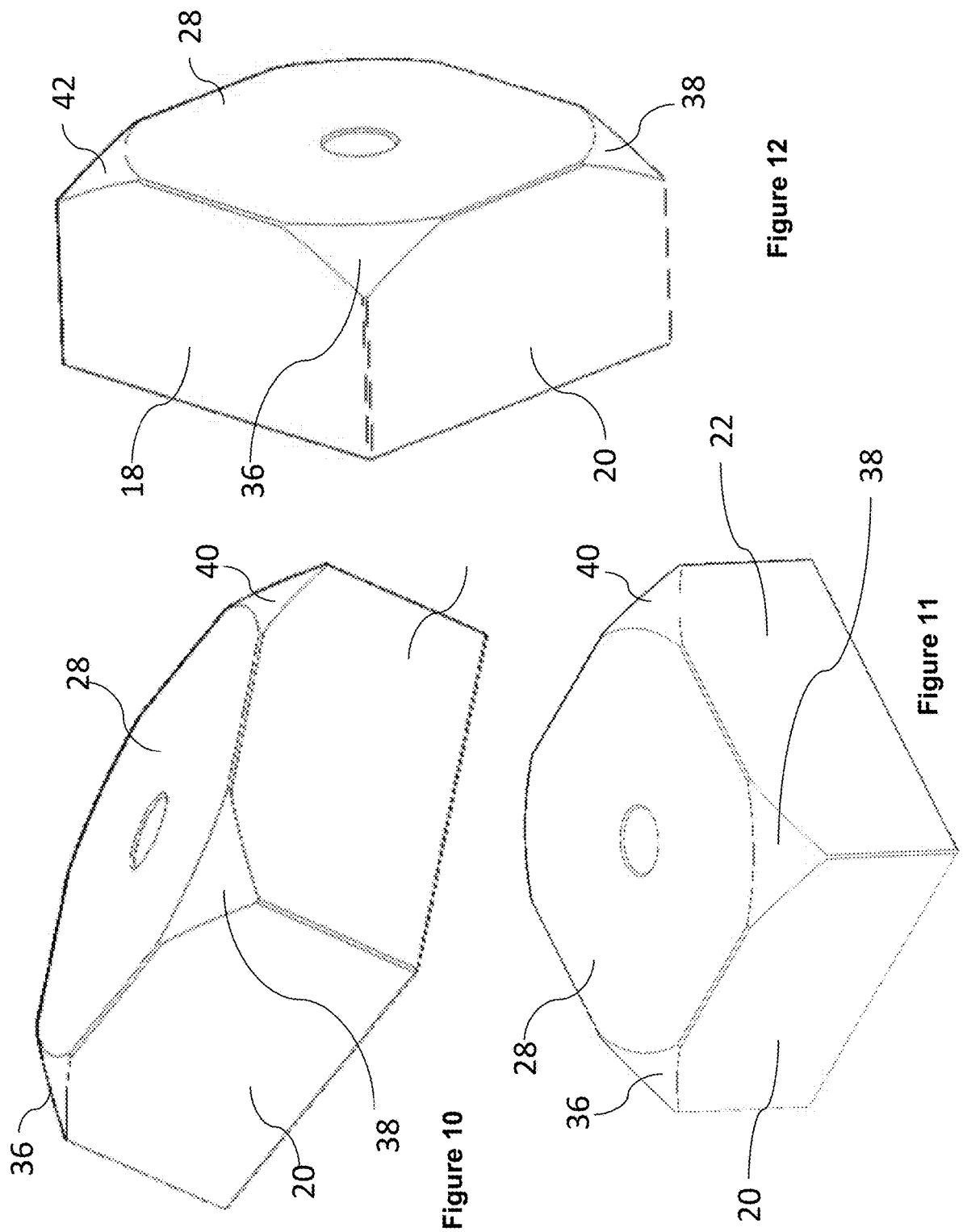

LIDAR SYSTEM WITH POLYGON MIRROR

REFERENCE TO RELATED APPLICATIONS

This application is a continuation of U.S. patent application Ser. No. 15/965,519, filed on Apr. 27, 2018, entitled "Manufacturing a Balanced Polygon Mirror," which claims priority to U.S. Provisional Patent Application No. 62/590,235, filed Nov. 22, 2017, entitled "Low Profile Lidar Scanner with Polygon Mirror," the entirety of which is incorporated herein by reference.

FIELD OF TECHNOLOGY

This disclosure relates generally to lidar sensor heads and, more specifically, to multi-mirror lidar sensor heads having a compact construction so as to occupy minimal area when deployed on a vehicle.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Light detection and ranging (lidar) is a technology that can be used to measure distances to remote targets. Typically, a lidar system includes a light source and an optical receiver. The light source can be, for example, a laser which emits light having a particular operating wavelength. The operating wavelength of a lidar system may lie, for example, in the infrared, visible, or ultraviolet portions of the electromagnetic spectrum. The light source emits light toward a target which then scatters the light. Some of the scattered light is received back at the receiver. The system determines the distance to the target based on one or more characteristics associated with the returned light. For example, the system may determine the distance to the target based on the time of flight of a returned light pulse.

While the precision and efficacy of lidar scanners have continually improved, the power requirements, heat dissipation, and physical dimensions of existing lidar scanners have posed obstacles to designers of lidar systems. With the increasing prevalence of the use of lidar systems in vehicles, such considerations are of increased concern to designers of lidar systems.

SUMMARY

A lidar system including a light emitting light source (i.e., a laser), a scanner configured to direct the embedded light to scan a field of regard (FOR) of the lidar system in accordance with a scan pattern, a receiver that detects light scattered by one or more remote targets, and a controller to control one or more mirrors of the scanner, is provided. The scanner includes both a polygon mirror and a planar mirror. The polygon mirror may be in the form of a rotatable block having a first wall, a second wall spaced away from and parallel to the first wall, and a plurality of reflective surfaces extending between the first and second walls, the reflective surfaces being angularly offset from one another along a periphery of the block. The planar mirror rotates about an axis orthogonal to an axis of rotation of the polygon mirror, and is thereby considered a pivotable oscillating planar mirror. At least the scanner and the receiver may be disposed inside a housing of a lidar sensor unit (or "sensor head"), and the lidar system can include one or several lidar sensor units.

The polygon mirror may also be provided with a motor to power its rotation that is disposed at least partially, but preferably substantially or entirely, within the rotatable block. By arranging the motor for the polygon mirror within the rotatable block of the polygon mirror, the overall three dimensional footprint of the scanner can be further reduced.

The polygon mirror may be provided with one or more tabs that pass through a stationary photo-interrupter as the polygon mirror rotates. The photo-interrupter provides feedback data indicative of the rotational speed of the polygon mirror, which feedback data can then be processed by a controller associated with the motor of the polygon mirror to regulate, stabilize, or adjust the rotational speed of the polygon mirror as needed.

The scanner of the lidar sensor unit is provided with a low profile when compared to conventional multi-mirror lidar systems. Certain structural and operational features of the lidar sensor units of the present disclosure may be employed, individually or collectively, to not only minimize the three-dimensional footprint or volume of space occupied by the lidar scanner, but also serve to improve aerodynamic performance (both internally and externally), reduce audible noise, reduce heat, and improve resistance to vibration, acceleration, deceleration, or other environmental factors that might otherwise negatively affect scanner accuracy and performance.

The orientation of the scanner, and specifically, the orientation of the axis of rotation of the polygon mirror, may be selected so as to align with an orientation of a vehicle in which the lidar sensor unit operates. In some implementations, however, a lidar system operating in a vehicle includes multiple lidar sensor units, with at least some of the lidar sensor units oriented differently from each other.

The planar mirror of the scanner may be provided with an optimized geometry to enhance durability and service life. For instance, the planar mirror may have a center of gravity closer to its reflective surface than conventional planar mirrors of lidar scanners. This may be effected by constructing a pivotable backing or support surface for the reflective surface of the planar mirror of a honeycomb structure or other ribbed structure, with material arranged such that the center of gravity of the planar mirror is closer to the reflective surface than to an edge of the ribbed or honeycomb structure opposite the reflective surface.

The speed of oscillation of the planar mirror may be controlled so as to dynamically vary distances between scan lines. In general, a scan line can have a horizontal orientation, vertical orientation, or any other suitable orientation. In at least some of the embodiments discussed herein, each scan line corresponds to a reflection of the emitted light from one of the reflective surfaces of the rotating polygon mirror. The distances between scan lines can vary on a frame-by-frame basis, and can vary in different portions of the field of regard. A drive signal of a motor driving the speed of oscillation of the planar mirror can be shaped as a Gaussian to optimally space scan lines apart. For example, the Y-scan mirror can be driven with a Gaussian-type function so that the mirror has a relatively high scan speed at the ends of its motion and a relatively low scan speed near the middle of its motion. This type of Gaussian scan produces a higher density of scan lines near the middle region of the FOR and a lower density of scan lines at the upper and lower ends of the FOR.

The width of the planar mirror can determine the horizontal scan range, also referred to below as the horizontal dimension of the field of regard ($FOR_H$). For a given polygon mirror, $FOR_H$ can be increased by selecting a wider planar mirror. The lidar sensor unit can support modular optical assembly, so that planar mirrors of different widths can be compatible with the same remaining opto-mechanics of the lidar sensor unit. Thus, by providing an oscillating planar mirror of a significantly greater width than the reflective surfaces of the rotating polygon mirror, not only can the oscillating planar mirror achieve desired field of regard along the vertical dimension ($FOR_V$), but the oscillating planar mirror, in concert with the polygon mirror, can also advantageously increase the $FOR_H$, all while reducing the overall three dimensional footprint of the lidar sensor unit.

The planar mirror preferably has a range of motion that exceeds the vertical dimension of the FOR. For instance, if the FOR is 30° vertically by 120° horizontally, the range of motion for the planar mirror (which, for the sake of convenience, is also referred to herein as a Y-scan mirror) can be 60° vertically, to accommodate a 30° vertical component of the FOR in various ranges. This enables a lidar sensor head to scan a greater range of vertical area, such as when a vehicle on which the lidar sensor is mounted approaches an incline.

As explained in more detail in the following detailed description, the polygon mirror, at any given time during its rotation, includes at least two active, adjacent reflective surfaces. This enables the lidar sensor unit to direct pulses toward different sections of a scan line so as to process at least two distinct return pulses within the time of a single ranging event. The outbound pulses can scatter from the same remote target or different remote targets. Using two beams of light with two facets of the polygon mirror thus increases the $FOR_H$ of the lidar sensor unit without increasing the time it takes to scan one line.

The adjacent reflective surfaces direct the output beams toward different portions of the planar mirror. Thus, the lidar sensor unit can have two active "eyes" that share both the polygon mirror and the planar mirror, thereby providing both a cost reduction and a size reduction. The beams are incident on the respective surfaces in such a manner that provides a large angular separation between the outbound beams, so as to reduce the probability of cross-talk detection. In one example, two beams can be offset along the x-axis by half a pixel to produce two times the pixel density in the overlap region (e.g., for a pair of adjacent pixels generated using one beam, another pixel centered at the midpoint between the pair of pixels can be generated using the other beam). In another example, two beams can be offset along the y-axis by half a line to produce two times the pixel density in the overlap region (e.g., for a pair of adjacent scan lines generated using one beam, another scan line centered between the pair of adjacent scan lines can be generated using the other beam). The first approach involves offsetting the pixels along the x-axis so that, in the overlap region, the pixels from one beam are interleaved along the x-axis with pixels from the other beam. The second approach involves offsetting the scan lines along the y-axis so that the scan lines are interleaved in the overlap region. These two approaches (interleaving pixels and interleaving scan lines) are independent of each other and can be implemented separately or together.

By having two adjacent active surfaces, and at least two inactive surfaces of the rotating polygon mirror at any one time, a baffle or shroud can be provided around the inactive surfaces so as to further reduce aerodynamic drag and aid in air circulation of the polygon mirror. The use of such a baffle or shroud is not possible with a 360° scanner, as such a shroud would block active reflective surfaces of the mirror.

Input and output beams can be incident on the same mirror operating in a lidar scanner, or the same multi-mirror assembly including a mirror to generate scan lines (e.g., a polygon mirror) and another mirror to distribute these scan lines along the other dimension (e.g., a planar mirror). The fields of view (FOVs) of the beams can be arranged to minimize the overall surface area. In another aspect of the present disclosure, the fields of view of two output beams define relatively small circles, whereas the field of view of the input beams defines a relatively large circle. The smaller circles are arranged adjacent to the larger circle, with little or no overlap, and with the imaginary line segment connecting the centers of the smaller circles displaced relative to the diameter of the larger circle. This more compact arrangement facilitates minimization of the overall three dimensional footprint of the scanner.

The lidar scanner of the present disclosure preferably employs a single lens with off-axis illumination for two detectors, which are placed in the same optical path. The displacement of the transit beam relative to the center of the lens allows the detectors to be placed adjacent one another and off-center, thereby further facilitating a minimized overall profile. The detector diameter is approximately 50-150 microns, and the detector separation distance is approximately 0.5-2 mm.

The use of off-axis illumination eliminates the need to use an overlap mirror with a center hole, which sometimes is referred to as a "doughnut mirror." In particular, the beams are coupled into the scanner by the side of an overlap mirror that reflects input light to the detector. The output beam(s) and the input beam(s) thus are not entirely coaxial, as discussed in more detail below. The output beam(s) and the input beam(s) are offset relative to each other spatially and angularly. In other implementations, however, a doughnut mirror can be used with the polygon mirror and the planar mirror of this disclosure.

Methods of manufacture of a suitable polygon mirror are also disclosed herein. To obtain optimal balance of the polygon mirror, and ensure the field of regard is accurately scanned, high-energy laser pulses are used to remove matter at precise locations of the rotating polygon mirror. This can be combined with initial drilling for coarse balancing (so as to achieve both coarse and fine balancing). More particularly, a coarse balancing procedure using a drill or another suitable equipment can be used to form a relatively well-balanced block, and the surfaces can be made reflective (as explained in greater detail below). The block then can be mated to a motor in an assembly to be used in a scanner (rather than using an assembly specifically set up for manufacturing or testing). Once mated to the motor, the block can be rotated, and high-energy laser pulses can remove excess material from the block to achieve a high degree of balancing.

The polygon mirror is preferably manufactured by surface replication. In embodiments where the polygon mirror includes an even number of facets, pairs of opposite facets may be serviced simultaneously. While a four-sided polygon mirror will be disclosed as the preferred embodiment, the specification will explain that other numbers of sides are possible, with the understanding that the more facets of the polygon mirror, the closer the overall polygon mirror resembles a circle.

The lidar scanner can be implemented in a manner that directs two angularly separated pulses toward different sections of the scan line and processes the return pulses within the time of a single ranging event, where the two pulses reflect from the same reflective surface of the polygon mirror. Thus, according to some implementations, a single sensor head includes a total of four beams and four detectors: each pair of beams includes two angularly separated beams that reflect from the same surface of the polygon mirror. The lidar system can process return pulses corresponding to a non-integer separation in pixels (for example, an angular separation corresponding to 5½ or 11½ pixels). In this manner, the system can superimpose the return values to more accurately determine the values of pixels 1, 2, 3, . . . , N of the scan line. Otherwise, the lidar system receives duplicate readings for many of the pixels. Additionally, separating the two beams by a significant number of pixels (e.g., approximately 9-13 pixels rather than 3-5 pixels) mitigates problems with defocusing of the beam received at the detectors. The separation distance between the detectors (e.g., 0.8-1.2 mm) corresponds to the angular separation of the beams (e.g., 2-3 degrees). Since the two detectors are separated by a certain distance, if the beams become defocused, there will not be a problem with crosstalk where light from one beam spills over to the other detector.

Alternately, the beams are interleaved/offset by ½-pixel so that one beam provides information about pixels 1, 2, 3, etc., and the other beam provides information about pixels 1½, 2½, 3½, etc. Since the pixels can be numbered in any fashion, this can also be expressed as the beams being offset by 1 pixel (e.g., one beam samples the odd pixels and the other beam samples the even pixels), where adjacent pixels may have some amount of overlap.

In some implementations, diffractive optical elements (DOEs) can be used to produce angularly separated beams. In other implementations, however, the lidar system uses fiber-optic power splitters and mechanical positioning/aiming to produce the angularly separated beams. For example, the output from the light source is split four ways (e.g., with a 4×1 power splitter, or with 3 2×1 power splitters) into four fiber-optic cables. Then, each of the four fiber-optic cables is terminated by a collimator (essentially, a lens that is rigidly coupled to the end of a fiber) to form a collimated free-space output beam. For each "eye" of the sensor head, two collimators can be positioned and aimed to form two angularly offset output beams (e.g., with a 2-degree angle between the beams). These two beams are directed so that together they reflect off of one face at a time of the rotating polygon mirror.

Further, the splitters can also be fiber-optic power splitters or free-space power splitters. The fiber-optic power splitters can be considered to be part of the light source or part of the optical elements.

The low-profile lidar scanner head can be provided as a box-like protrusion on each corner of the roof of a vehicle, preferably at 45° relative to each of the edges. In a particularly preferred embodiment, the lidar scanner head may be partially embedded in the vehicle roof or other vehicle body part so only a window of the unit protrudes prominently from the roof (or hood, side mirror, rear-view mirror, windshield, bumper, grill, or other body part surface in which the lidar scanner head is disposed).

BRIEF DESCRIPTION OF THE DRAWINGS

FIG. 10 is a top perspective view of a polygon mirror of the lidar sensor unit of FIG. 1;

FIG. 11 is a rear, top perspective view of the polygon mirror of the lidar sensor unit of FIG. 1;

FIG. 12 is a right, rear perspective view of the polygon mirror of the lidar sensor unit of FIG. 1;

DETAILED DESCRIPTION

Figure 1:
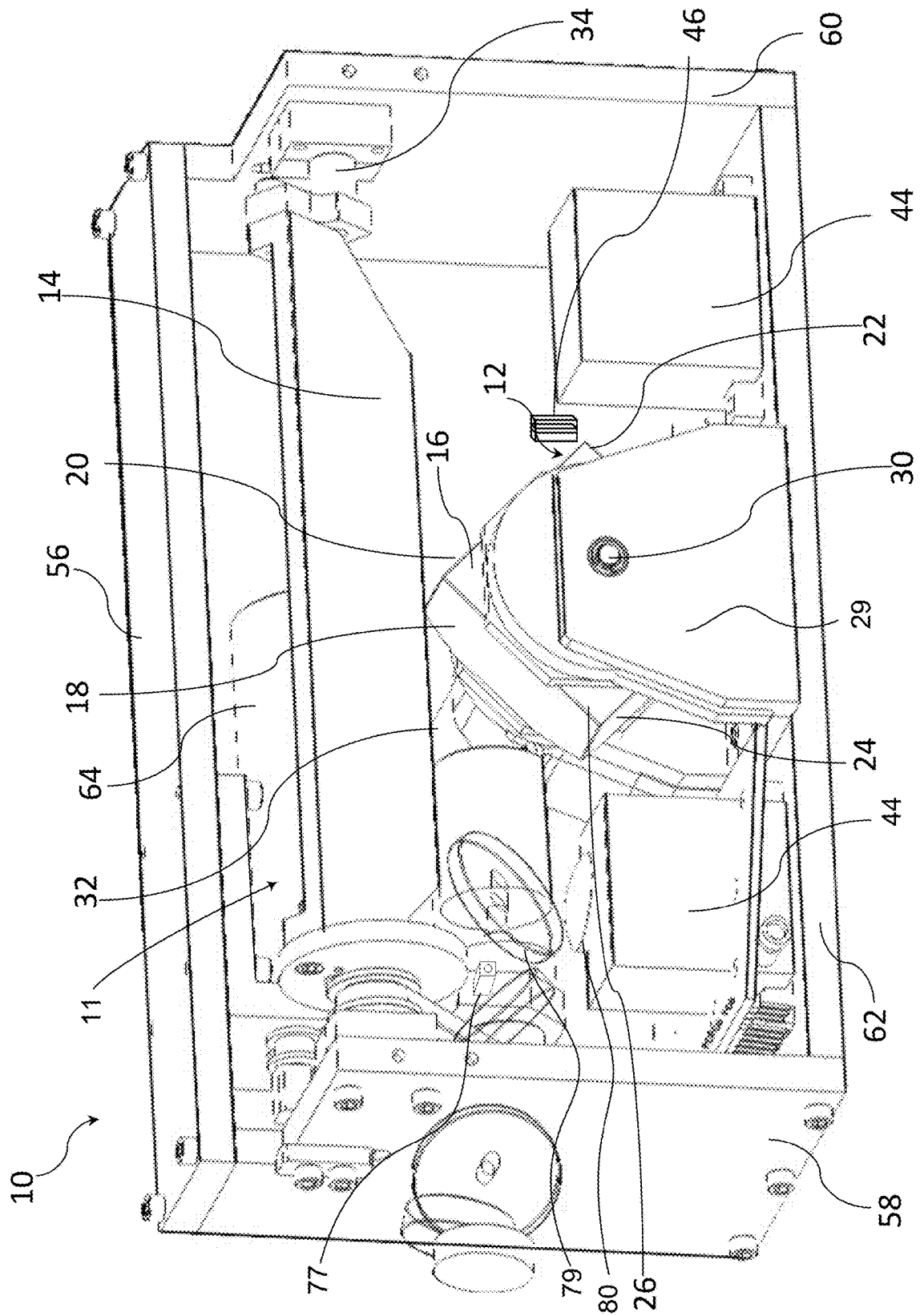
FIG. 1 is a front perspective view of a lidar sensor unit of the present disclosure.
Figure 2:
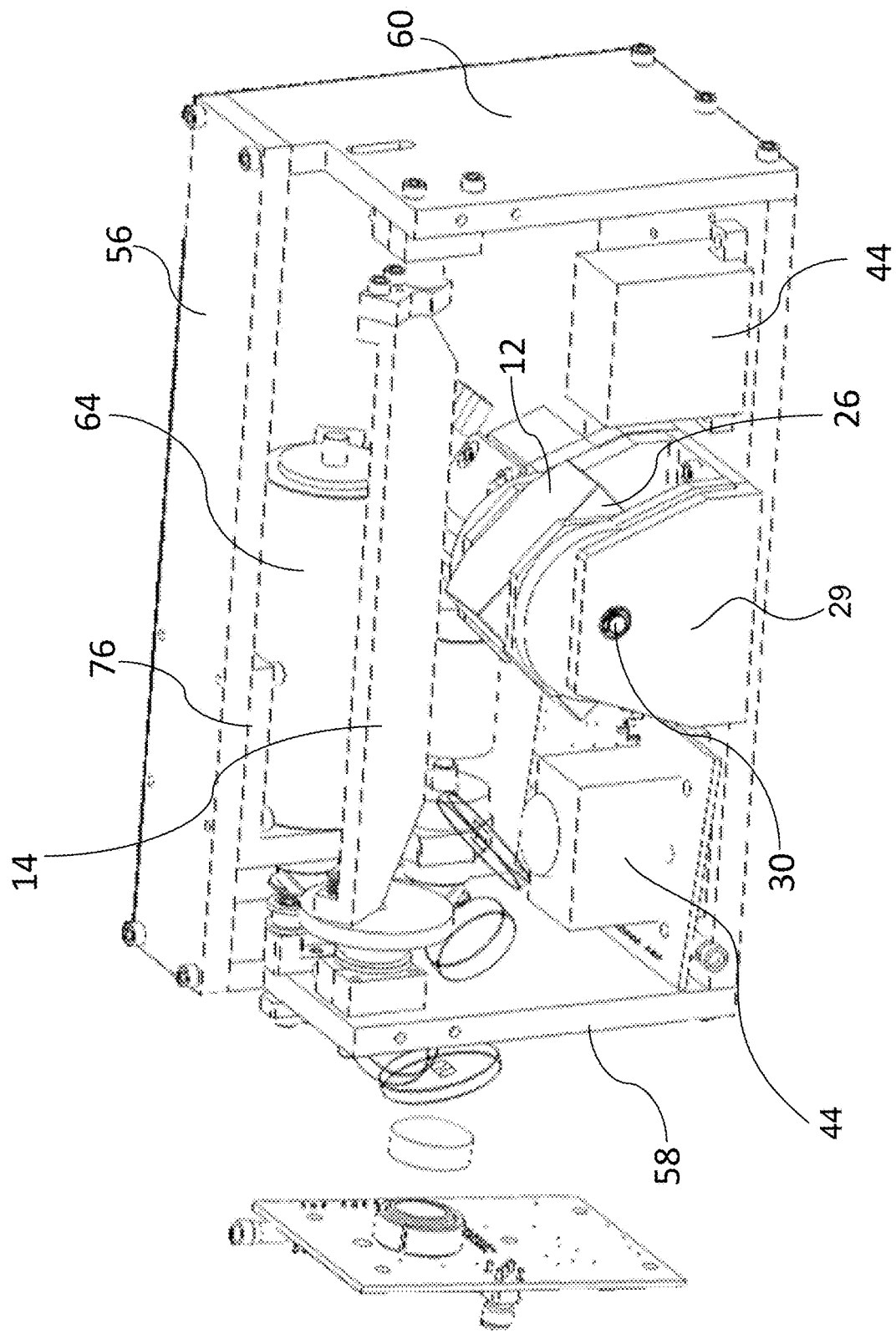
FIG. 2 is a top, front perspective view of the lidar sensor unit of FIG. 1.
Figure 3:
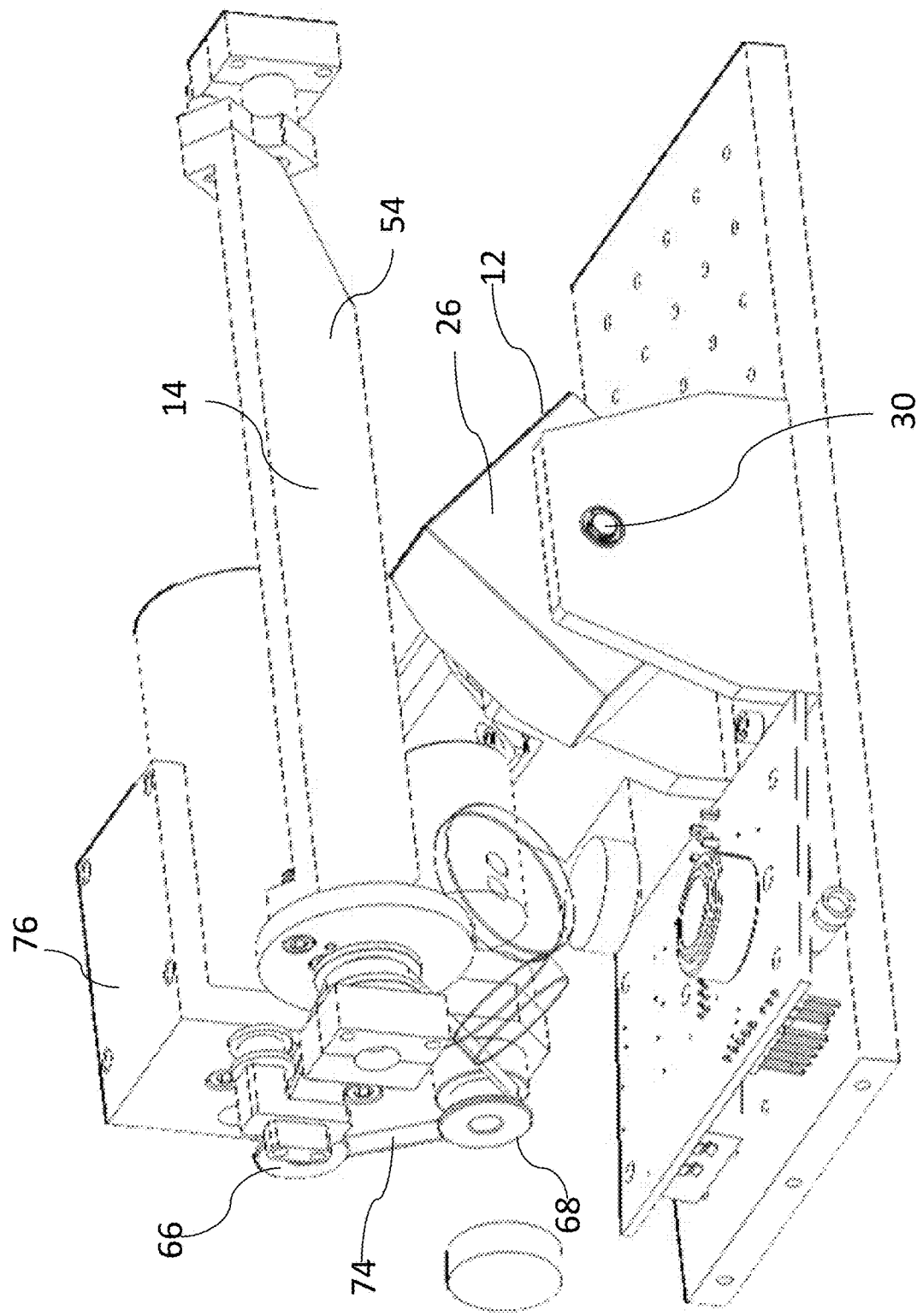
FIG. 3 is a front perspective view of the lidar sensor unit of FIG. 1, with the housing removed for clarity.
Figure 4:
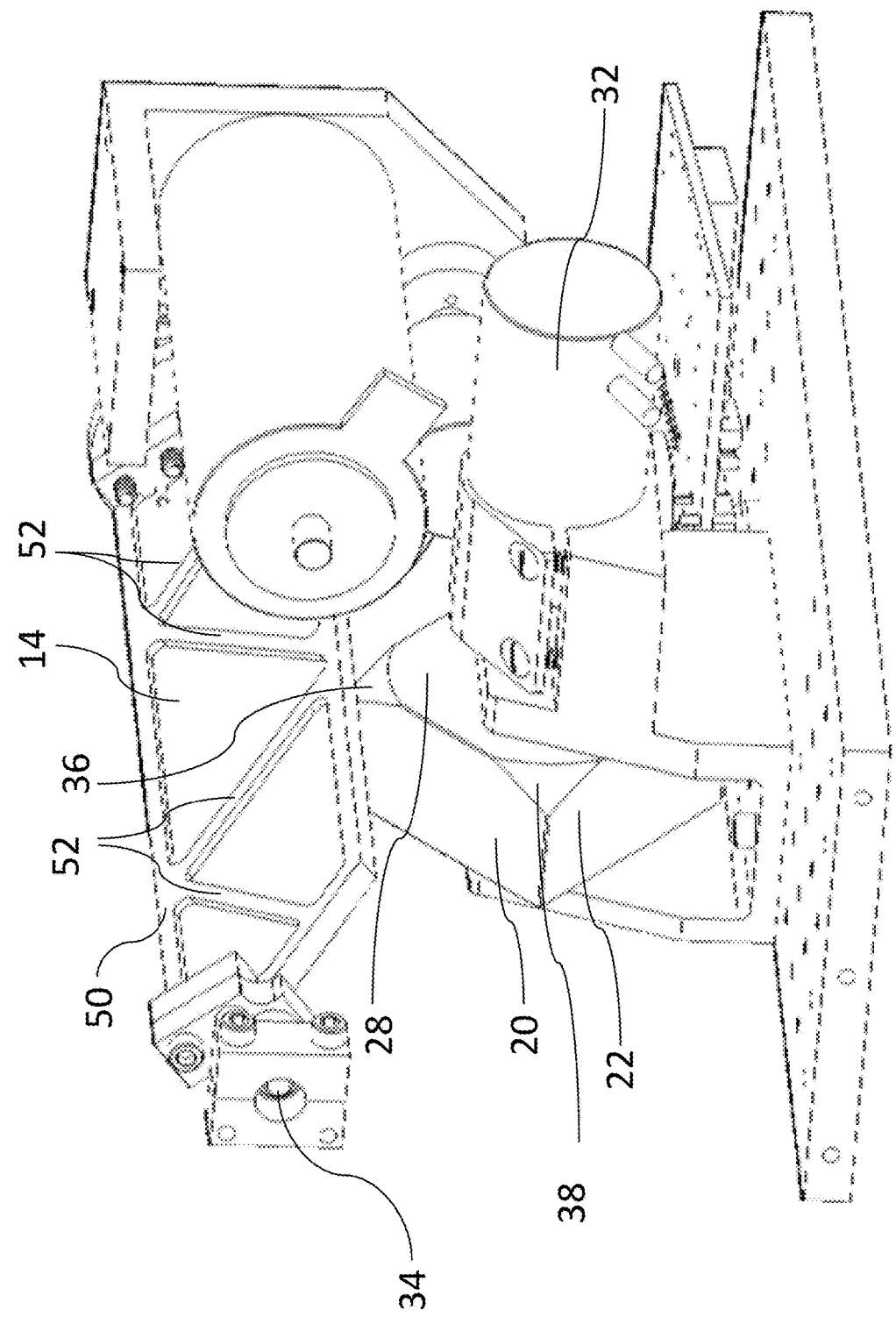
FIG. 4 is a right, rear perspective view of the lidar sensor unit of FIG. 1.
Figure 5:
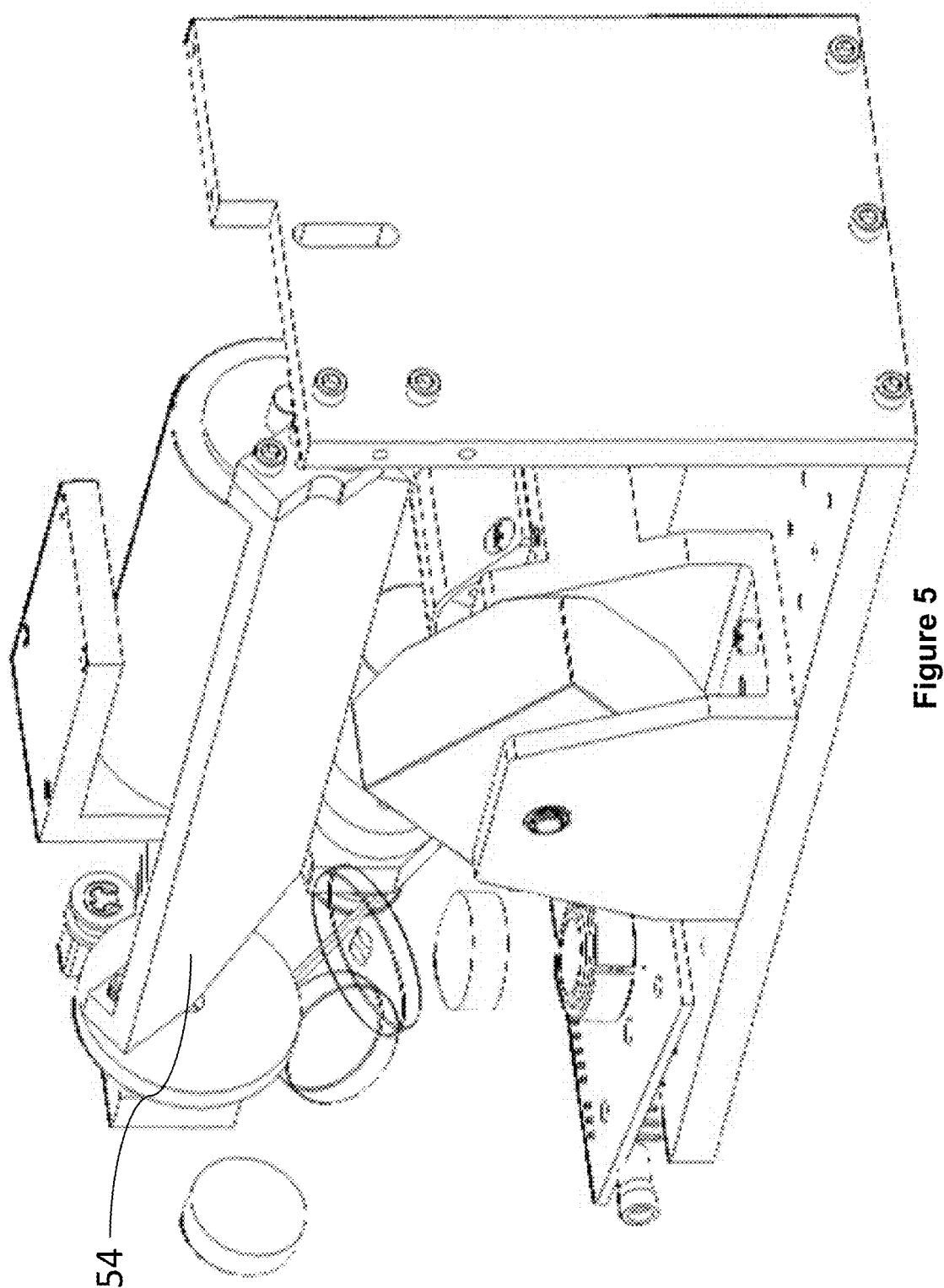
FIG. 5 is a right, front perspective view of the lidar sensor unit of FIG. 1.
Figure 6:
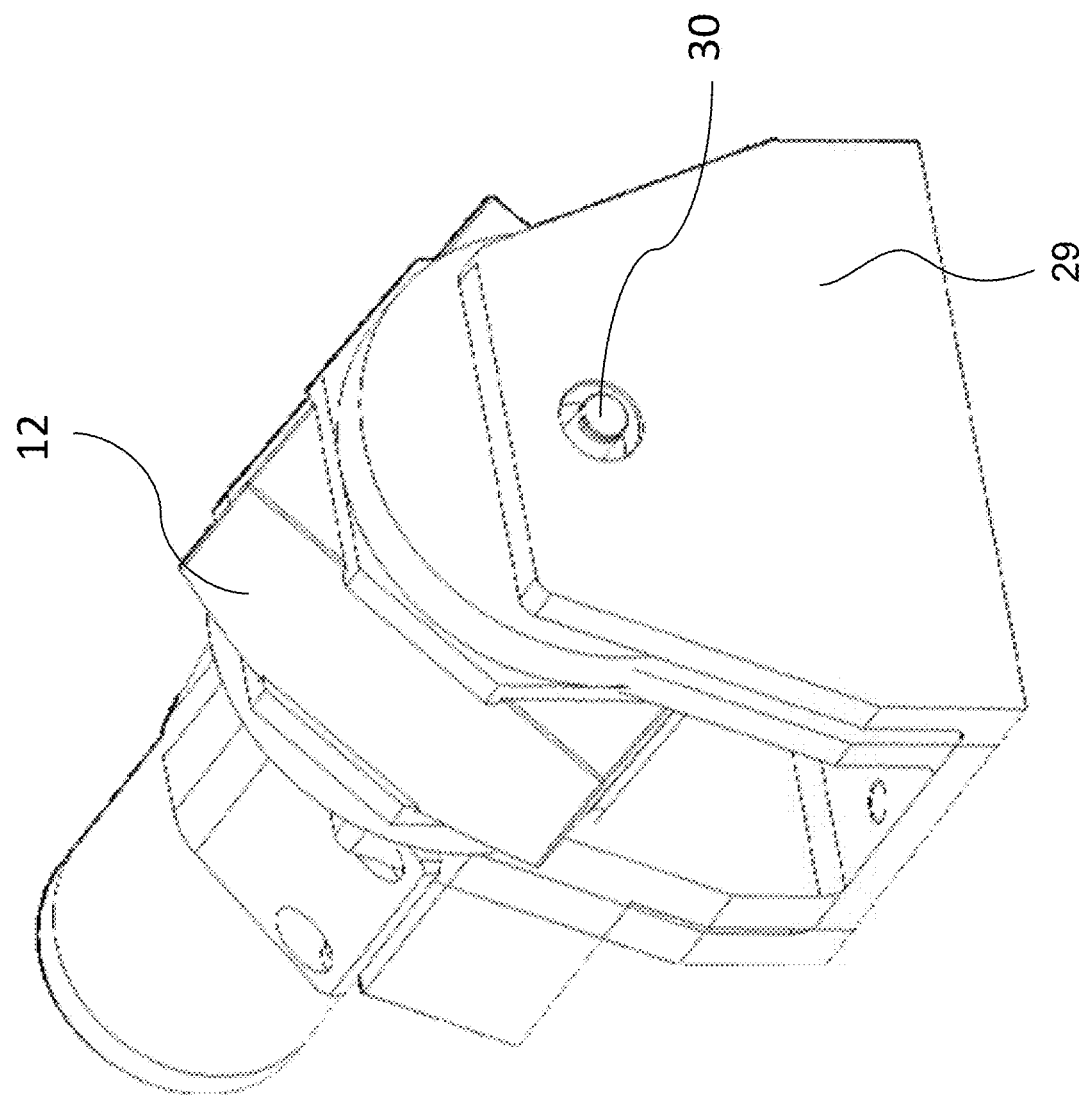
FIG. 6 is a right, front perspective view of a polygon mirror and motor assembly of the lidar sensor unit of FIG. 1.
Figure 7:
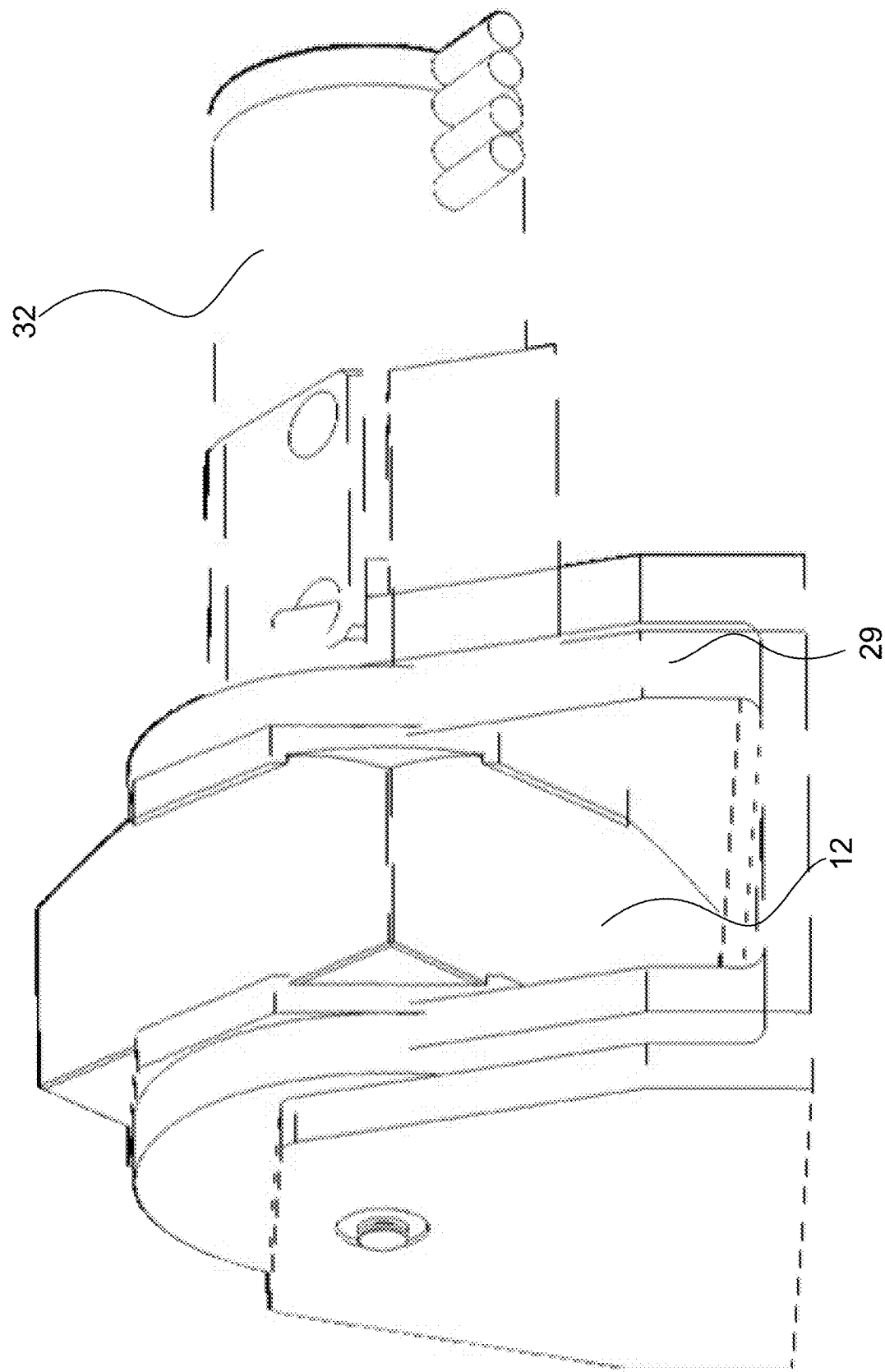
FIG. 7 is a rear perspective view of the polygon mirror and motor assembly of the lidar sensor unit of FIG. 1.
Figure 8:
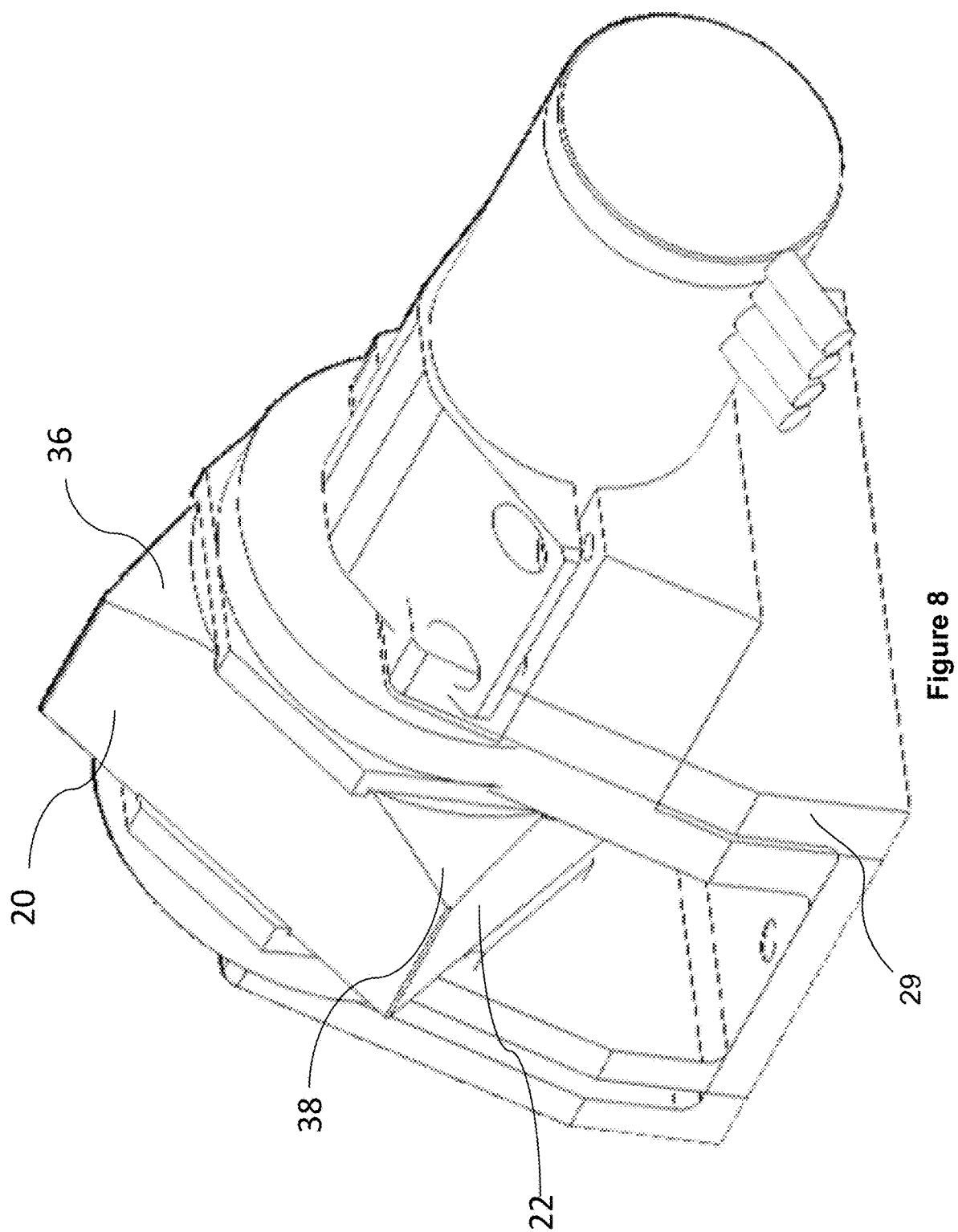
FIG. 8 is a left rear perspective view of the polygon mirror and motor assembly of the lidar sensor unit of FIG. 1.
Figure 9:
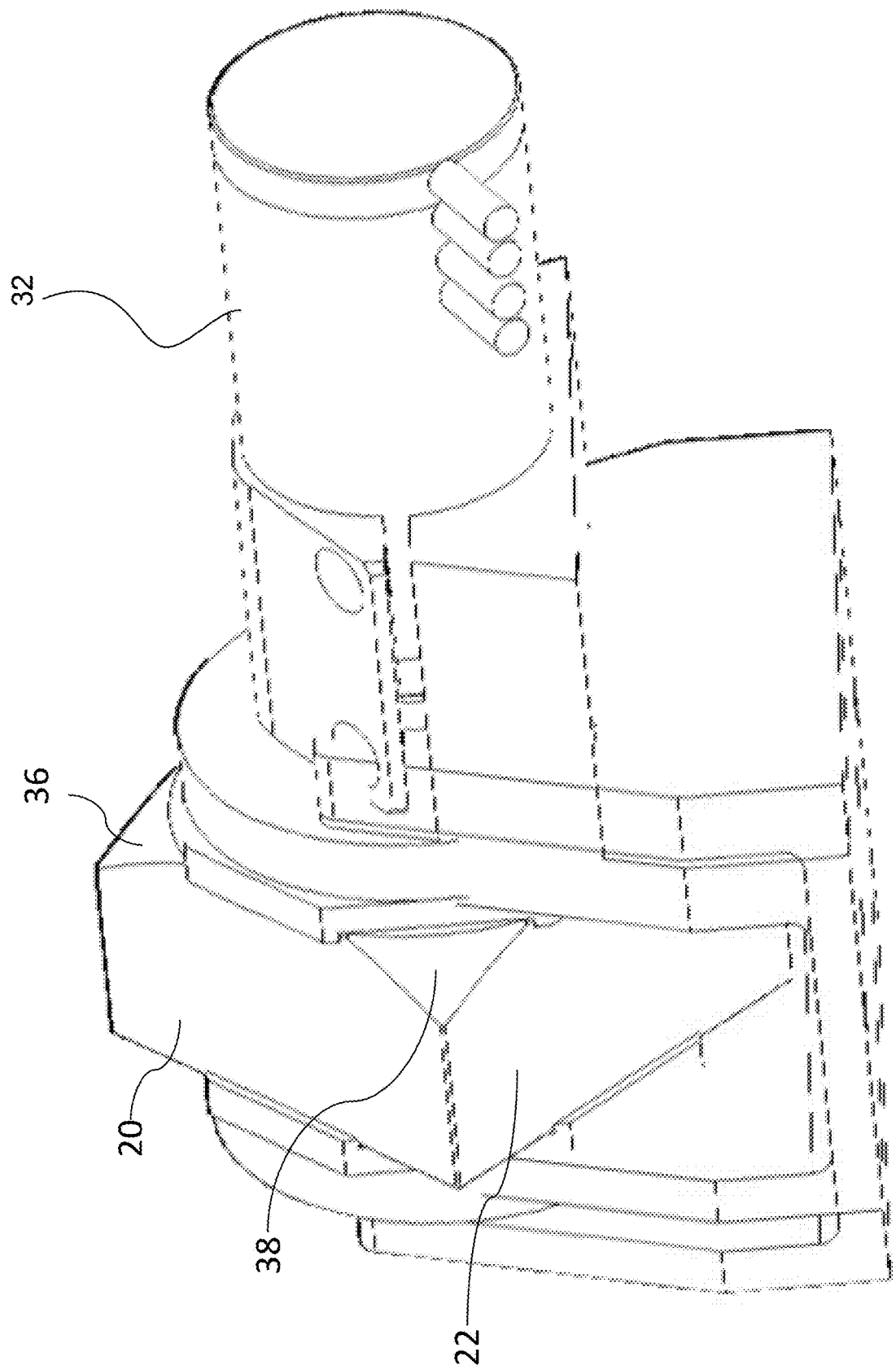
FIG. 9 is a rear perspective view of the polygon mirror and motor assembly of the lidar sensor unit of FIG. 1.

A lidar sensor unit and various techniques for operating the lidar sensor unit are discussed below, in particular: (i) an example assembly of a lidar sensor unit, and particularly a scanner of the lidar sensor unit, is discussed with reference to FIGS. 1-21; (ii) propagation of light through the lidar sensor unit in example scenarios is considered in connection with FIGS. 22-25; (iii) example operation of the lidar sensor unit as part of a lidar system is considered with respect to the block diagrams of FIGS. 26A-28; (iv) example placement of a lidar sensor unit on a body of a vehicle is discussed with reference to FIGS. 29-33; (v) an example method of manufacturing a polygon mirror for use in the lidar sensor unit is discussed with reference to FIG. 34; (vi) example modifications to the scan pattern of the lidar sensor unit are discussed with reference to FIGS. 35-39B; and (vii) example generating of pixels is considered in connection with FIGS. 40-44.

I. Lidar Sensor Unit Equipped with a Scanner Having a Planar and Polygon Mirrors Referring to FIGS. 1-5, a lidar sensor unit 10 of the present disclosure includes a scanner 11 with a rotatable polygon mirror 12 and a pivotable planar mirror 14 that cooperates with the rotatable polygon mirror 12 to perform a scan of a field of regard (FOR) of the lidar sensor unit 10. The pivotable planar mirror 14 may be referred to herein as a Y-scan mirror, but it is understood that depending on the orientation of the rotatable polygon mirror 12 and the pivotable planar mirror 14, the scanning range achieved by the pivotable mirror 14 may be in any of the X- Y- or Z-planes. The rotatable polygon mirror 12 includes a block 16 having a plurality of (preferably at least four) finished reflective surfaces 18, 20, 22, 24. It is possible, however, to a use a triangle-shaped rotatable polygon mirror with three reflective surfaces. In another implementation, not every surface of the rotatable polygon mirror oriented toward the planar mirror 14 is reflective (e.g., the rotatable polygon mirror can be a flat substrate with reflective surfaces on the front and back sides). More generally, the rotatable polygon mirror 12 may have any suitable number of reflective surfaces, such as for example 2, 3, 4, 5, 6, 7, or 8 reflective surfaces. The polygon mirror 12 may be made from any suitable material, such as for example, glass, plastic (e.g., polycarbonate), metal (e.g., aluminum or beryllium), metal foam, carbon fiber, ceramic, or any suitable combination thereof.

The rotatable polygon mirror 12 further includes a first wall 26 and a second wall 28. Each of the plurality of reflective surfaces 18, 20, 22, 24 extends between the first and second walls 26, 28. The reflective surfaces 18-24 are angularly offset from one another along a periphery of the block 16.

Generally speaking, as the polygon mirror 12 rotates, the scanner 11 produces one scan line for each reflective surface of the polygon mirror 12, and the planar mirror 14 pivots to distribute the scan lines across the FOR. Thus, if the scan lines are directed horizontally, the polygon mirror 12 is responsible primarily for the horizontal dimension of the field of regard ($FOR_H$), and the planar mirror 14 accordingly is responsible for the vertical dimension of the field of regard ($FOR_V$).

Adjacent reflective surfaces 18-24 of the block are preferably joined to one another along a drag-reducing, non-sharp edge to promote aerodynamic efficiency and reduce audible noise. As an example, the block may include rounded or chamfered edges or corners. As another example, the block may include edges with texturing, grooves, riblets, or a sawtooth pattern.

As best illustrated in FIGS. 6-9, the rotatable polygon mirror 12 is mounted in a bracket or mount 29 on a polygon mirror axle 30, which polygon mirror axle 30 extends through at least one of the first and second walls 26, 28. A motor 32 drives the polygon mirror axle 30, thereby imparting rotational oscillation to the rotatable polygon mirror 12. The motor 32 may be a synchronous brushless DC motor in driving relationship with the axle 30 and may be external to the block 16. Alternately, the block 16 may accommodate an internal motor, or enable a motor 32 to be at least partially embedded within the block 16, such as where a rotor of the motor 32 is disposed within the block 16, reducing the overall size of the lidar sensor unit 10. The motor 32 may drive rotation of the rotatable polygon mirror 12 in an open-loop or closed-loop fashion. In general, the motor 32 can be any actuator or mechanism suitable for rotating the polygon mirror 12.

The rotatable polygon mirror 12 may additionally employ an optical beam, the presence or absence of which is detectable by a stationary photo-interrupter, to collect data indicative of the rotational speed of the rotatable polygon mirror 12. One or more tabs may be provided on the axis of rotation of the polygon mirror 12 or an interior surface of the block 16, which tab(s) pass through the stationary photo-interrupter during rotation of the polygon mirror 12. Upon receiving from the photo-interrupter feedback data indicative of the rotational speed of the polygon mirror 12, the feedback data can then be processed by a controller associated with the motor 32 of the polygon mirror 12 to make any necessary adjustments to the rotational speed of the polygon mirror 12, for example. The controller may regulate or stabilize the rotational speed of the polygon mirror 12 so that the rotational speed is substantially constant. For example, the polygon mirror 12 may be rotated at a rotational speed of approximately 150 Hz (150 revolutions per second), and the rotational speed may be stabilized so that it varies by less than or equal to 1% (e.g., 150 Hz±1.5 Hz), 0.1%, 0.05%, 0.01%, or 0.005%.

The planar mirror 14 is pivotally mounted along a planar support shaft 34 that extends orthogonal to the polygon mirror axle 30. The planar mirror 14 preferably has a body 50 defined by a plurality of rib-like members 52 that form a honeycomb-like structure, supporting a finished planar reflective surface 54 (see FIG. 20). The center of gravity of the planar mirror 14 is closer to the reflective surface 54 than to an edge of the ribbed or honeycomb body 50 opposite the reflective surface 54. The planar mirror 14 may be made from any suitable material, such as for example, metal (e.g., aluminum), ceramic polymer, or carbon fiber.

The reflective surface 54 of the planar mirror 14 preferably has a width that is greater than a width of each of the reflective surfaces 18-24 of the rotatable polygon mirror 12, measured along a common axis. In the embodiment illustrated in FIGS. 1-25, the width of the planar mirror 14 is measured in the horizontal dimension, i.e., along a scan line (see FIG. 19). The width of each surface of the polygon mirror 12 can be measured along an axis that is parallel to the pivot axis of the planar mirror 14 in a certain orientation of the polygon mirror 12. The width of the planar mirror 14 effectively determines the horizontal range, i.e., $FOR_H$.

For the same polygon mirror 12, the $FOR_H$ of the sensor unit 10 can be increased by selecting a wider planar mirror. For example, the planar mirror of width 5.3 inches can provide a $FOR_H$ of about 100 degrees. As a more specific example, the lidar sensor unit 10 can have two eyes, each with an $FOR_H$ of 52 degrees, and a two-degree overlap between the eyes. The planar mirror of width 8.1 inches can provide a $FOR_H$ of about 130 degrees. The possibility of increasing the $FOR_H$ of the lidar sensor unit 10 by selecting a planar mirror of a different width for the same polygon mirror provides for a modular optical design.

Figure 14:
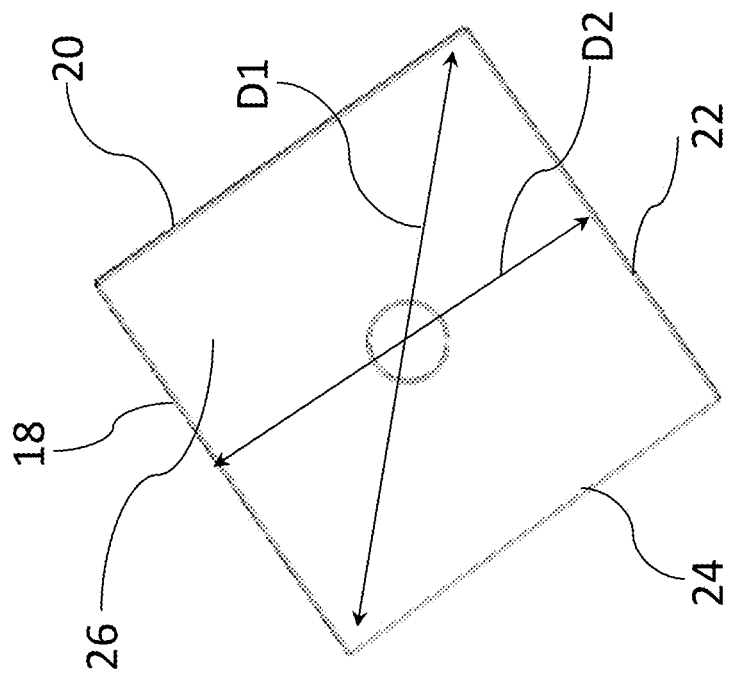
FIG. 14 is a front elevation view of the polygon mirror of the lidar sensor unit of FIG. 1.
Figure 13:
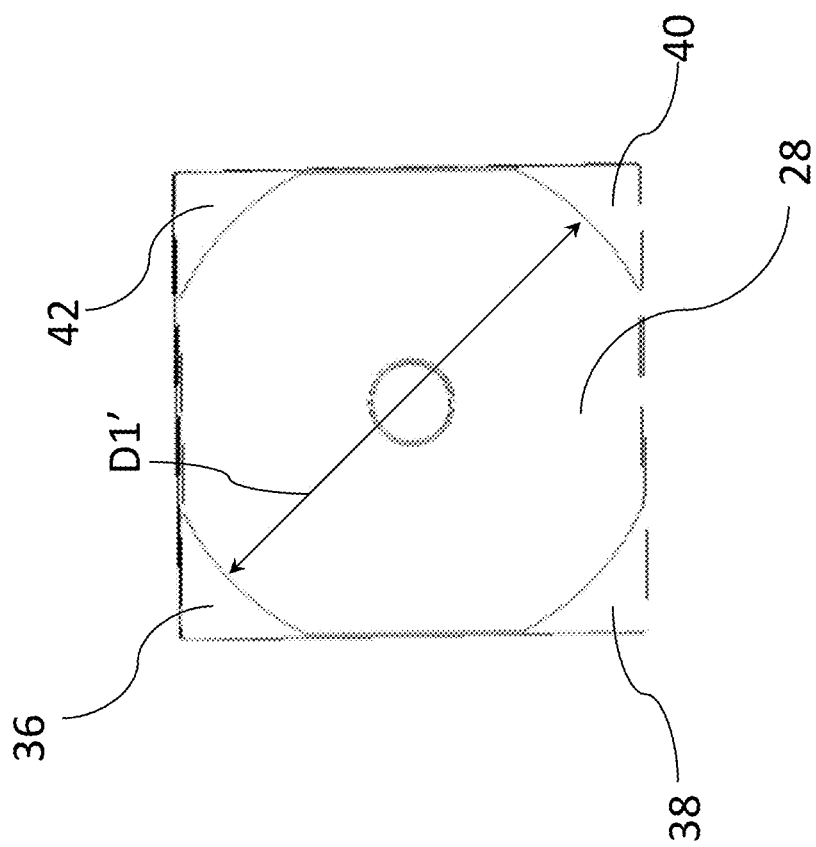
FIG. 13 is a rear elevation view of the polygon mirror of the lidar sensor unit of FIG. 1.

As illustrated in FIG. 14, the first wall 26 of rotatable polygon mirror 12 has a major diameter D1 that extends from the corner of two adjacent finished reflective surfaces 18, 20 to a corner of two opposite finished reflective surfaces 22, 24, and a minor diameter D2 that extends from a center of one of the finished reflective surfaces 18 to a center of an opposite one of the finished reflective surfaces 22. A limiting factor in optimizing the minimal height and width of the lidar sensor unit 10 is the necessary spacing between the finished reflective surfaces 18-24 of the rotatable polygon mirror 12 and the planar mirror 14. By strategically removing portions of material from the block 16, it is found that the dimensional difference between the major diameter D1 and the minor diameter D2 need not serve as a constraint to the dimensioning of the overall lidar sensor unit 10. As illustrated in FIGS. 10-12, a plurality of chamfers 36, 38, 40, 42 are formed in the block 16, each of the chamfers being bounded by a pair of adjacent reflective surfaces 18-24 and the second wall 28. Each of these chamfers 36-42 is preferably cut at an angle of 45° to the adjacent finished reflective surfaces and second wall 28. However, the chamfers may be formed at a different angle to these adjacent surfaces.

The planar mirror 14 is located on the side of the rotatable polygon mirror 12 closest to the second wall 28. The chamfers 36-42 effectively reduce the major diameter of the rotatable polygon mirror 12 to a maximum dimension D1' (see FIG. 13) that is less than D1, such that a minimum distance between the rotatable polygon mirror 12 and the planar mirror 14 can be maintained while still minimizing the overall height and width dimensions of the lidar sensor unit 10. The reflective surfaces 18-24 of the polygon mirror 12 can be manufactured using surface replication techniques, and coarse as well as fine balancing techniques can be applied to the polygon mirror 12, as discussed below.

By way of example only, and referring back to FIG. 1, the lidar sensor unit 10 may be provided in a housing that includes a shell roof 56, a first shell side wall 58, a second shell side wall 60, and a shell floor 62. Depending on where the lidar sensor unit 10 is mounted on a vehicle, one or more of the surfaces of the housing could coincide with an external or interior surface of a vehicle, as discussed below.

The housing of the lidar sensor unit 10 is configured so that rotation of the polygon mirror 12 imparts a flow of air through the housing to provide cooling to components enclosed within the housing. The air flow may be a laminar flow, a turbulent flow, or any suitable combination thereof. Such cooling need not be the exclusive means of cooling of the interior components of the lidar sensor unit 10. For instance, one or more of a fan, cooling fins, or a heat exchanger can be used to moderate the temperature of the components of the lidar sensor unit 10. However, the air flow within the housing and the aerodynamic construction of the components of the polygon mirror 12 of the lidar sensor unit 10 preferably account for a substantial portion of the temperature mitigation of the lidar sensor unit 10, even when any one or more of a fan, cooling fins, or a heat exchanger are additionally provided in the housing to supplement cooling. A substantial portion of the temperature mitigation of the lidar sensor unit 10 may be a majority of the cooling, at least 75% of the cooling, at least 80% of the cooling, at least 85% of the cooling, at least 90% of the cooling, at least 95% of the cooling, at least 98% of the cooling, or at least 99% of the cooling. Alternatively, the air flow within the housing and the aerodynamic construction of the components of the polygon mirror 12 of the lidar sensor unit 10 may be relied upon to supply all of the cooling when at least one of the temperature within the housing of the lidar sensor unit 10 or the ambient temperature is below a certain predefined temperature, and if the at least one of the temperature within the housing of the lidar sensor unit 10 or the ambient temperature exceeds the predefined temperature, the air flow within the housing and the aerodynamic construction of the components of the polygon mirror 12 of the lidar sensor unit 10 may be supplemented by at least one or more of a fan, cooling fins, or a heat exchanger to provide cooling. In some implementations, the polygon mirror 12 may be at least partially surrounded or enclosed by a shroud that may act to aid or direct the air circulation provided by the polygon mirror 12. The shroud may include a dust collector (e.g., a filter) configured to remove dust from circulating air.

Figure 15:
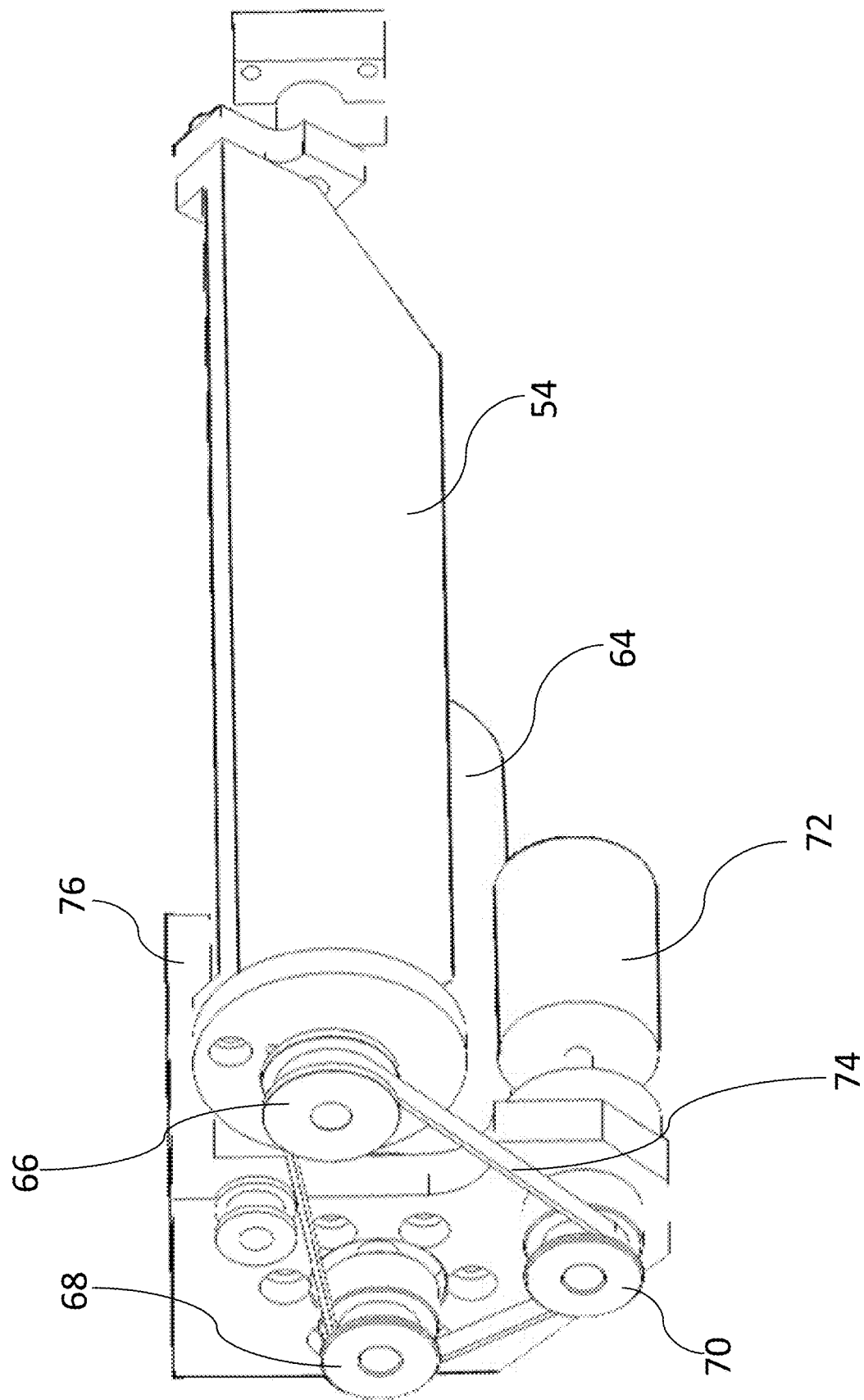
FIG. 15 is a front perspective view of the planar mirror and motor assembly of the lidar sensor unit of FIG. 1.
Figure 16:
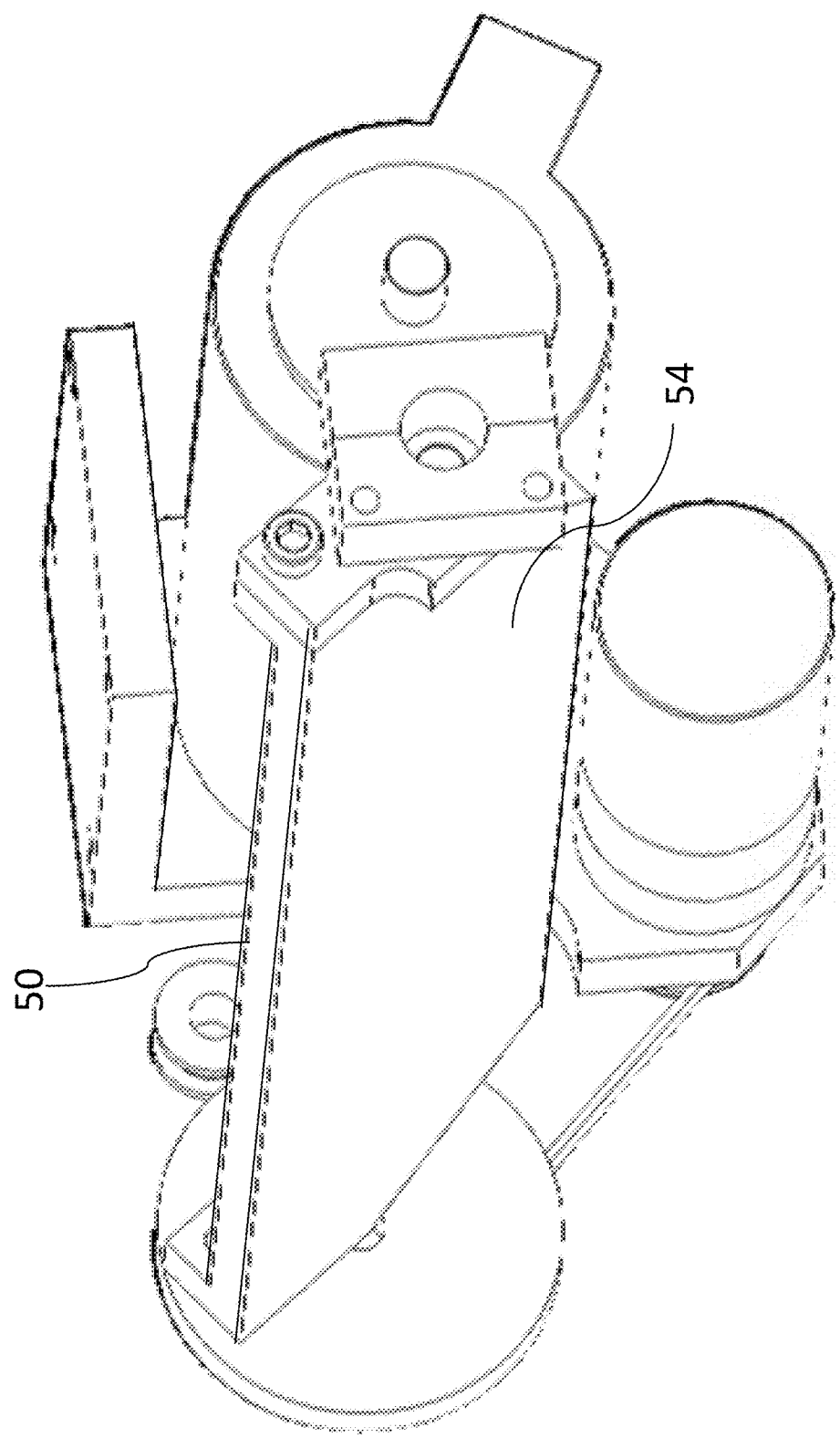
FIG. 16 is a front, right perspective view of the planar mirror and motor assembly of the lidar sensor unit of FIG. 1.
Figure 18:
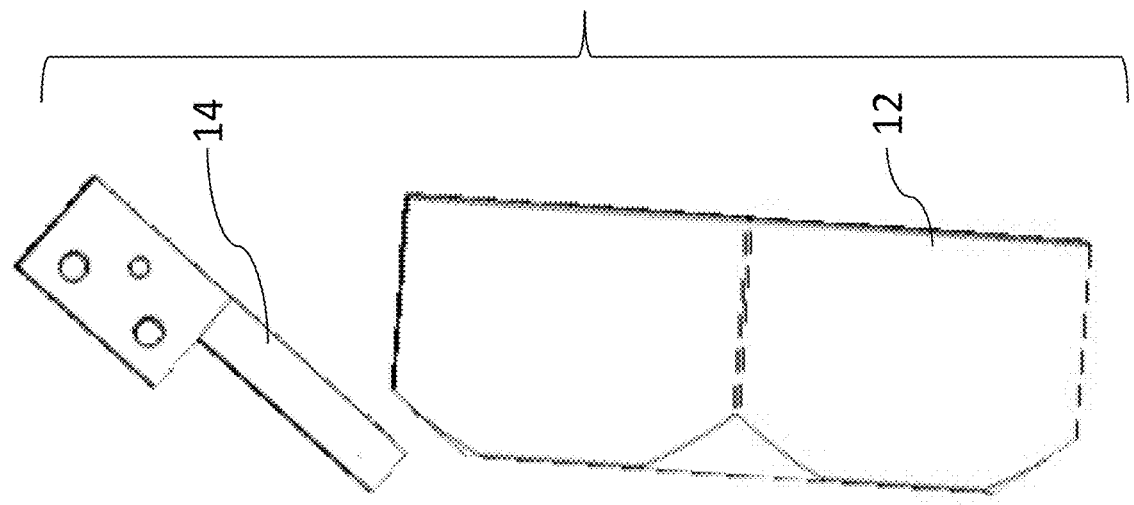
FIG. 18 is a left elevation view of just the polygon mirror and the planar mirror of the lidar sensor unit of FIG. 1.
Figure 17:
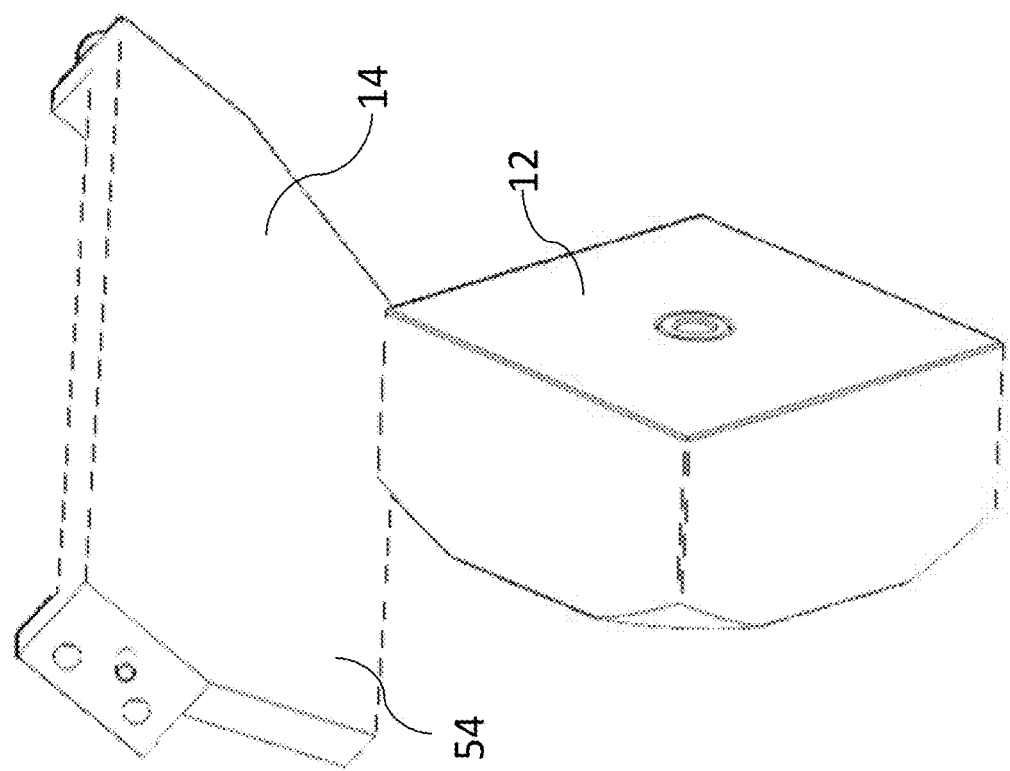
FIG. 17 is a left, front perspective view of just the polygon mirror and the planar mirror of the lidar sensor unit of FIG. 1.
Figure 19:
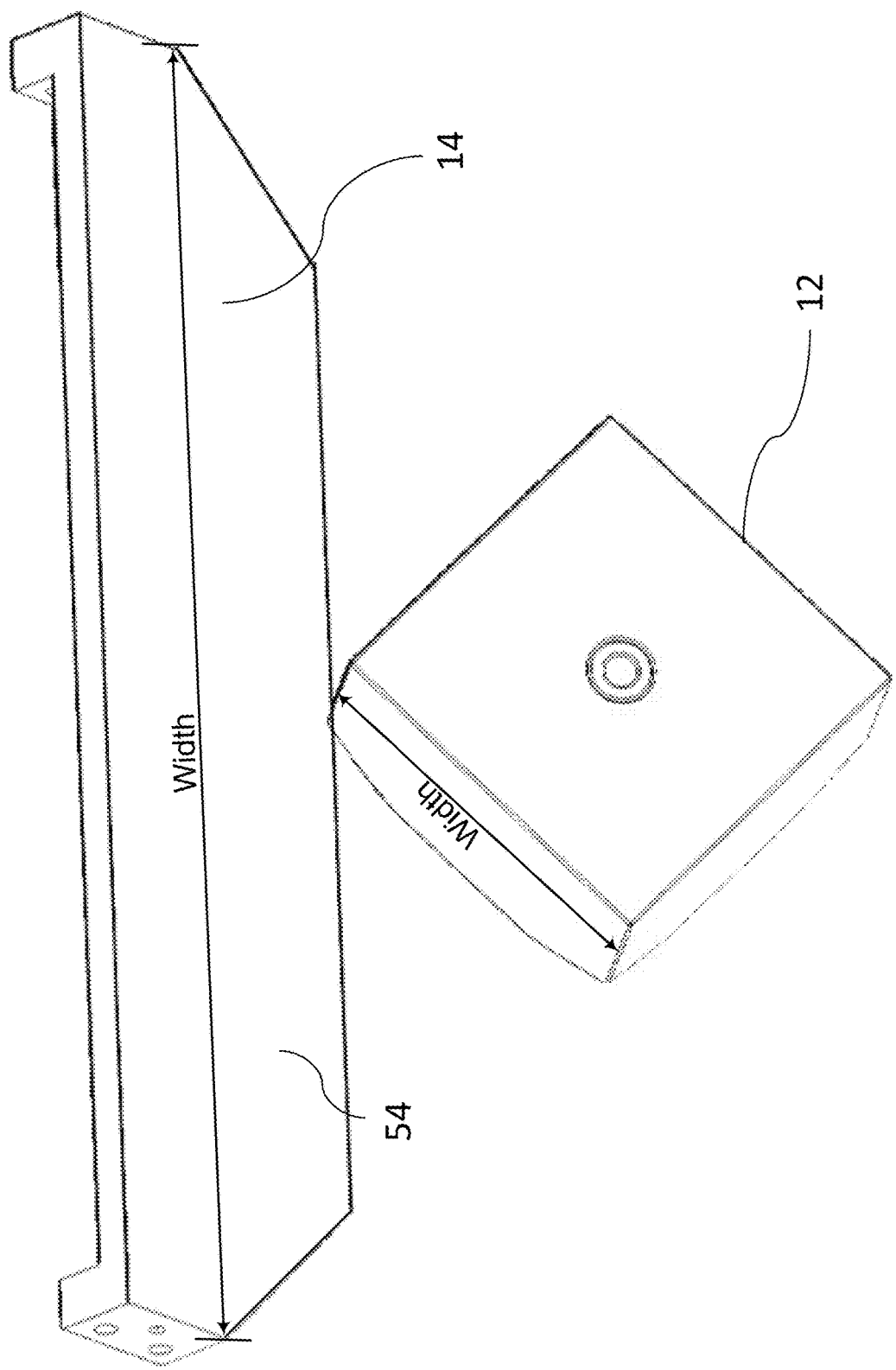
FIG. 19 is a front perspective view of just the polygon mirror and the planar mirror of the lidar sensor unit of FIG. 1.
Figure 20:
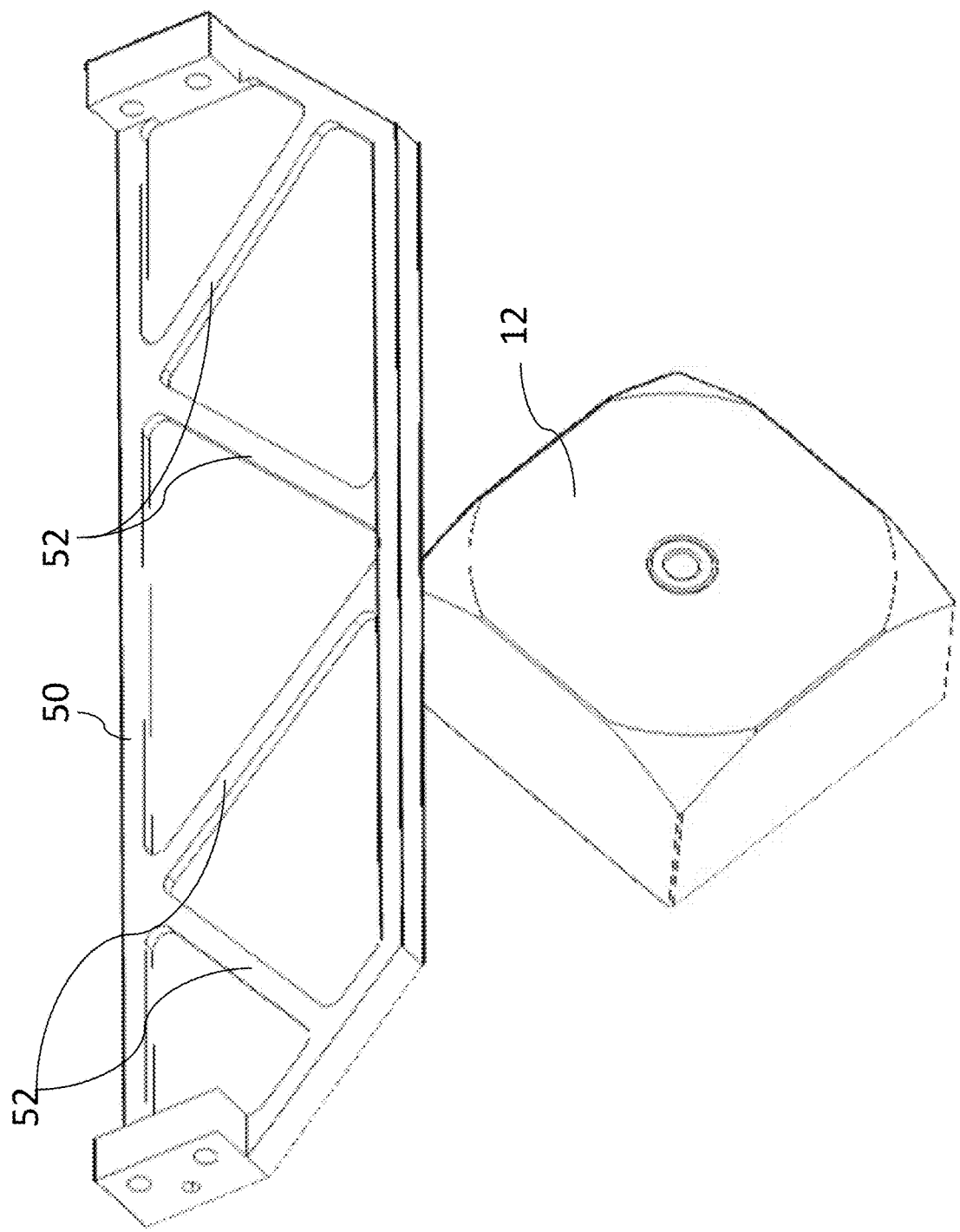
FIG. 20 is a rear perspective view of just the polygon mirror and the planar mirror of the lidar sensor unit of FIG. 1.

The planar mirror 14 is actuated by a drive system such as that illustrated in FIG. 15. The drive system includes a drive motor 64, which, by way of example, may be a brushless FAULHABER (trademark) drive motor, a plurality of pulleys 66, 68, 70, one of the pulleys 68 axially aligned with an encoder 72, and a drive belt 74 translating rotational motion of one of the pulleys 68 driven directly by the drive motor 64 to the other two pulleys 68, 70. The drive motor 64 may be secured to the shell roof 56 by a shell roof motor mount 76.

As discussed in more detail below, the lidar sensor unit 10 according to some implementations includes optical elements configured to receive light signals such as intermittent pulses or continuous beams from a laser, and direct the light signals toward the active reflective surface(s) of the rotatable polygon mirror 12. The optical elements can include a fiber-optic cable via which the lidar sensor unit 10 is coupled to the laser, and a collimator or a lens to produce a collimated free-space output beam. Referring to FIG. 1, one or several output collimators 77 in an example implementation direct light pulses of respective output beams toward the rotatable polygon mirror 12 via apertures of the overlap doughnut mirror 79. However, in other implementations considered in more detail with reference to FIGS. 23-25, output collimators of the lidar sensor unit 10 and an aperture-free overlap mirror implement an off-axis illumination technique. The mirror 79, or an aperture-free mirror oriented similar to the mirror 79, also can be referred to as a superposition mirror or beam-combiner mirror.

If desired, the housing of the lidar sensor unit 10 can enclose a laser or multiple lasers configured to generate output beams with different wavelengths. Further, a diffractive optical element (DOE) beam splitter 46 can be used to split a beam output by the laser (or the beam received from a remote laser via a fiber-optic cable) into at least two beams. The beams may have distinct wavelengths from one another. The beam splitter 46 in general can be any suitable holographic element, a pixelator, diffractive element, etc.

In any case, the one or several collimators 77 direct pulses of light at the reflective surfaces of the rotatable polygon mirror 12, which in turn reflect the pulses toward the planar reflective surface 54. The rotation of the rotatable polygon mirror 12 and the planar mirror 14 achieve the horizontal and vertical scan effect of the lidar sensor unit 10.

Figure 21:
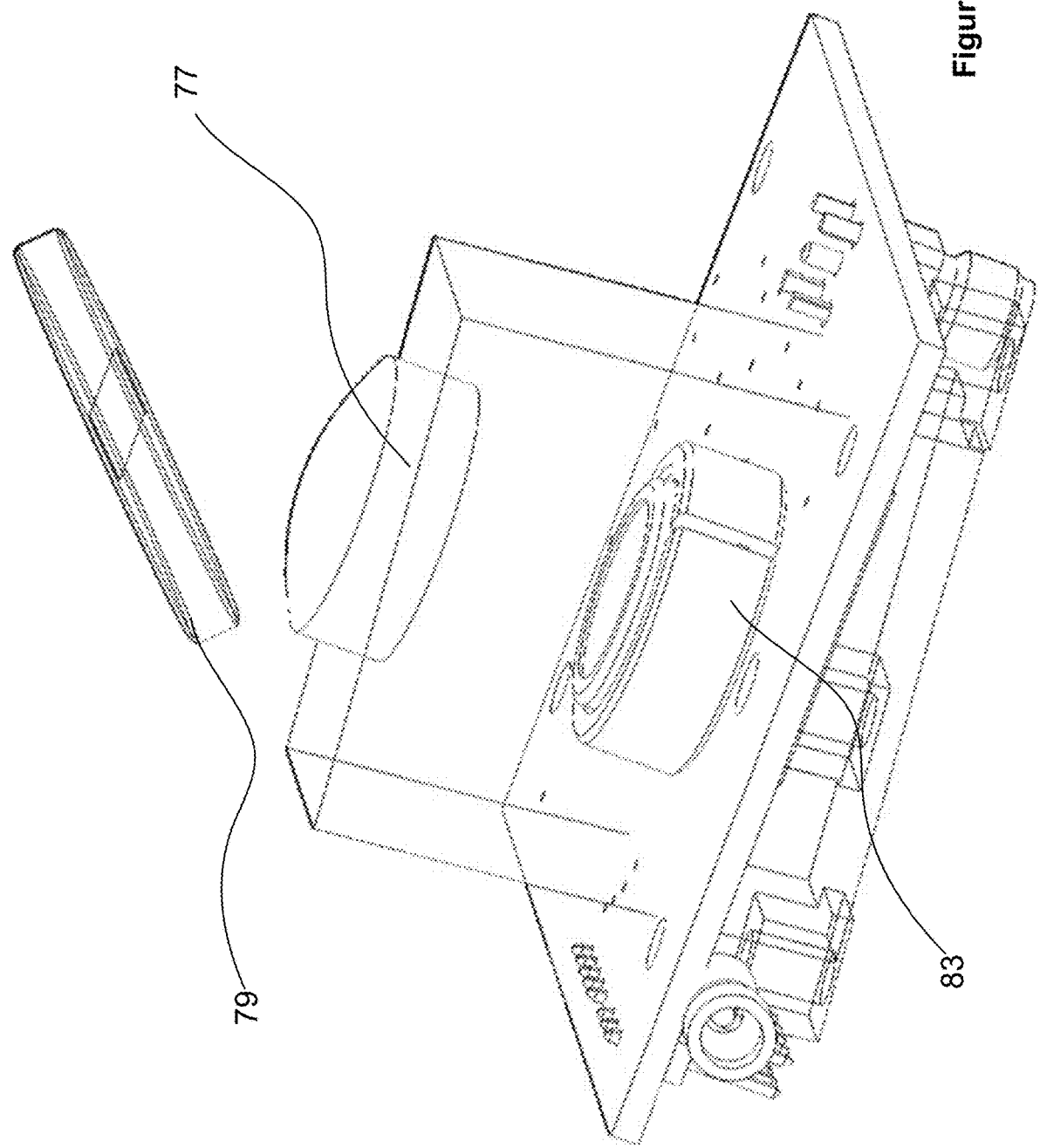
FIG. 21 is a perspective view of the optical base of the lidar sensor unit of FIG. 1, enclosing a lens and a receiver.

An optic base 44 (see FIGS. 1 & 2) can enclose a receiver with one or more detectors. Depending on whether the scanner 11 utilizes a single reflective surface of the polygon mirror 12 or two reflective surfaces, the sensor unit 10 can include a single optic base 44 or two optic bases 44. As illustrated in FIG. 21, the optic base 44 can enclose a lens 80 to focus an input beam onto an assembly 81 including an optical filter and a detector, discussed in more detail below.

Figure 30:
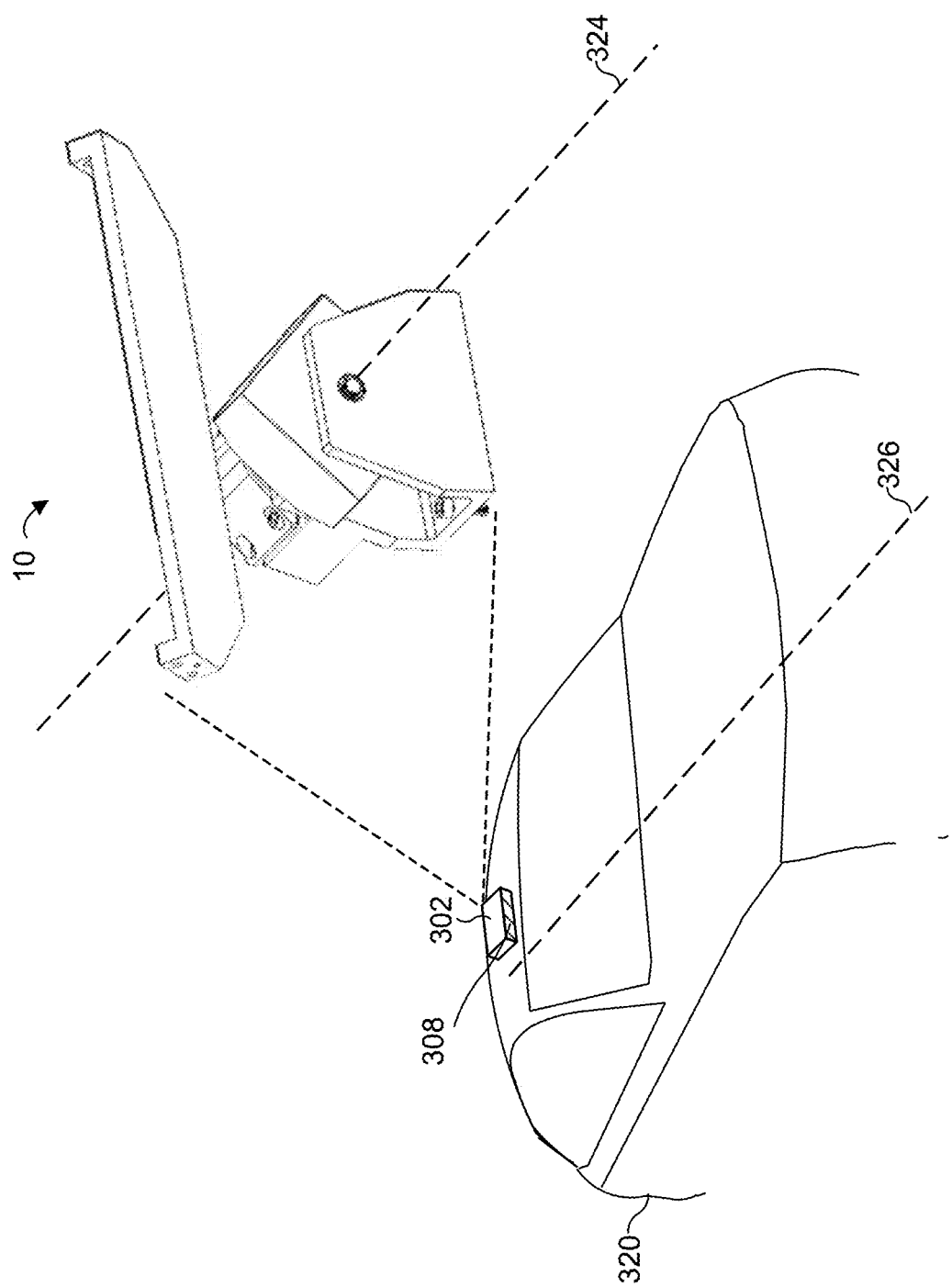
FIG. 30 is perspective view of several components of the lidar system of FIG. 26A or 26B, disposed on a vehicle so that the axis of rotation of the polygon mirror aligns with an orientation of the vehicle.

The axis of rotation of the polygon mirror 12 may be aligned with an orientation of predominant motion of the vehicle in which the lidar system 10 operates. For instance, a front-facing lidar system 10 may be oriented such that the axis of rotation of the polygon mirror 12 is aligned with a longitudinal axis of the vehicle. Such an orientation may serve to reduce adverse effects of vibration, acceleration, and deceleration. These techniques are illustrated in FIG. 30.

The planar mirror 14 may be configured so as to pivot over a range of allowable motion larger than a range corresponding to the vertical angular dimension of the field of regard, so as to define a maximum range of allowable motion larger than a range within which the planar mirror 14 pivots during a scan. A controller associated with the planar mirror 14 selects different portions of the maximum range of allowable motion as the range within which the second mirror pivots, in accordance with modifications of the scan pattern. In particular, to modify at least one of a scan pattern or a scan rate, a controller associated with the motor 32 of the polygon mirror 12 can be configured to cause the motor 32 to vary the speed of rotation of the polygon mirror 12, cause the drive motor 64 to vary the vary the oscillation of the planar mirror 14, or both. The controller can be associated with both the polygon mirror 12 and the planar mirror 14. The controller may be configured to modify the scan pattern on a frame-by-frame basis, each frame corresponding to a complete scan of the field of regard of the lidar system 10. In some implementations, the oscillation of the planar mirror 14 may be varied (e.g., to change the vertical angular dimension of the field of regard), and the rotational speed of the polygon mirror 12 may be regulated or stabilized so that the polygon mirror 12 rotates at a substantially constant speed.

With reference to FIGS. 1-5, the polygon mirror 12 in some implementations can be disposed between a third of the way from a first edge of the y-scan mirror 14 and a third of the way from a second edge of the y-scan mirror 14. In a particular embodiment, the polygon mirror axis bisects a length of the y-scan mirror 14.

Besides the lidar sensor unit 10, the scanner 11 can operate in any suitable optical system to scan the FOR. The scanner 11 in an embodiment includes the polygon mirror 12 rotatable about a polygon mirror axis to scan the FOR of the optical system along a horizontal dimension, the polygon mirror 12 including a plurality of reflective surfaces 18-24 being angularly offset from one another along a periphery of the block 16; and a y-scan mirror 14 pivotable along a pivot axis orthogonal to the polygon mirror axis to scan the FOR of the optical system along a vertical dimension. The width of the y-scan mirror 14 is larger than the width of each of the reflective surfaces 18-24 of the polygon mirror 12. The polygon mirror 12 reflects light incident on one of the reflective surfaces toward the y-scan mirror 14. The width of the y-scan mirror 14 ultimately determines the scan range along the horizontal dimension.

II. Propagation of Input and Output Light Beams Through the Lidar Sensor Unit

Figure 22:
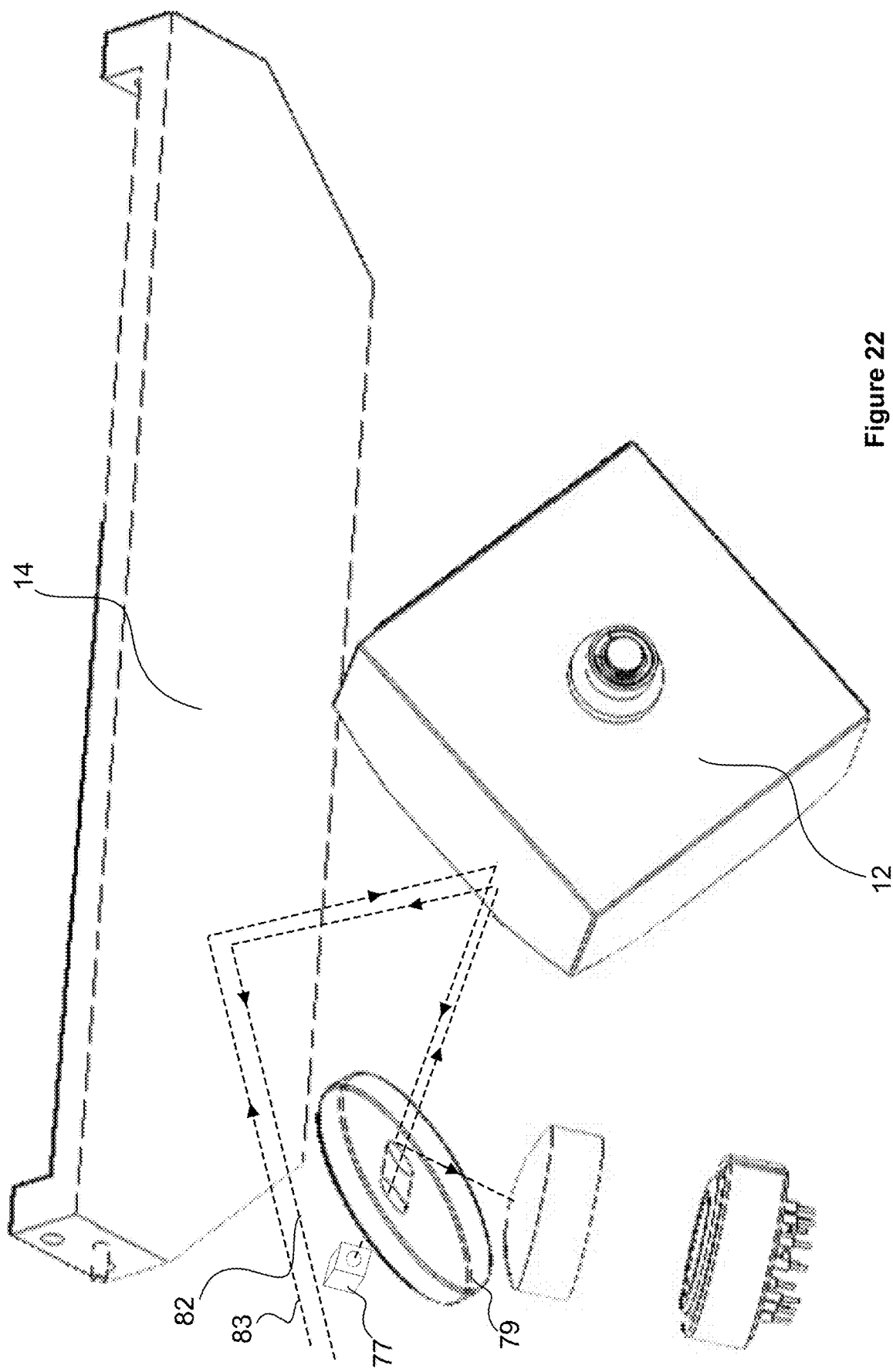
FIG. 22 is a perspective view of several components of the lidar sensor unit of FIG. 1 in an example implementation that includes an overlap "doughnut mirror," along with a schematic representation of example paths of beams.

FIG. 22 schematically depicts an example implementation of the lidar sensor unit 10 that includes the doughnut overlap mirror 79 discussed above. In this implementation, an output beam 82 travels from the output collimator 77 through an aperture of the overlap mirror 79 and impinges on one of the reflective surfaces of the polygon mirror 12. The reflective surface of the polygon mirror 12 reflects the output beam 82 to a location on the planar mirror 14 that depends on the current orientation of the polygon mirror 12, thereby defining the current angle within the $FOR_H$. The planar mirror 14 then directs the output beam 82 out of the lidar sensor unit 10 at a vertical angle that depends on the current orientation of planar mirror 14, thereby defining the current angle within the $FOR_V$. In this manner, the scanner 11 can disperse light pulses of the output beam 82 across the FOR of the lidar sensor unit 10. An input beam 83 travels to the planar mirror 14, which directs the input beam 83 to the polygon mirror 12, which in turn directs the input beam 83 to the overlap mirror 79.

Figure 23:
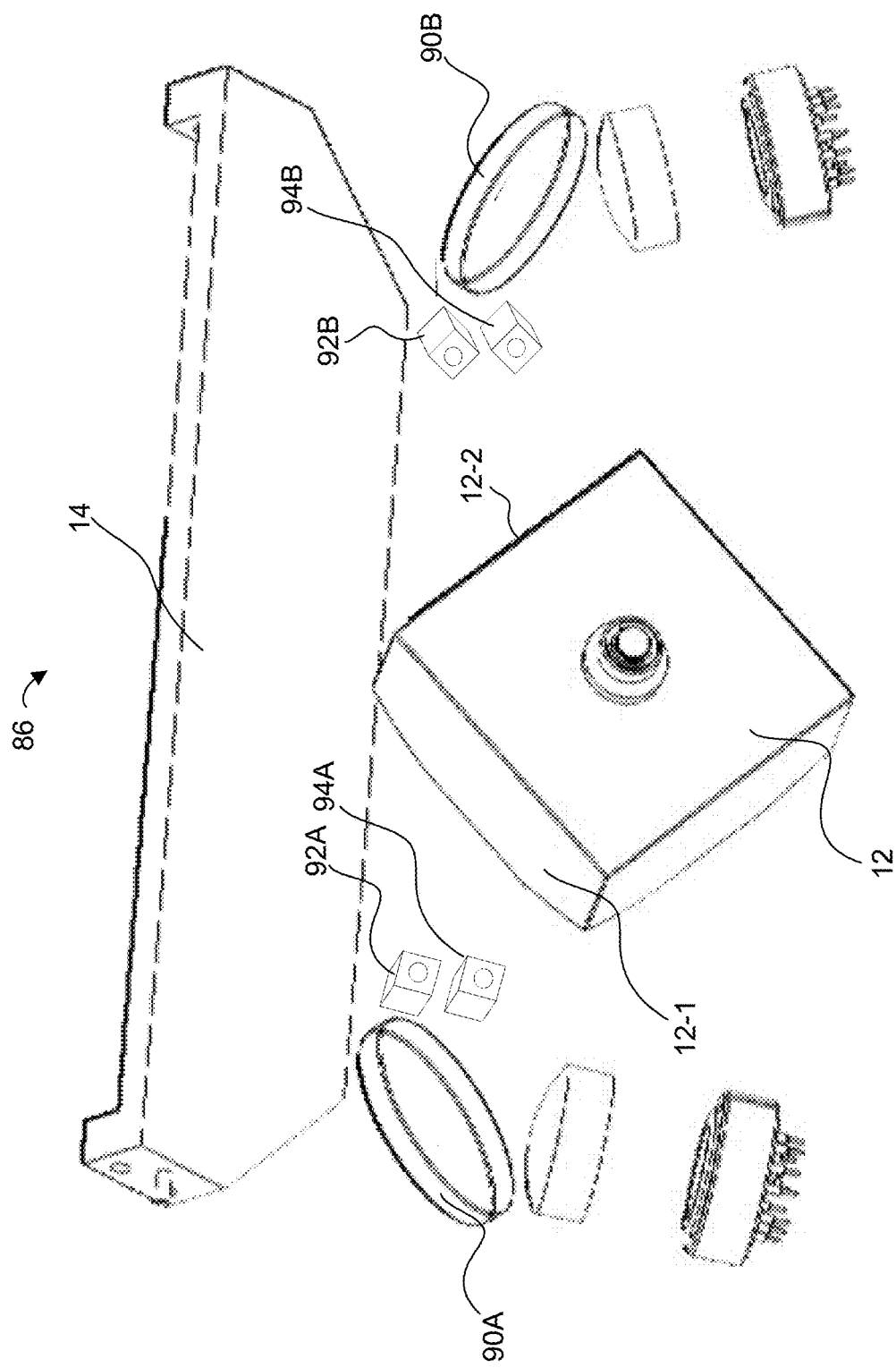
FIG. 23 is a perspective view of several components of the lidar sensor unit of FIG. 1 in an example implementation free of an overlap doughnut mirror.

Now referring to FIG. 23, an assembly 86 is generally similar to the assembly of FIG. 22. However, unlike the overlap doughnut mirror 79, an overlap mirror 90A does not include an aperture, and an output collimator 92A directs an output beam by the side of the overlap mirror 90A toward a reflective surface 12-1 of the polygon mirror 12. An output collimator 94A can direct another output beam by the side of the overlap mirror 90A toward the same reflective surface 12-1 of the polygon mirror 12. The output collimators 92A and 94A can be configured to emit pulses having different wavelengths, and two respective detectors can be configured to detect the corresponding return pulses in a shared input beam reflected by the surface 12-1. In this manner, a lidar sensor unit that includes the assembly 86 can generate values for two pixels in a certain scan line within a same ranging event. Alternatively, the output collimators 92A and 94A can launch the output beams with a particular spatial or angular offset, and the two input beams have a corresponding spatial or angular offset, with the wavelength of the pulses emitted by the output collimators 92A and 94A being the same.

Further, in the example implementation of FIG. 23, the assembly 86 includes output collimators 92B and 94B mechanically aimed at a surface 12-2 of the polygon mirror 12. The output collimators 92B and 94B also direct output beams by the side of the corresponding overlap mirror 90B. Similar to the overlap mirror 90A, the overlap mirror 90B does not include an aperture.

The input beam which the reflective surface 12-1 directs to the overlap mirror 90A can be regarded as the first eye of the lidar sensor unit, and the input beam which the reflective surface 12-2 directs to the overlap mirror 90B can be regarded as the second eye of the lidar sensor unit. The assembly 86 thus implements off-axis illumination for both eyes of the lidar sensor unit.

Figure 24:
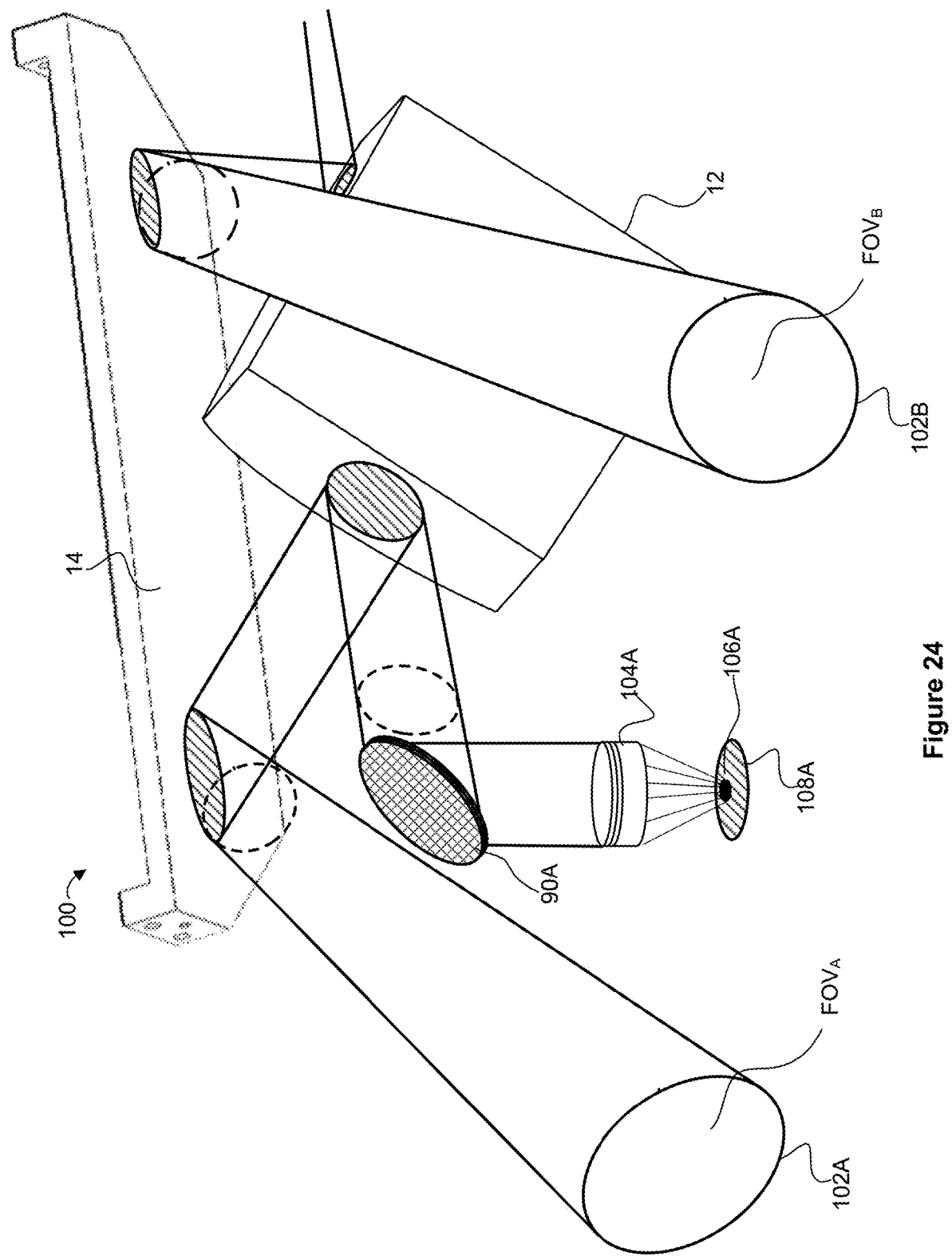
FIG. 24 is a perspective view of a path of an input beam relative to the polygon mirror and the planar mirror of the lidar sensor unit of FIG. 1.
Figure 25:
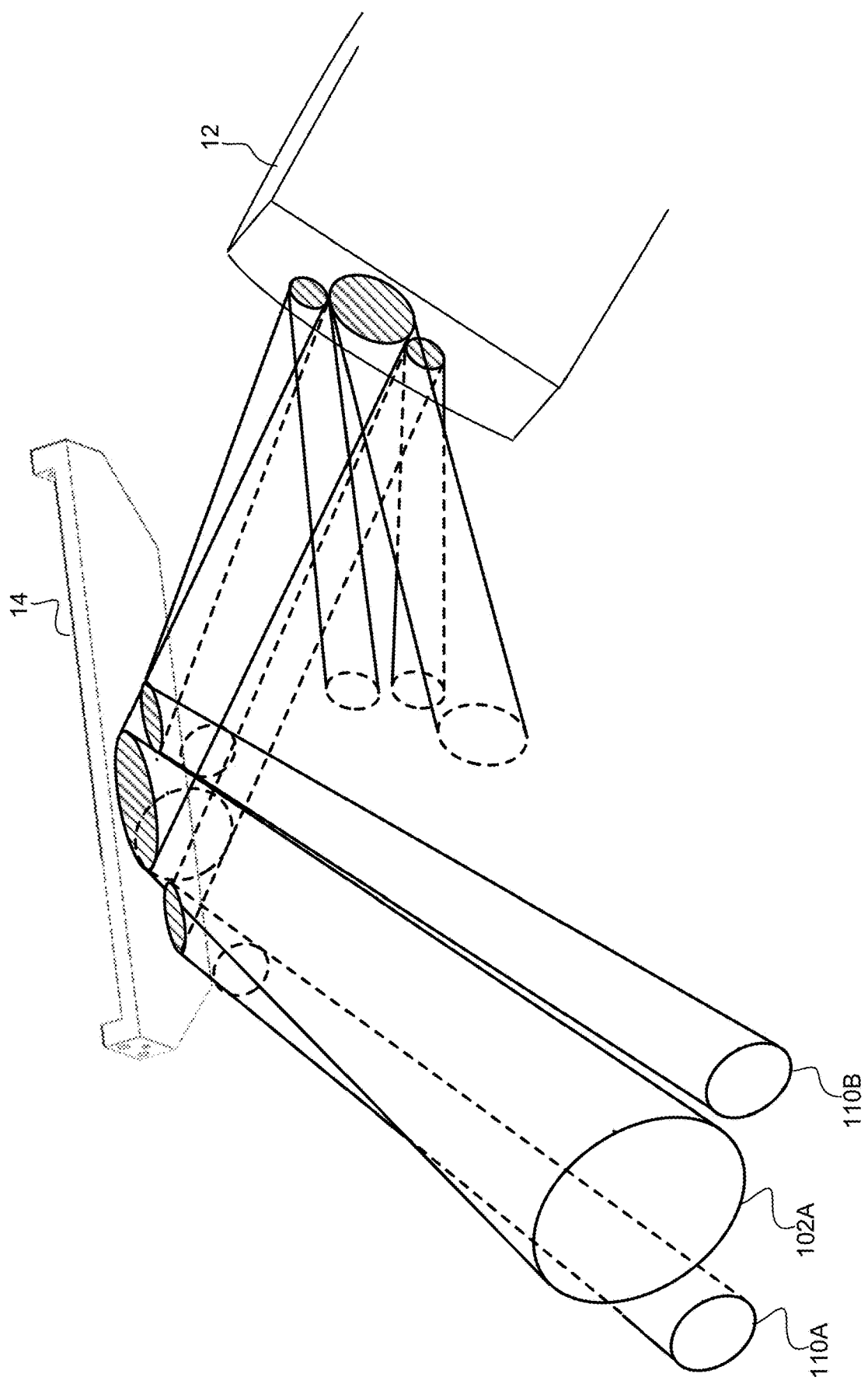
FIG. 25 is a perspective view of paths of an input beam and output beams relative to the polygon mirror and the planar mirror of the lidar sensor unit of FIG. 1.

For further clarity, FIGS. 24 and 25 illustrate example paths along which input and output beams travel in the sensor unit 10 and, in particular, the scanner 11. As discussed in more detail below, an input beam typically contains only a relatively small portion of the energy of an output beam. A receiver field of view (FOV) may define a larger angular cone over which the receiver detects light as compared to the light-source FOV, or the angular cone illuminated by the light source. Accordingly, FIGS. 24 and 25 illustrate input and output beams of as cones of different sizes, but neither the sizes of the cones nor the degrees of divergence of these cones are drawn to scale.

In the scenario of FIG. 24, the input beam 102A first impinges on the reflective surface of the planar mirror 14, which reflects the input beam 102A toward the reflective surface of the polygon mirror 12, which in turn reflects the input beam 102B toward the overlap mirror 90A. The overlap mirror 90A then directs the input beam 102A toward a lens 104A, which focuses the input beam 102A on an active region 106A of a receiver 108A. For a given operational state, the current orientation of the polygon mirror 12 defines the horizontal position of the receiver field of view $FOV_A$ within the FOR of the sensor unit 10, and the current orientation of the planar mirror 14 defines the vertical position of the $FOV_A$ within the FOR. An input beam 102B in meantime impinges on the planar mirror 14 at a different location. The planar mirror 14 directs the input beam 102B to a different surface of the polygon mirror 12, which in turn directs the input beam 102B to an assembly including an overlap mirror, a lens, an active region of a receiver, etc. (not illustrated to avoid clutter) disposed on the opposite side of the polygon mirror 12 from the components 90A, 104A, etc.

The output beams according to these implementations are scanned synchronously because these beams reflect off the same mirrors 12 and 14. In other words, the output beams are scanned at approximately the same scanning rate across the field of regard, and the input beams maintain approximately the same angular separation. For example, both output beams may scan horizontally across the field of regard at approximately 600 radians/sec, and the two output beams may have a substantially fixed angular separation of approximately 20 degrees. In addition to the two output beams being scanned synchronously with respect to each other, each receiver FOV is also scanned synchronously with its respective light-source FOV.

As discussed in more detail below, a lidar system can use the input beams 102A and 102B to generate two pixels during the same ranging event, with an integer or non-integer separation between the pixels. Further, in some implementations, each of the input beams 102A and 102B is made up of two beams of light corresponding to two output beams of different wavelengths, $\lambda_1$ and $\lambda_2$, and accordingly can be used to produce two pixels (e.g., an odd pixel and an even pixel) rather than a single pixel during a single ranging event. The lidar sensor unit 10 thus can produce the total of four pixels per ranging event. As a more specific example, a DOE or another suitable element can impart to a pulse of light a relatively small angular separation into pulses of wavelengths $\lambda_1$ and $\lambda_2$, so that the distance between the light pulses of wavelengths $\lambda_1$ and $\lambda_2$ at the maximum range of the lidar system corresponds to the width of multiple pixels. The DOE may split the pulse before directing the resulting output beams to the polygon mirror, or the DOE may be disposed downrange of the mirrors 12 and 14 and split a pulse after propagation through the scanner.

In another example implementation, the input beam 102A includes two component input beams of the same wavelength, which are substantially overlapped spatially but have a small angular offset (e.g., between approximately 0.1 and 2 degrees) with respect to one another. When the two component input beams pass through the lens 104A, the angular offset results in the two beams being focused on two separate spots, which may be separated by approximately 0.4 to 2 mm. In this manner, the angular offset between the beams results in a spatial separation after passing through the lens.

FIG. 25 illustrates an example spatial arrangement of the fields of view of the input beam 102A and output beams 110A and 110B. The beams 102A, 110A, and 110B are mechanically aimed so as to minimize the resulting "footprints" on the mirrors 14 and 12. Thus, the beams are adjacent to each other on the reflective surfaces of the mirrors 12 and 14. Further, in accordance with off-axis illumination techniques, the output beams 110A and 110B are directed at a reflective surface of the polygon mirror 12 so as to be not entirely coaxial with the input beam 102A (illustrated in FIG. 25 in an exaggerated manner).

In contrast to the implementation of FIGS. 23-25, the output beam 82 and the input beam 83 in FIG. 22 are more aligned with each other, and may be substantially coaxial. The output beam 82 and input beam 83 may at least partially overlap or share a common propagation axis, so that the output beam 82 and input beam 83 travel along substantially the same optical path (albeit in opposite directions). As the lidar system scans the output beam 82 across a field of regard, the input beam 83 may follow along with the output beam 82, so that the coaxial relationship between the two beams is maintained.

Referring again to FIG. 25, the output beams of light 110A and 110B emitted by the light source (such as a light source 122A, discussed below with reference to FIGS. 26A and 26B) is a collimated optical beam with any suitable beam divergence, such as a divergence of approximately 0.1 to 3.0 milliradian (mrad). Divergence of the output beams 110A and 110B may refer to an angular measure of an increase in beam size (e.g., a beam radius or beam diameter) as the output beams 110A and 110B travel away from the lidar system. The output beams 110A and 110B may have a substantially circular cross section with a beam divergence characterized by a single divergence value. For example, the output beams 110A and 110B with a circular cross section and a divergence of 1 mrad may have a beam diameter or spot size of approximately 10 cm at a distance of 100 m from the lidar system. In some implementations, the output beams 110A and 110B may be an astigmatic beam or may have a substantially elliptical cross section and may be characterized by two divergence values. As an example, the output beams 110A and 110B may have a fast axis and a slow axis, where the fast-axis divergence is greater than the slow-axis divergence. As another example, the output beams 110A and 110B may be an astigmatic beam with a fast-axis divergence of 2 mrad and a slow-axis divergence of 0.5 mrad.

The output beams 110A and 110B may be unpolarized or randomly polarized, may have no specific or fixed polarization (e.g., the polarization may vary with time), or may have a particular polarization (e.g., the output beams 110A and 110B may be linearly polarized, elliptically polarized, or circularly polarized). As an example, the light source may produce linearly polarized light, and the lidar system may include a quarter-wave plate that converts this linearly polarized light into circularly polarized light. The lidar system may transmit the circularly polarized light as the output beams 110A and 110B, and receive the input beam(s) 102A, which may be substantially or at least partially circularly polarized in the same manner as the output beams 110A and 110B (e.g., if the output beams 110A and 110B are right-hand circularly polarized, then the input beam 102A may also be right-hand circularly polarized). The input beam 102A may pass through the same quarter-wave plate (or a different quarter-wave plate), resulting in the input beam 102A being converted to linearly polarized light which is orthogonally polarized (e.g., polarized at a right angle) with respect to the linearly polarized light produced by light source 110. As another example, the lidar system may employ polarization-diversity detection where two polarization components are detected separately. The output beams 110A and 110B may be linearly polarized, and the lidar system may split the input beam 102A into two polarization components (e.g., s-polarization and p-polarization) which are detected separately by two photodiodes (e.g., a balanced photoreceiver that includes two photodiodes).

The scanner 11 can scan each of the first beam of light and the second beam of light so as to define a respective field of regard approximately 60 degrees wide. Depending on the implementation, the fields of regard can have a relatively large overlap (e.g., 20 degrees, 30 degrees, 40 degrees), a relatively small overlap (e.g., one degree, two degrees, three degrees, four degrees, five degrees), or no overlap. Dynamic modifications to the fields of regard are discussed in more detail below. The overlap region may be oriented in a direction of travel of a vehicle on which the lidar system 10 is deployed.

III. Operation of a Lidar System

Figure 26A:
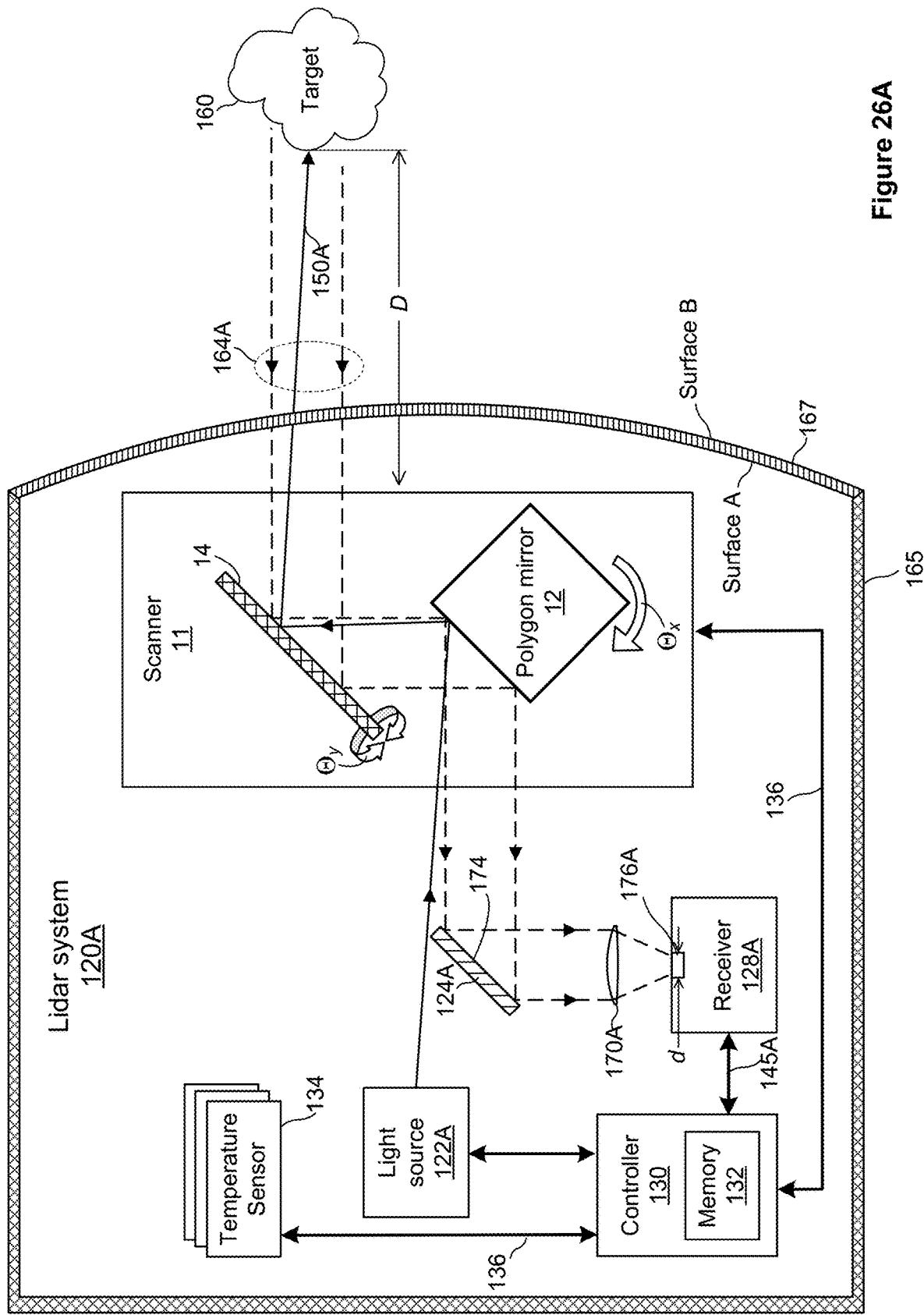
FIG. 26A is a block diagram of an example lidar system in which the lidar sensor unit of FIG. 1 can operate in a single-eye configuration.

Next, FIG. 26A illustrates an example lidar system 120A in which all or some of the components of lidar sensor unit 10 can be implemented according to a single-eye configuration. The lidar system 120A may be referred to as a laser ranging system, a laser radar system, a LIDAR system, a lidar sensor, or a laser detection and ranging (LADAR or ladar) system. The lidar system 120A may include a light source 122A, a mirror 124A (referred to as overlap mirror, superposition mirror, or beam-combiner mirror), a scanner 11, a receiver 128A, and a controller 130 equipped with a memory unit 132. In some implementations, the lidar system 120A also can include one or more sensors 134 such as a temperature sensor, a moisture sensor, etc.

The scanner 11 may be referred to as a beam scanner, optical scanner, or laser scanner. The scanner 11 may be implemented as discussed above with reference to FIGS. 1-25 and include a polygon mirror 12, a planar mirror 14, and corresponding motors to drive the rotation of the polygon mirror 12 and the oscillation of the planar mirror 14.

Depending on the implementation, the controller 130 may include one or more processors, an application-specific integrated circuit (ASIC), a field-programmable gate array (FPGA), and/or other suitable circuitry. The non-transitory computer-readable memory 132 of the controller 130 can be configured to store instructions executable by the controller 130 as well as data which the controller 130 can produce based on the signals from the components of the system 120A and/or provide to these components. The memory 132 can include volatile (e.g., RAM) and/or non-volatile (e.g., flash memory, a hard disk) components. The data the controller 130 generates during operation and stores in the memory 132 can include pixel data and other results of analyzing characteristics of the target 160, alarm data (e.g., readings from the sensors 134 that exceed certain predefined thresholds), and the configuration data the controller 130 can retrieve from the memory 132 during operation can include definitions of various scan patterns, for example. Alternatively or additionally to the memory 132, the controller 130 can be configured to access memory disposed remotely relative to the lidar system 120A in the vehicle controller (see below) or even memory disposed remotely relative to the vehicle, such as on a network server. In addition to collecting data from receiver 128A, the controller 130 can provide control signals to and, in some implementations, receive diagnostics data from, the light source 122A, the one or more sensors 134, and the scanner 11 via communication links 136.

In some implementations, the light source 122A can be an output collimator similar to the output collimator(s) 77 discussed above, e.g., a lens rigidly coupled to an end of a fiber-optic cable, with the other end of the fiber-optic cable coupled to a laser disposed remotely relative to the scanner 11. Examples of such configurations are discussed in more detail below with reference to FIGS. 32 and 33. In other implementations, the light source 122A can be an assembly that includes a laser.

The light source 122A thus may include, or be optically coupled to, a laser which emits light having a particular operating wavelength in the infrared, visible, or ultraviolet portions of the electromagnetic spectrum. As a more specific example, the light source 122A may include a laser with an operating wavelength between approximately 1.2 μm and 1.7 μm.

In operation, the light source 122A emits an output beam of light 150A which may be continuous-wave, pulsed, or modulated in any suitable manner for a given application. The output beam of light 150A is directed downrange toward a remote target 160 located a distance D from the lidar system 120A and at least partially contained within a field of regard of the system 120A. Depending on the scenario and/or the implementation of the lidar system 120A, the distance D can be between 1 m and 1 km, for example.

Once the output beam 150A reaches the downrange target 160, the target 160 may scatter or, in some cases, reflect at least a portion of light from the output beam 150A, and some of the scattered or reflected light may return toward the lidar system 120A. In the example of FIG. 26A, the scattered or reflected light is represented by input beam 164A, which passes through the scanner 11. The input beam 164A passes through the scanner 11 to the mirror 124A. The mirror 124A in turn directs the input beam 164A to the receiver 128A. The input beam 164A may contain only a relatively small fraction of the light from the output beam 150A. For example, the ratio of average power, peak power, or pulse energy of the input beam 164A to average power, peak power, or pulse energy of the output beam 150A may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of the output beam 150A has a pulse energy of 1 microjoule (µJ), then the pulse energy of a corresponding pulse of the input beam 164A may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, or 1 aJ.

The output beam 150A may be referred to as a laser beam, light beam, optical beam, emitted beam, or just beam; and the input beam 164A may be referred to as a return beam, received beam, return light, received light, input light, scattered light, or reflected light. As used herein, scattered light may refer to light that is scattered or reflected by the target 160. The input beam 164A may include light from the output beam 150A that is scattered by the target 160, light from the output beam 150A that is reflected by the target 160, or a combination of scattered and reflected light from target 160A. The input beam 164A also can include "passive" light signals, or light from various other sources and of various wavelengths scattered by the target 160.

The operating wavelength of a lidar system 120A may lie, for example, in the infrared, visible, or ultraviolet portions of the electromagnetic spectrum. The Sun also produces light in these wavelength ranges, and thus sunlight can act as background noise which can obscure signal light detected by the lidar system 120A. This solar background noise can result in false-positive detections or can otherwise corrupt measurements of the lidar system 120A, especially when the receiver 128A includes SPAD detectors (which can be highly sensitive).

Generally speaking, the light from the Sun that passes through the Earth's atmosphere and reaches a terrestrial-based lidar system such as the system 120A can establish an optical background noise floor for this system. Thus, in order for a signal from the lidar system 120A to be detectable, the signal must rise above the background noise floor. It is generally possible to increase the signal-to-noise (SNR) ratio of the lidar system 120A by raising the power level of the output beam 150A, but in some situations it may be desirable to keep the power level of the output beam 150A relatively low. For example, increasing transmit power levels of the output beam 150A can result in the lidar system 120A not being eye-safe.

In some implementations, the lidar system 120A operates at one or more wavelengths between approximately 1400 nm and approximately 1600 nm. For example, the light source 122A may produce light at approximately 1550 nm.

In some implementations, the lidar system 120A operates at frequencies at which atmospheric absorption is relatively low. For example, the lidar system 120A can operate at wavelengths in the approximate ranges from 980 nm to 1110 nm or from 1165 nm to 1400 nm.

In other implementations, the lidar system 120A operates at frequencies at which atmospheric absorption is high. For example, the lidar system 120A can operate at wavelengths in the approximate ranges from 930 nm to 980 nm, from 1100 nm to 1165 nm, or from 1400 nm to 1460 nm.

According to some implementations, the lidar system 120A can include an eye-safe laser, or the lidar system 120A can be classified as an eye-safe laser system or laser product. An eye-safe laser, laser system, or laser product may refer to a system with an emission wavelength, average power, peak power, peak intensity, pulse energy, beam size, beam divergence, exposure time, or scanned output beam such that emitted light from the system presents little or no possibility of causing damage to a person's eyes. For example, the light source 122A or the lidar system 120A may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In some implementations, the lidar system 120A may be classified as an eye-safe laser product (e.g., with a Class 1 or Class I classification) configured to operate at any suitable wavelength between approximately 1400 nm and approximately 2100 nm. In some implementations, the light source 122A may include a laser with an operating wavelength between approximately 1400 nm and approximately 1600 nm, and the lidar system 120A may be operated in an eye-safe manner. In some implementations, the light source 122A or the lidar system 120A may be an eye-safe laser product that includes a scanned laser with an operating wavelength between approximately 1530 nm and approximately 1560 nm. In some implementations, the lidar system 120A may be a Class 1 or Class I laser product that includes a fiber laser or solid-state laser with an operating wavelength between approximately 1400 nm and approximately 1600 nm.

The receiver 128A may receive or detect photons from the input beam 164A and generate one or more representative signals. For example, the receiver 128A may generate an output electrical signal 145A that is representative of the input beam 164. The receiver 128A may send the electrical signal to the controller 130. The controller 130 can be configured to analyze one or more characteristics of the electrical signal 145A to determine one or more characteristics of the target 160, such as its distance downrange from the lidar system 120A. More particularly, the controller 130 may analyze the time of flight or phase modulation for the beam of light 150A transmitted by the light source 122A. If the lidar system 120A measures a time of flight of T (e.g., T represents a round-trip time of flight for an emitted pulse of light to travel from the lidar system 120A to the target 160 and back to the lidar system 120A), then the distance D from the target 160 to the lidar system 120A may be expressed as $D = c \cdot T/2$, where c is the speed of light (approximately $3.0 \times 10^8$ m/s).

As a more specific example, if the lidar system 120A measures the time of flight to be T=300 ns, then the lidar system 120A can determine the distance from the target 160 to the lidar system 120A to be approximately D=45.0 m. As another example, the lidar system 120A measures the time of flight to be T=1.33 μs and accordingly determines that the distance from the target 160 to the lidar system 120A is approximately D=199.5 m. The distance D from lidar system 120A to the target 160 may be referred to as a distance, depth, or range of the target 160. As used herein, the speed of light c refers to the speed of light in any suitable medium, such as for example in air, water, or vacuum. The speed of light in vacuum is approximately $2.9979 \times 10^8$ m/s, and the speed of light in air (which has a refractive index of approximately 1.0003) is approximately $2.9970 \times 10^8$ m/s.

The target 160 may be located a distance D from the lidar system 120A that is less than or equal to a maximum range $R_{MAX}$ of the lidar system 120A. The maximum range $R_{MAX}$ (which also may be referred to as a maximum distance) of a lidar system 120A may correspond to the maximum distance over which the lidar system 120A is configured to sense or identify targets that appear in a field of regard of the lidar system 120A. The maximum range of lidar system 120A may be any suitable distance, such as for example, 25 m, 50 m, 100 m, 200 m, 500 m, or 1 km. As a specific example, a lidar system with a 200-m maximum range may be configured to sense or identify various targets located up to 200 m away. For a lidar system with a 200-m maximum range ($R_{MAX}$=200 m), the time of flight corresponding to the maximum range is approximately 2. $R_{MAX}/c \cong 1.33$ μs.

In some implementations, the light source 122A, the scanner 11, and the receiver 128A are packaged together within a single housing 165, which may be a box, case, or enclosure that holds or contains all or part of a lidar system 120A. The housing 165 can include at least some of the housing components (the shell roof 56, the shell side wall 58, etc.) discussed above. In the example of FIG. 26A, the housing 165 includes a window 167 through which the beams 150A and 164A pass. In one example implementation, the lidar-system housing 165 contains the light source 122A, the overlap mirror 124A, the scanner 11, and the receiver 128A of the lidar system 120A. The controller 130 may reside within the same housing 165 as the components 122A, 11, 128A or the controller 130 may reside remotely from the housing 165.

Moreover, in some implementations, the housing 165 includes multiple lidar sensor units, each including a respective scanner and a receiver. Depending on the particular implementation, each of the multiple lidar sensor units can include a separate light source or a common light source. The multiple lidar sensor units can be configured to cover non-overlapping adjacent fields of regard or partially overlapping fields of regard, depending on the implementation.

The housing 165 may be an airtight or watertight structure that prevents water vapor, liquid water, dirt, dust, or other contaminants from getting inside the housing 165. The housing 165 may be filled with a dry or inert gas, such as for example dry air, nitrogen, or argon. The housing 165 may include one or more electrical connections for conveying electrical power or electrical signals to and/or from the housing.

The window 167 may be made from any suitable substrate material, such as for example, glass or plastic (e.g., polycarbonate, acrylic, cyclic-olefin polymer, or cyclic-olefin copolymer). The window 167 may include an interior surface (surface A) and an exterior surface (surface B), and surface A or surface B may include a dielectric coating having particular reflectivity values at particular wavelengths. A dielectric coating (which may be referred to as a thin-film coating, interference coating, or coating) may include one or more thin-film layers of dielectric materials (e.g., $SiO_2$, $TiO_2$, $Al_2O_3$, $Ta_2O_5$, $MgF_2$, $LaF_3$, or $AlF_3$) having particular thicknesses (e.g., thickness less than 1 μm) and particular refractive indices. A dielectric coating may be deposited onto surface A or surface B of the window 167 using any suitable deposition technique, such as for example, sputtering or electron-beam deposition.

The dielectric coating may have a high reflectivity at a particular wavelength or a low reflectivity at a particular wavelength. A high-reflectivity (HR) dielectric coating may have any suitable reflectivity value (e.g., a reflectivity greater than or equal to 80%, 90%, 95%, or 99%) at any suitable wavelength or combination of wavelengths. A low-reflectivity dielectric coating (which may be referred to as an anti-reflection (AR) coating) may have any suitable reflectivity value (e.g., a reflectivity less than or equal to 5%, 2%, 1%, 0.5%, or 0.2%) at any suitable wavelength or combination of wavelengths. In particular embodiments, a dielectric coating may be a dichroic coating with a particular combination of high or low reflectivity values at particular wavelengths. For example, a dichroic coating may have a reflectivity of less than or equal to 0.5% at approximately 1550-1560 nm and a reflectivity of greater than or equal to 90% at approximately 800-1500 nm.

In some implementations, surface A or surface B has a dielectric coating that is anti-reflecting at an operating wavelength of one or more light sources 122A contained within enclosure 165. An AR coating on surface A and surface B may increase the amount of light at an operating wavelength of light source 122A that is transmitted through the window 167. Additionally, an AR coating at an operating wavelength of the light source 120A may reduce the amount of incident light from output beam 150A that is reflected by the window 167 back into the housing 165. In an example implementation, each of surface A and surface B has an AR coating with reflectivity less than 0.5% at an operating wavelength of light source 122A. As an example, if the light source 122A has an operating wavelength of approximately 1550 nm, then surface A and surface B may each have an AR coating with a reflectivity that is less than 0.5% from approximately 1547 nm to approximately 1553 nm. In another implementation, each of surface A and surface B has an AR coating with reflectivity less than 1% at the operating wavelengths of the light source 110. For example, if the housing 165 encloses two sensor heads with respective light sources, the first light source emits pulses at a wavelength of approximately 1535 nm and the second light source emits pulses at a wavelength of approximately 1540 nm, then surface A and surface B may each have an AR coating with reflectivity less than 1% from approximately 1530 nm to approximately 1545 nm.

The window 167 may have an optical transmission that is greater than any suitable value for one or more wavelengths of one or more light sources 122A contained within the housing 165. As an example, the window 167 may have an optical transmission of greater than or equal to 70%, 80%, 90%, 95%, or 99% at a wavelength of light source 122A. In one example implementation, the window 167 can transmit greater than or equal to 95% of light at an operating wavelength of the light source 122A. In another implementation, the window 167 transmits greater than or equal to 90% of light at the operating wavelengths of the light sources enclosed within the housing 165.

Surface A or surface B may have a dichroic coating that is anti-reflecting at one or more operating wavelengths of one or more light sources 122A and high-reflecting at wavelengths away from the one or more operating wavelengths. For example, surface A may have an AR coating for an operating wavelength of the light source 122A, and surface B may have a dichroic coating that is AR at the light-source operating wavelength and HR for wavelengths away from the operating wavelength. A coating that is HR for wavelengths away from a light-source operating wavelength may prevent most incoming light at unwanted wavelengths from being transmitted through the window 167. In one implementation, if light source 122A emits optical pulses with a wavelength of approximately 1550 nm, then surface A may have an AR coating with a reflectivity of less than or equal to 0.5% from approximately 1546 nm to approximately 1554 nm. Additionally, surface B may have a dichroic coating that is AR at approximately 1546-1554 nm and HR (e.g., reflectivity of greater than or equal to 90%) at approximately 800-1530 nm and approximately 1570-1700 nm.

Surface B of the window 167 may include a coating that is oleophobic, hydrophobic, or hydrophilic. A coating that is oleophobic (or, lipophobic) may repel oils (e.g., fingerprint oil or other non-polar material) from the exterior surface (surface B) of the window 167. A coating that is hydrophobic may repel water from the exterior surface. For example, surface B may be coated with a material that is both oleophobic and hydrophobic. A coating that is hydrophilic attracts water so that water may tend to wet and form a film on the hydrophilic surface (rather than forming beads of water as may occur on a hydrophobic surface). If surface B has a hydrophilic coating, then water (e.g., from rain) that lands on surface B may form a film on the surface. The surface film of water may result in less distortion, deflection, or occlusion of an output beam 150A than a surface with a non-hydrophilic coating or a hydrophobic coating.

With continued reference to FIG. 26A, the light source 122A may include a pulsed laser configured to produce or emit pulses of light with a certain pulse duration. In an example implementation, the pulse duration or pulse width of the pulsed laser is approximately 10 picoseconds (ps) to 20 nanoseconds (ns). In another implementation, the light source 122A is a pulsed laser that produces pulses with a pulse duration of approximately 1-4 ns. In yet another implementation, the light source 122A is a pulsed laser that produces pulses at a pulse repetition frequency of approximately 100 kHz to 5 MHz or a pulse period (e.g., a time between consecutive pulses) of approximately 200 ns to 10 μs. The light source 122A may have a substantially constant or a variable pulse repetition frequency, depending on the implementation. As an example, the light source 122A may be a pulsed laser that produces pulses at a substantially constant pulse repetition frequency of approximately 640 kHz (e.g., 640,000 pulses per second), corresponding to a pulse period of approximately 1.56 s. As another example, the light source 122A may have a pulse repetition frequency that can be varied from approximately 500 kHz to 3 MHz. As used herein, a pulse of light may be referred to as an optical pulse, a light pulse, or a pulse, and a pulse repetition frequency may be referred to as a pulse rate.

In general, the output beam 150A may have any suitable average optical power, and the output beam 150A may include optical pulses with any suitable pulse energy or peak optical power. Some examples of the average power of the output beam 150A include the approximate values of 1 mW, 10 mW, 100 mW, 1 W, and 10 W. Example values of pulse energy of the output beam 150 include the approximate values of 0.1 μJ, 1 μJ, 10 μJ, 100 μJ, and 1 mJ. Examples of peak power values of pulses included in the output beam 150A are the approximate values of 10 W, 100 W, 1 kW, 5 kW, 10 kW. An example optical pulse with a duration of 1 ns and a pulse energy of 1 μJ has a peak power of approximately 1 kW. If the pulse repetition frequency is 500 kHz, then the average power of the output beam 150 with 1-μJ pulses is approximately 0.5 W, in this example.

The light source 122A may include a laser diode, such as a Fabry-Perot laser diode, a quantum well laser, a distributed Bragg reflector (DBR) laser, a distributed feedback (DFB) laser, or a vertical-cavity surface-emitting laser (VCSEL). The laser diode operating in the light source 122A may be an aluminum-gallium-arsenide (AlGaAs) laser diode, an indium-gallium-arsenide (InGaAs) laser diode, or an indium-gallium-arsenide-phosphide (InGaAsP) laser diode, or any other suitable diode. In some implementations, the light source 122A includes a pulsed laser diode with a peak emission wavelength of approximately 1400-1600 nm. Further, the light source 122A may include a laser diode that is current-modulated to produce optical pulses.

In some implementation, the light source 122A includes a pulsed laser diode followed by one or more optical-amplification stages. For example, the light source 122A may be a fiber-laser module that includes a current-modulated laser diode with a peak wavelength of approximately 1550 nm, followed by a single-stage or a multi-stage erbium-doped fiber amplifier (EDFA) or erbium/ytterbium-doped fiber amplifier (EYDFA). As another example, the light source 122A may include a continuous-wave (CW) or quasi-CW laser diode followed by an external optical modulator (e.g., an electro-optic modulator), and the output of the modulator may be fed into an optical amplifier. In yet other implementations, the light source 122A may include a pulsed solid-state laser or a pulsed fiber laser.

The lidar system 120A also may include one or more optical components configured to condition, shape, filter, modify, steer, or direct the output beam 150A and/or the input beam 164. For example, lidar system 120A may include one or more lenses, mirrors, filters (e.g., bandpass or interference filters), beam splitters, polarizers, polarizing beam splitters, wave plates (e.g., half-wave or quarter-wave plates), diffractive elements, or holographic elements. In some implementations, the lidar system 120A includes a telescope, one or more lenses, or one or more mirrors to expand, focus, or collimate the output beam 150A or the input beam 164A to a desired beam diameter or divergence. As an example, the lidar system 120A may include one or more lenses to focus the input beam 164A onto an active region of the receiver 128A. As another example, the lidar system 120A may include one or more flat mirrors or curved mirrors (e.g., concave, convex, or parabolic mirrors) to steer or focus the output beam 150A or the input beam 164A. For example, the lidar system 120A may include an off-axis parabolic mirror to focus the input beam 164A onto an active region of receiver 128A.

In operation, the light source 122A may emit pulses of light which the scanner 11 scans across a FOR of lidar system 120A. The target 160 may scatter one or more of the emitted pulses, and the receiver 128A may detect at least a portion of the pulses of light scattered by the target 160. Example techniques for selecting and dynamically modifying the FOR using the lidar sensor unit of this disclosure are discussed in more detail below with reference to FIGS. 35-40.

The receiver 128A may be referred to as (or may include) a photoreceiver, optical receiver, optical sensor, detector, photodetector, or optical detector. The receiver 128A in some implementations receives or detects at least a portion of the input beam 164A and produces an electrical signal that corresponds to the input beam 164A. For example, if the input beam 164A includes an optical pulse, then the receiver 128A may produce an electrical current or voltage pulse that corresponds to the optical pulse detected by the receiver 128A. In an example implementation, the receiver 128A includes one or more avalanche photodiodes (APDs) or one or more single-photon avalanche diodes (SPADs). In another implementation, the receiver 128A includes one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions).

The receiver 128A may have an active region or an avalanche-multiplication region that includes silicon, germanium, or InGaAs. The active region of receiver 128A may have any suitable size, such as for example, a diameter or width of approximately 50-500 µm. The receiver 128 may include circuitry that performs signal amplification, sampling, filtering, signal conditioning, analog-to-digital conversion, time-to-digital conversion, pulse detection, threshold detection, rising-edge detection, or falling-edge detection. For example, the receiver 128A may include a transimpedance amplifier that converts a received photocurrent (e.g., a current produced by an APD in response to a received optical signal) into a voltage signal. The receiver 128A may direct the voltage signal to pulse-detection circuitry that produces an analog or digital output signal 145A that corresponds to one or more characteristics (e.g., rising edge, falling edge, amplitude, or duration) of a received optical pulse. For example, the pulse-detection circuitry may perform a time-to-digital conversion to produce the digital output signal 145A. The receiver 128A may send the electrical output signal 145A to the controller 130 for processing or analysis, e.g., to determine a time-of-flight value corresponding to a received optical pulse.

The controller 130 may be electrically coupled or otherwise communicatively coupled to one or more of the light source 122A, the scanner 11, and the receiver 128A. The controller 130 may receive electrical trigger pulses or edges from the light source 122A, where each pulse or edge corresponds to the emission of an optical pulse by the light source 122A. The controller 130 may provide instructions, a control signal, or a trigger signal to the light source 122A indicating when the light source 122A should produce optical pulses. For example, the controller 130 may send an electrical trigger signal that includes electrical pulses, where the light source 122A emits an optical pulse in response to each electrical pulse. Further, the controller 130 may cause the light source 122A to adjust one or more of the frequency, period, duration, pulse energy, peak power, average power, or wavelength of the optical pulses produced by the light source 122A.

The controller 130 may determine a time-of-flight value for an optical pulse based on timing information associated with when the pulse was emitted by the light source 122A and when a portion of the pulse (e.g., the input beam 164A) was detected or received by the receiver 128A. The controller 130 may include circuitry that performs signal amplification, sampling, filtering, signal conditioning, analog-to-digital conversion, time-to-digital conversion, pulse detection, threshold detection, rising-edge detection, or falling-edge detection.

As indicated above, the lidar system 120A may be used to determine the distance to one or more downrange targets 160. By scanning the output beam 150A across a field of regard, the lidar system 120A can be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. For example, a depth map may cover a field of regard that extends 60° horizontally and 15° vertically, and the depth map may include a frame of 100-2000 pixels in the horizontal direction by 4-400 pixels in the vertical direction.

The lidar system 120A may be configured to repeatedly capture or generate point clouds of a field of regard at any suitable frame rate between approximately 0.1 frames per second (FPS) and approximately 1,000 FPS. For example, the lidar system 120A may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. In an example implementation, the lidar system 120A is configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). The point-cloud frame rate may be substantially fixed or dynamically adjustable, depending on the implementation. For example, the lidar system 120A may capture one or more point clouds at a particular frame rate (e.g., 1 Hz) and then switch to capture one or more point clouds at a different frame rate (e.g., 10 Hz). In general, the lidar system can use a slower frame rate (e.g., 1 Hz) to capture one or more high-resolution point clouds, and use a faster frame rate (e.g., 10 Hz) to rapidly capture multiple lower-resolution point clouds.

The field of regard of the lidar system 120A can overlap, encompass, or enclose at least a portion of the target 160, which may include all or part of an object that is moving or stationary relative to lidar system 120A. For example, the target 160 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects.

With continued reference to FIG. 26A, the input beam 164A may pass through the lens 170A which focuses the beam onto an active region 176A of the receiver 128A. The active region 176A may refer to an area over which receiver 128A may receive or detect input light. The active region 176A may have any suitable size or diameter d, such as for example, a diameter of approximately 25 µm, 50 µm, 80 µm, 100 µm, 200 µm, 500 µm, 1 mm, 2 mm, or 5 mm. The overlap mirror 124A may have a reflecting surface 174 that is substantially flat or the reflecting surface 174 may be curved (e.g., the mirror 124 may be an off-axis parabolic mirror configured to focus the input beam 164 onto an active region of the receiver 128A).

Figure 26B:
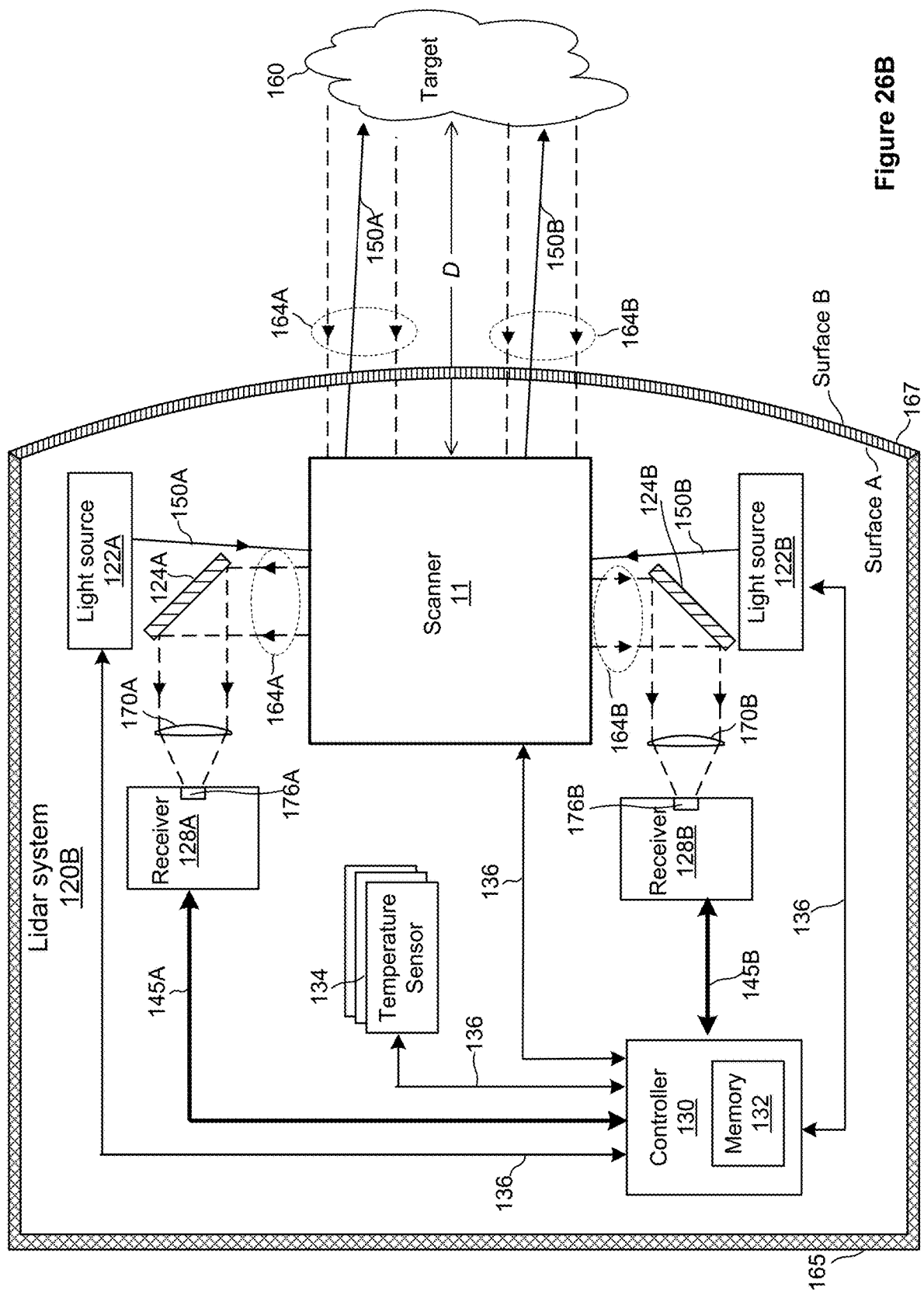
FIG. 26B is a block diagram of an example lidar system in which the lidar sensor unit of FIG. 1 can operate in a two-eye configuration.

Next, FIG. 26B illustrates a lidar system 120B in which the lidar sensor 10 discussed can be implemented. The lidar system 120B is generally similar to the lidar system 120A, but the lidar system 120B uses two eyes to scan a combined FOR rather than a single eye. The scanner 11 in this configuration uses two different reflective surfaces of the polygon mirror 12 to direct output beams 150A and 150B toward the target 160 and concurrently receives and processes input beams 164A and 164B. The output beams 150A and 150B are generated by different light sources 122A and 122B, which can operate at a same wavelength or different wavelength. In some implementations, the lidar system 120B is equipped with two lasers, while in other implementations the light sources 122A and 122B receive laser pulses from a shared laser inside or outside the housing of the lidar system 120B.

Similar to the examples above, each of the output beams 150A and 150B can be further split to generate odd and even pixels, for example. The input beams 164A and 164B can follow different respective paths toward the receivers 128A and 128B, respectively. More particularly, the input beam 164A can travel via an overlap mirror 124A toward a lens 170A, which focusses the light on the active region 176A of the receiver 128A, while the input beam 164B can travel via an overlap mirror 124B toward a lens 170B, which focusses the light on the active region 176AB of the receiver 128B. The lidar system 120B can provide a relatively large angular separation between the outbound beams 150A and 150B, so as to reduce the probability of cross-talk detection.

The controller 130 in the configuration of FIG. 26B can receive electrical signals 145A and 145B from the receivers 128A and 128B, respectively, to determine one or more characteristics of the target 160. The controller 130 can exchange control data with the light sources 122A and 122B, the scanner 11, and the sensors 134.

Figure 27:
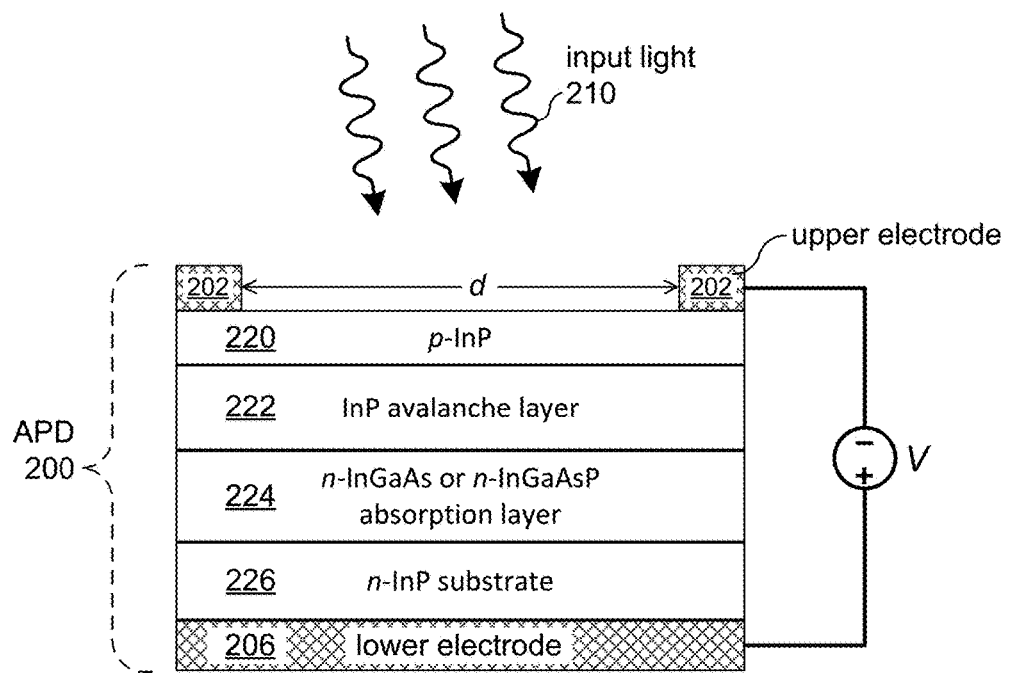
FIG. 27 illustrates an example InGaAs avalanche photodiode which can operate in the lidar system of FIG. 26A or FIG. 26B.

FIG. 27 illustrates an example InGaAs avalanche photodiode (APD) 200. Referring back to FIGS. 26A and 26B, the receiver 128 may include one or more APDs 200 configured to receive and detect light from input light such as the beam 164A or 164B. More generally, the APD 200 can operate in any suitable receiver of input light. The APD 200 may be configured to detect a portion of pulses of light which are scattered by a target located downrange from the lidar system in which the APD 200 operates. For example, the APD 200 may receive a portion of a pulse of light scattered by the target 160 depicted in FIGS. 26A and 26B, and generate an electrical-current signal corresponding to the received pulse of light.

The APD 200 may include doped or undoped layers of any suitable semiconductor material, such as for example, silicon, germanium, InGaAs, InGaAsP, or indium phosphide (InP). Additionally, the APD 200 may include an upper electrode 202 and a lower electrode 206 for coupling the ADP 200 to an electrical circuit. The APD 200 for example may be electrically coupled to a voltage source that supplies a reverse-bias voltage V to the APD 200. Additionally, the APD 200 may be electrically coupled to a transimpedance amplifier which receives electrical current generated by the APD 200 and produces an output voltage signal that corresponds to the received current. The upper electrode 202 or lower electrode 206 may include any suitable electrically conductive material, such as for example a metal (e.g., gold, copper, silver, or aluminum), a transparent conductive oxide (e.g., indium tin oxide), a carbon-nanotube material, or polysilicon. In some implementations, the upper electrode 202 is partially transparent or has an opening to allow input light 210 to pass through to the active region of the APD 200. In FIG. 27, the upper electrode 202 may have a ring shape that at least partially surrounds the active region of the APD 200, where the active region refers to an area over which the APD 200 may receive and detect the input light 210. The active region may have any suitable size or diameter d, such as for example, a diameter of approximately 25 µm, 50 µm, 80 µm, 100 µm, 200 µm, 500 µm, 1 mm, 2 mm, or 5 mm.

The APD 200 may include any suitable combination of any suitable semiconductor layers having any suitable doping (e.g., n-doped, p-doped, or intrinsic undoped material). In the example of FIG. 27, the InGaAs APD 200 includes a p-doped InP layer 220, an InP avalanche layer 222, an absorption layer 224 with n-doped InGaAs or InGaAsP, and an n-doped InP substrate layer 226. Depending on the implementation, the APD 200 may include separate absorption and avalanche layers, or a single layer may act as both an absorption and avalanche region. The APD 200 may operate electrically as a PN diode or a PIN diode, and, during operation, the APD 200 may be reverse-biased with a positive voltage V applied to the lower electrode 206 with respect to the upper electrode 202. The applied reverse-bias voltage V may have any suitable value, such as for example approximately 5 V, 10 V, 20 V, 30 V, 50 V, 75 V, 100 V, or 200 V.

In FIG. 27, photons of the input light 210 may be absorbed primarily in the absorption layer 224, resulting in the generation of electron-hole pairs (which may be referred to as photo-generated carriers). For example, the absorption layer 224 may be configured to absorb photons corresponding to the operating wavelength of the lidar system 120A or 120B (e.g., any suitable wavelength between approximately 1200 nm and approximately 1600 nm). In the avalanche layer 222, an avalanche-multiplication process occurs where carriers (e.g., electrons or holes) generated in the absorption layer 224 collide with the semiconductor lattice of the absorption layer 224, and produce additional carriers through impact ionization. This avalanche process can repeat numerous times so that one photo-generated carrier may result in the generation of multiple carriers. As an example, a single photon absorbed in the absorption layer 224 may lead to the generation of approximately 10, 50, 100, 200, 500, 1000, 10,000, or any other suitable number of carriers through an avalanche-multiplication process. The carriers generated in an APD 200 may produce an electrical current that is coupled to an electrical circuit which may perform signal amplification, sampling, filtering, signal conditioning, analog-to-digital conversion, time-to-digital conversion, pulse detection, threshold detection, rising-edge detection, or falling-edge detection.

The number of carriers generated from a single photo-generated carrier may increase as the applied reverse bias V is increased. If the applied reverse bias V is increased above a particular value referred to as the APD breakdown voltage, then a single carrier can trigger a self-sustaining avalanche process (e.g., the output of the APD 200 is saturated regardless of the input light level). The APD 200 that is operated at or above a breakdown voltage may be referred to as a single-photon avalanche diode (SPAD) and may be referred to as operating in a Geiger mode or a photon-counting mode. The APD 200 that is operated below a breakdown voltage may be referred to as a linear APD, and the output current generated by the APD 200 may be sent to an amplifier circuit (e.g., a transimpedance amplifier). The receiver 128A or 128B (see FIGS. 26A and 26B) may include an APD configured to operate as a SPAD and a quenching circuit configured to reduce a reverse-bias voltage applied to the SPAD when an avalanche event occurs in the SPAD. The APD 200 configured to operate as a SPAD may be coupled to an electronic quenching circuit that reduces the applied voltage V below the breakdown voltage when an avalanche-detection event occurs. Reducing the applied voltage may halt the avalanche process, and the applied reverse-bias voltage may then be re-set to await a subsequent avalanche event. Additionally, the APD 200 may be coupled to a circuit that generates an electrical output pulse or edge when an avalanche event occurs.

In some implementations, the APD 200 or the APD 200 along with transimpedance amplifier have a noise-equivalent power (NEP) that is less than or equal to 100 photons, 50 photons, 30 photons, 20 photons, or 10 photons. For example, the APD 200 may be operated as a SPAD and may have a NEP of less than or equal to 20 photons. As another example, the APD 200 may be coupled to a transimpedance amplifier that produces an output voltage signal with a NEP of less than or equal to 50 photons. The NEP of the APD 200 is a metric that quantifies the sensitivity of the APD 200 in terms of a minimum signal (or a minimum number of photons) that the APD 200 can detect. The NEP may correspond to an optical power (or to a number of photons) that results in a signal-to-noise ratio of 1, or the NEP may represent a threshold number of photons above which an optical signal may be detected. For example, if the APD 200 has a NEP of 20 photons, then an input beam with 20 photons may be detected with a signal-to-noise ratio of approximately 1 (e.g., the APD 200 may receive 20 photons from the input beam 210 and generate an electrical signal representing the input beam 210 that has a signal-to-noise ratio of approximately 1). Similarly, an input beam with 100 photons may be detected with a signal-to-noise ratio of approximately 5. In some implementations, the lidar system 120A or 120B with the APD 200 (or a combination of the APD 200 and transimpedance amplifier) having a NEP of less than or equal to 100 photons, 50 photons, 30 photons, 20 photons, or 10 photons offers improved detection sensitivity with respect to a conventional lidar system that uses a PN or PIN photodiode. For example, an InGaAs PIN photodiode used in a conventional lidar system may have a NEP of approximately $10^4$ to $10^5$ photons, and the noise level in a lidar system with an InGaAs PIN photodiode may be $10^3$ to $10^4$ times greater than the noise level in a lidar system 120A or 120B with the InGaAs APD detector 200.

Referring back to FIGS. 26A and 26B, an optical filter may be located in front of the receiver 128A or 128B and configured to transmit light at one or more operating wavelengths of the light source 122A or 122B and attenuate light at surrounding wavelengths. For example, an optical filter may be a free-space spectral filter located in front of APD 200 of FIG. 27. This spectral filter may transmit light at the operating wavelength of the light source 122A or 122B (e.g., between approximately 1530 nm and 1560 nm) and attenuate light outside that wavelength range. As a more specific example, light with wavelengths of approximately 200-1530 nm or 1560-2000 nm may be attenuated by any suitable amount, such as for example, by at least 5 dB, 10 dB, 20 dB, 30 dB, or 40 dB.

Figure 28:
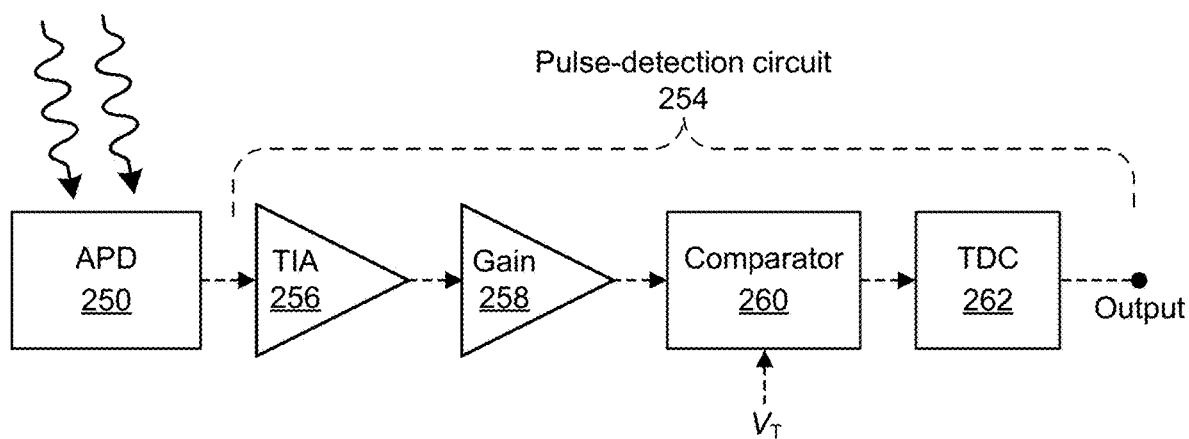
FIG. 28 illustrates an example photodiode coupled to a pulse-detection circuit, which can operate in the lidar system of FIG. 26A or 26B.

Next, FIG. 28 illustrates an APD 250 coupled to an example pulse-detection circuit 254. The APD 250 can be similar to the APD 200 discussed above, or can be any other suitable detector. The pulse-detection circuit 254 can operate in the lidar system of FIG. 26A or 26B as part of the receiver 128. Further, the pulse-detection circuit 254 can operate in the receiver 128 of FIG. 26A, the receiver 128A of FIG. 26B, or any other suitable receiver. The pulse-detection circuit 254 alternatively can be implemented in the controller 130 or another suitable controller. In some implementations, parts of the pulse-detection circuit 254 can operate in a receiver and other parts of the pulse-detection circuit 254 can operate in a controller. For example, components 256 and 258 may be a part of the receiver 140, and components 260 and 262 may be a part of the controller 130.

The pulse-detection circuit 254 may include circuitry that receives a signal from a detector (e.g., an electrical current from the APD 250) and performs current-to-voltage conversion, signal amplification, sampling, filtering, signal conditioning, analog-to-digital conversion, time-to-digital conversion, pulse detection, threshold detection, rising-edge detection, or falling-edge detection. The pulse-detection circuit 254 may determine whether an optical pulse has been received by the APD 250 or may determine a time associated with receipt of an optical pulse by the APD 250. Additionally, the pulse-detection circuit 254 may determine a duration of a received optical pulse. In an example implementation, the pulse-detection circuit 254 includes a transimpedance amplifier (TIA) 256, a gain circuit 258, a comparator 260, and a time-to-digital converter (TDC) 262.

The TIA 256 may be configured to receive an electrical-current signal from the APD 250 and produce a voltage signal that corresponds to the received electrical-current signal. For example, in response to a received optical pulse, the APD 250 may produce a current pulse corresponding to the optical pulse. The TIA 256 may receive the current pulse from the APD 250 and produce a voltage pulse that corresponds to the received current pulse. The TIA 256 may also act as an electronic filter. For example, the TIA 256 may be configured as a low-pass filter that removes or attenuates high-frequency electrical noise by attenuating signals above a particular frequency (e.g., above 1 MHz, 10 MHz, 20 MHz, 50 MHz, 100 MHz, 200 MHz, or any other suitable frequency).

The gain circuit 258 may be configured to amplify a voltage signal. As an example, the gain circuit 258 may include one or more voltage-amplification stages that amplify a voltage signal received from the TIA 256. For example, the gain circuit 258 may receive a voltage pulse from the TIA 256, and the gain circuit 258 may amplify the voltage pulse by any suitable amount, such as for example, by a gain of approximately 3 dB, 10 dB, 20 dB, 30 dB, 40 dB, or 50 dB. Additionally, the gain circuit 258 may also act as an electronic filter configured to remove or attenuate electrical noise.

The comparator 260 may be configured to receive a voltage signal from the TIA 256 or the gain circuit 258 and produce an electrical-edge signal (e.g., a rising edge or a falling edge) when the received voltage signal rises above or falls below a particular threshold voltage VT. As an example, when a received voltage rises above VT, the comparator 260 may produce a rising-edge digital-voltage signal (e.g., a signal that steps from approximately 0 V to approximately 2.5 V, 3.3 V, 5 V, or any other suitable digital-high level). As another example, when a received voltage falls below VT, the comparator 260 may produce a falling-edge digital-voltage signal (e.g., a signal that steps down from approximately 2.5 V, 3.3 V, 5 V, or any other suitable digital-high level to approximately 0 V). The voltage signal received by the comparator 260 may be received from the TIA 256 or the gain circuit 258 and may correspond to an electrical-current signal generated by the APD 250. For example, the voltage signal received by the comparator 260 may include a voltage pulse that corresponds to an electrical-current pulse produced by the APD 250 in response to receiving an optical pulse. The voltage signal received by the comparator 260 may be an analog signal, and an electrical-edge signal produced by the comparator 260 may be a digital signal.

The time-to-digital converter (TDC) 262 may be configured to receive an electrical-edge signal from the comparator 260 and determine an interval of time between emission of a pulse of light by the light source and receipt of the electrical-edge signal. The output of the TDC 262 may be a numerical value that corresponds to the time interval determined by the TDC 262. In some implementations, the TDC 262 has an internal counter or clock with any suitable period, such as for example, 5 ps, 10 ps, 15 ps, 20 ps, 30 ps, 50 ps, 100 ps, 0.5 ns, 1 ns, 2 ns, 5 ns, or 10 ns. The TDC 262 for example may have an internal counter or clock with a 20 ps period, and the TDC 262 may determine that an interval of time between emission and receipt of a pulse is equal to 25,000 time periods, which corresponds to a time interval of approximately 0.5 microseconds. The TDC 262 may send the numerical value "25000" to a processor or controller 130 of the lidar system 120A or 120B, which may include a processor configured to determine a distance from the lidar system 120A or 120B to the target 160 based at least in part on an interval of time determined by a TDC 262. The processor may receive a numerical value (e.g., "25000") from the TDC 262 and, based on the received value, the processor may determine the distance from the lidar system 120A or 120B to the target 160.

IV. Placement and Operation of a Lidar Sensor Unit in a Vehicle

Depending on where a lidar sensor unit is mounted on a vehicle, one or more of the surfaces of the housing could coincide with an external or interior surface of a vehicle. Example surfaces include a hood, a quarter-panel, a sideview mirror housing, a trunk lid, grill, headlamp or tail light housing, dashboard, vehicle roof, front bumper, rear bumper, or other vehicle body part surface. When provided in a vulnerable location of a vehicle, such as a front or rear bumper, the front or rear bumper may be fortified or reinforced with additional force resistance or force dampening features to protect sensitive components of the lidar sensor unit 10 from damage. The low profile of the lidar sensor unit 10 lends itself to being strategically located at optimal locations of a vehicle body without detracting from the aesthetic appearance of the vehicle. For example, a plurality of the lidar sensor units 10 may be disposed one at each front corner, or even one at each of all four corners, of a vehicle roof, with the majority of the volume occupied by the lidar sensor units 10 embedded within the roof, so that only a window of the unit protrudes prominently of the vehicle roof (or other vehicle surface in which the lidar sensor unit 10 is embedded).

The components of the lidar sensor unit 10 may be configured so that at least a portion of the planar mirror 14 extends above the rotatable polygon mirror 12, and only a region extending from a lower edge of the planar mirror 14 to a top of the housing projects prominently from a surface of a body of a vehicle on which the lidar sensor unit 10 is deployed.

Figure 29:
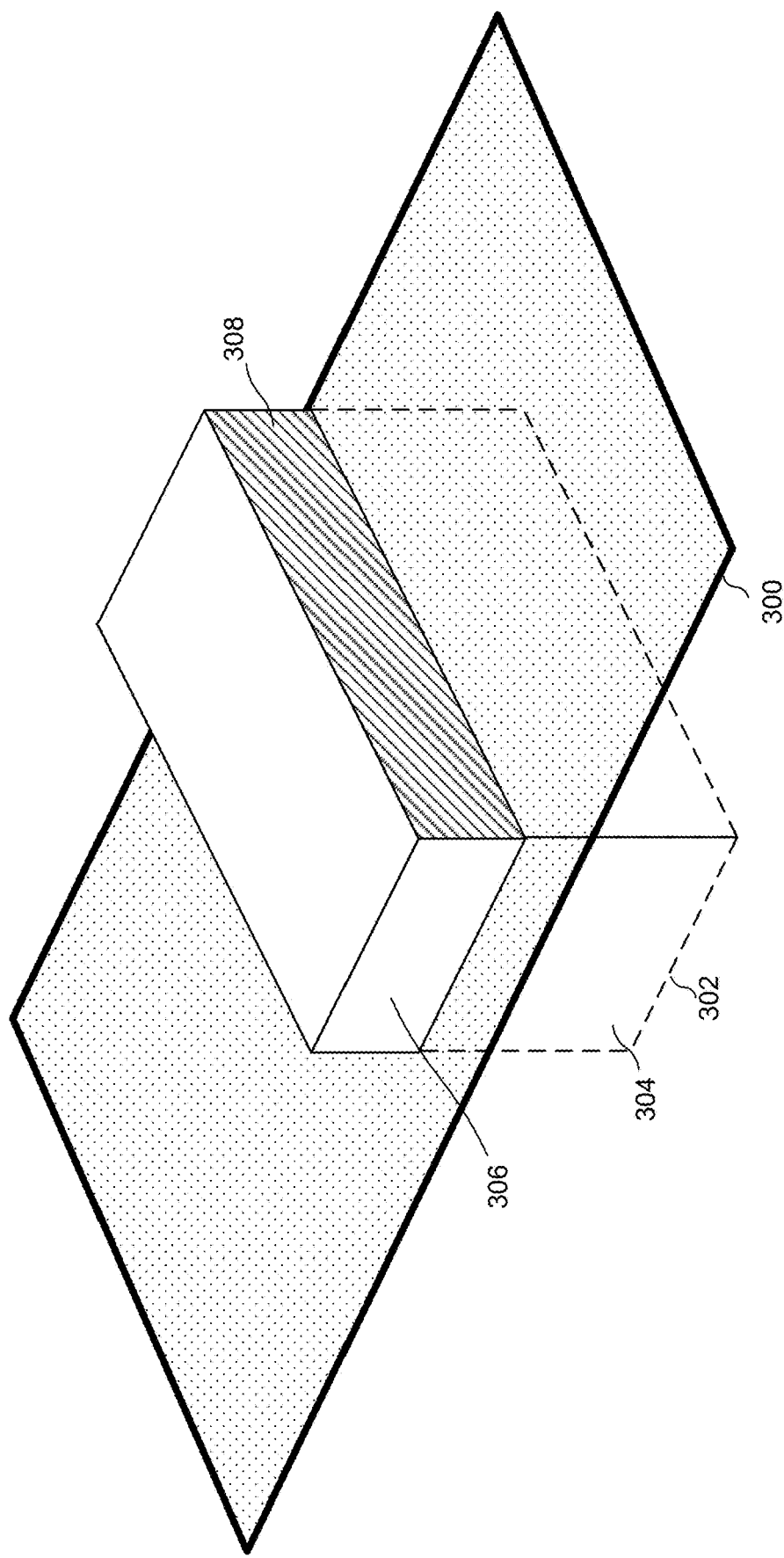
FIG. 29 is a perspective view of a housing of a lidar sensor unit, such as the lidar sensor of FIG. 1, protruding from a surface of a vehicle.

More particularly, as illustrated in FIG. 29, a housing 302 may enclose a lidar sensor unit. Some or all of the enclosed components can be the components of the lidar sensor unit 10. The housing 302 is placed in an opening in a surface 300, which may correspond to a section of a vehicle roof or another suitable surface of a vehicle. A portion 306 protrudes prominently above the surface 300, and a portion is 304 is "submerged" under the surface 300. The portion 306 includes a window 308 through which input and output beams of light travel. The size of the submerged portion of 304 is larger than the protruding portion 306, in at least some of the implementations, to reduce aerodynamic drag. Although the window 308 is illustrated in FIG. 29 as a vertical surface perpendicular to the surface 300, in general the window 308 may be sloped, curved, or otherwise configured to direct a flow of air around the protruding portion 306. In an example implementation, the size of the window 308 corresponds approximately to the size of the planar mirror 14. The window 308 may be the same or similar to the window 167 depicted in FIGS. 26A and 26B.

Referring to FIG. 30, the housing 302 may be embedded in the roof of a vehicle 320, with the window 308 oriented similar to the windshield of the vehicle 320. The housing 302 encloses the lidar sensor unit 10, oriented so that the axis of rotation 324 of the polygon mirror 12 is aligned with a longitudinal axis of the vehicle 326. This orientation may serve to reduce adverse effects of vibration, acceleration, and deceleration. Thus, when the vehicle 320 accelerates quickly, the polygon mirror enclosed in the housing 302 may be displaced along the axis 324, and the input and output beams impinge on the surface of the polygon mirror on the same plane as in the configuration prior to the displacement, which does not result in the scan lines being misaligned to displaced (i.e., the beams may strike different portions of the reflective surface, but the reflection imparted by these portions of the reflective surface is the same as in the original configuration). Similarly, when the vehicle 320 decelerates quickly, the potential displacement of the polygon mirror along the axis 324 does not adversely affect the scan lines. In contrast to these scenarios, when axis 324 is perpendicular to the orientation of the vehicle 320, the displacement of the polygon mirror may result in the $FOR_H$ shifting right or left, which in turn results in scan errors.

In general, any suitable number of lidar sensor units 10 may be integrated into a vehicle. In one example implementation, multiple lidar sensor units 10, operating in a lidar system similar to the system 120B, may be integrated into a car to provide a complete 360-degree horizontal FOR around the car. As another example, 4-10 lidar sensor units 10, each system having a 45-degree to 90-degree horizontal FOR, may be combined together to form a sensing system that provides a point cloud covering a 360-degree horizontal FOR. The lidar sensor units 10 may be oriented so that adjacent FORs have an amount of spatial or angular overlap to allow data from the multiple lidar sensor units 10 to be combined or stitched together to form a single or continuous 360-degree point cloud. As an example, the FOR of each lidar sensor unit 10 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), or spacecraft. In particular embodiments, a vehicle may include an internal combustion engine or an electric motor that provides propulsion for the vehicle.

Figure 31:
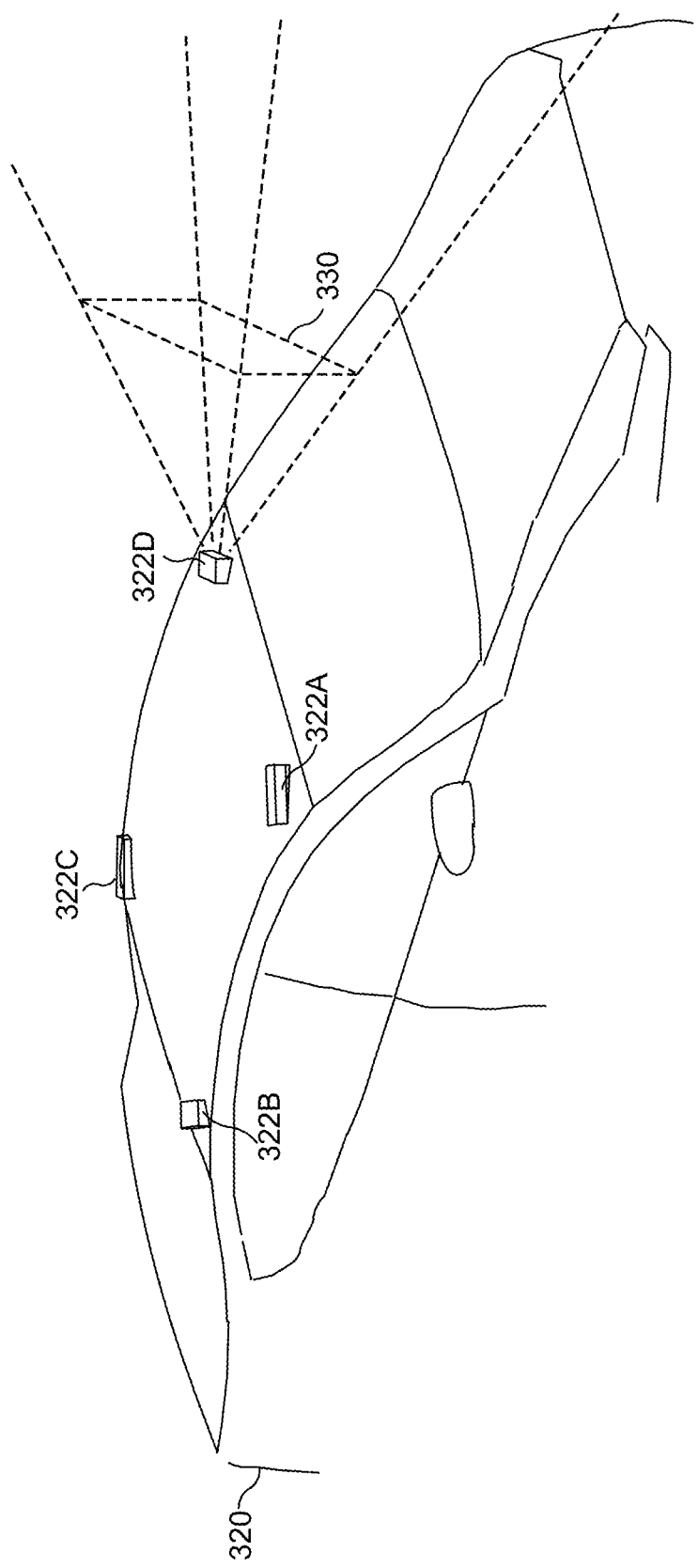
FIG. 31 is a perspective view of a roof of a vehicle, on which four sensor head unit are arranged at respective corners.

Referring to FIG. 31, lidar sensor units 322A-D are installed in the roof of a vehicle 320, in an example implementation. Each of the lidar sensor units 322A-D is approximately at 45° relative to one of the edges of the roof. The lidar sensor units 322A-D thus are oriented so that the FOR of the lidar sensor unit 322A covers an area in front of the vehicle and to the right of the vehicle, the FOR of the lidar sensor unit 322B covers an area behind the vehicle and to the right of the vehicle, the FOR of the lidar sensor unit 322C covers an area behind the vehicle and to the left of the vehicle, and the FOR of the lidar sensor unit 322D covers an area in front of the vehicle and to the left of the vehicle. The FORs of the lidar sensor units 322A and 322D have an angular overlap (e.g., five degrees) directly in front of the vehicle, in an example implementation. Further, in an example implementation, the FORs of the lidar sensor units 322A and 322B have no angular overlap or little angular overlap.

In some implementations, one or more lidar sensor units 10 are included in a vehicle as part of an advanced driver assistance system (ADAS) to assist a driver of the vehicle in the driving process. For example, a lidar sensor units 10 may be part of an ADAS that provides information or feedback to a driver (e.g., to alert the driver to potential problems or hazards) or that automatically takes control of part of a vehicle (e.g., a braking system or a steering system) to avoid collisions or accidents. The lidar sensor units 10 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In some cases, one or more lidar sensor units 10 are integrated into a vehicle as part of an autonomous-vehicle driving system. In an example implementation, the lidar sensor units 10 provides information about the surrounding environment to a driving system of an autonomous vehicle. An autonomous-vehicle driving system may include one or more computing systems that receive information from the lidar sensor units 10 about the surrounding environment, analyze the received information, and provide control signals to the vehicle's driving systems (e.g., steering wheel, accelerator, brake, or turn signal). For example, the lidar sensor units 10 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 160 (see FIGS. 26A and 26B) and their respective locations, distances, or speeds, and the autonomous-vehicle driving system may update control signals based on this information. As an example, if the lidar sensor unit 10 detects a vehicle ahead that is slowing down or stopping, the autonomous-vehicle driving system may send instructions to release the accelerator and apply the brakes.

An autonomous vehicle may be referred to as an autonomous car, driverless car, self-driving car, robotic car, or unmanned vehicle. An autonomous vehicle may be a vehicle configured to sense its environment and navigate or drive with little or no human input. For example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

An autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

As indicated above, a light source of the lidar sensor unit 10 can be located remotely from some of the other components of the lidar sensor unit 10 (such as the scanner 11 and the receiver 128A or 128B). Moreover, a lidar system implemented in a vehicle may include fewer light sources than scanners and receivers.

Figure 32:
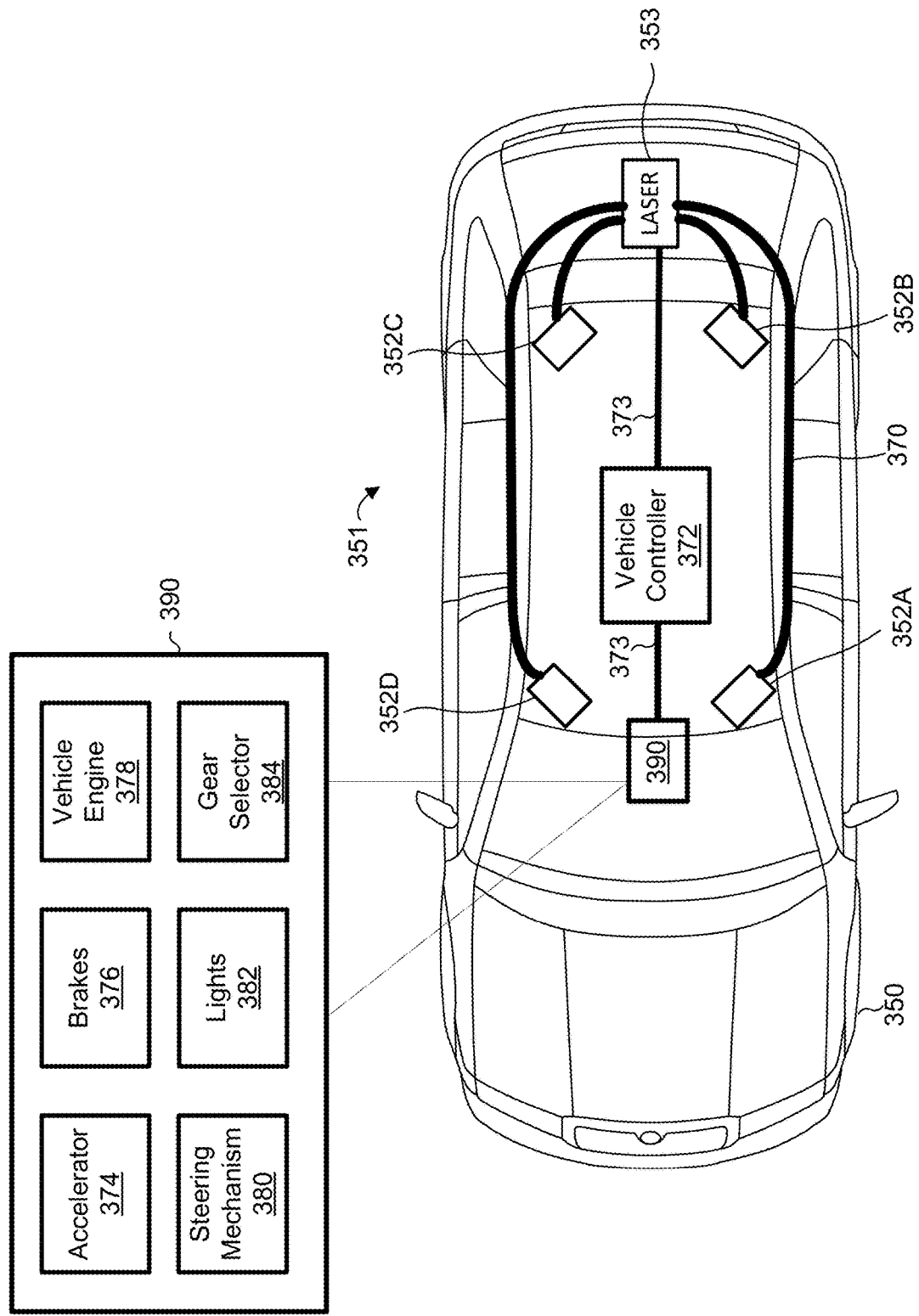
FIG. 32 illustrates an example vehicle in which one implementation of the lidar system of FIG. 26a or 26B can operate.

FIG. 32 illustrates an example vehicle 350 with a lidar system 351 that includes a laser 353 with multiple sensor heads 352 coupled to the laser 353 via multiple laser-sensor links 370. Each of the sensor heads 352 can be implemented similar to the lidar sensor unit 10.

Each of the laser-sensor links 370 may include one or more optical links and/or one or more electrical links. The sensor heads 352 in FIG. 32 are positioned or oriented to provide a greater than 30-degree view of an environment around the vehicle. More generally, a lidar system with multiple sensor heads may provide a horizontal field of regard around a vehicle of approximately 30°, 45°, 60°, 90°, 120°, 180°, 270°, or 360°. Each of the sensor heads 352 may be attached to or incorporated into a bumper, fender, grill, side panel, spoiler, roof, headlight assembly, taillight assembly, rear-view mirror assembly, hood, trunk, window, or any other suitable part of the vehicle.

In the example of FIG. 32, four sensor heads 352 are positioned at or near the four corners of the roof of the vehicle, and the laser 353 may be located within the vehicle (e.g., in or near the trunk). The four sensor heads 352 may each provide a 90° to 120° horizontal field of regard (FOR), and the four sensor heads 352 may be oriented so that together they provide a complete 360-degree view around the vehicle. As another example, the lidar system 351 may include six sensor heads 352 positioned on or around a vehicle, where each of the sensor heads 352 provides a 60° to 90° horizontal FOR. As another example, the lidar system 351 may include eight sensor heads 352, and each of the sensor heads 352 may provide a 45° to 60° horizontal FOR. As yet another example, the lidar system 351 may include six sensor heads 352, where each of the sensor heads 352 provides a 70° horizontal FOR with an overlap between adjacent FORs of approximately 10°. As another example, the lidar system 351 may include two sensor heads 352 which together provide a forward-facing horizontal FOR of greater than or equal to 300°.

Data from each of the sensor heads 352 may be combined or stitched together to generate a point cloud that covers a greater than or equal to 30-degree horizontal view around a vehicle. For example, the laser 353 may include a controller or processor that receives data from each of the sensor heads 352 (e.g., via a corresponding electrical link 370) and processes the received data to construct a point cloud covering a 360-degree horizontal view around a vehicle or to determine distances to one or more targets. The point cloud or information from the point cloud may be provided to a vehicle controller 372 via a corresponding electrical, optical, or radio link 370. In some implementations, the point cloud is generated by combining data from each of the multiple sensor heads 352 at a controller included within the laser 353 and provided to the vehicle controller 372. In other implementations, each of the sensor heads 352 includes a controller or process that constructs a point cloud for a portion of the 360-degree horizontal view around the vehicle and provides the respective point cloud to the vehicle controller 372. The vehicle controller 372 then combines or stitches together the points clouds from the respective sensor heads 352 to construct a combined point cloud covering a 360-degree horizontal view. Still further, the vehicle controller 372 in some implementations communicates with a remote server to process point cloud data.

In any event, the vehicle 350 may be an autonomous vehicle where the vehicle controller 372 provides control signals to various components 390 within the vehicle 350 to maneuver and otherwise control operation of the vehicle 350. The components 390 are depicted in an expanded view in FIG. 32 for ease of illustration only. The components 390 may include an accelerator 374, brakes 376, a vehicle engine 378, a steering mechanism 380, lights 382 such as brake lights, head lights, reverse lights, emergency lights, etc., a gear selector 384, and/or other suitable components that effectuate and control movement of the vehicle 350. The gear selector 384 may include the park, reverse, neutral, drive gears, etc. Each of the components 390 may include an interface via which the component receives commands from the vehicle controller 372 such as "increase speed," "decrease speed," "turn left 5 degrees," "activate left turn signal," etc. and, in some cases, provides feedback to the vehicle controller 372.

In some implementations, the vehicle controller 372 receives point cloud data from the sensor heads 352 via the link 373 and analyzes the received point cloud data to sense or identify targets 130 and their respective locations, distances, speeds, shapes, sizes, type of target (e.g., vehicle, human, tree, animal), etc. The vehicle controller 372 then provides control signals via the link 373 to the components 390 to control operation of the vehicle based on the analyzed information. For example, the vehicle controller 372 may identify an intersection based on the point cloud data and determine that the intersection is the appropriate location at which to make a left turn. Accordingly, the vehicle controller 372 may provide control signals to the steering mechanism 380, the accelerator 374, and brakes 376 for making a proper left turn. In another example, the vehicle controller 372 may identify a traffic light based on the point cloud data and determine that the vehicle 350 needs to come to a stop. As a result, the vehicle controller 372 may provide control signals to release the accelerator 374 and apply the brakes 376.

Figure 33:
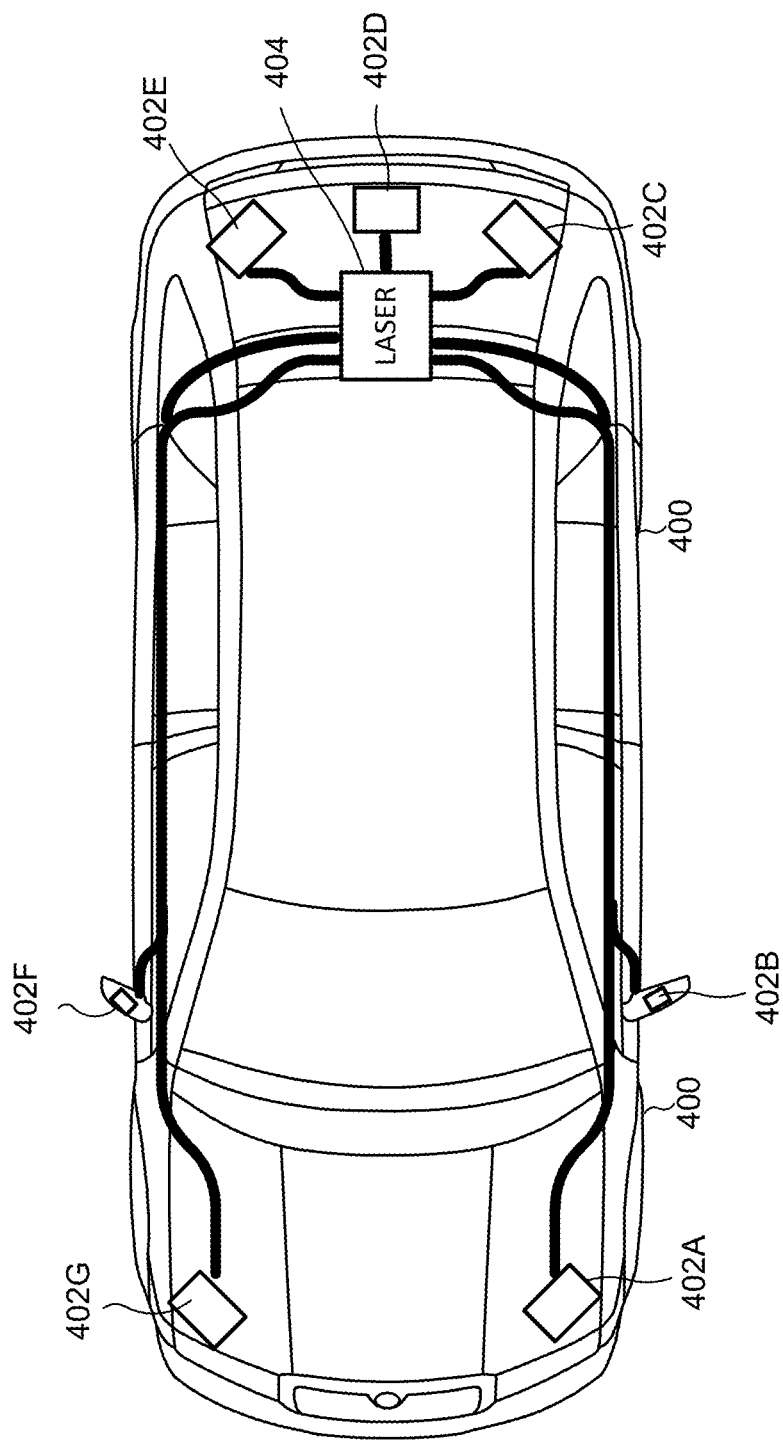
FIG. 33 illustrates an example vehicle in which another implementation of the lidar system of FIG. 26a or 26B can operate.

As another example, FIG. 33 illustrates a vehicle 400 in which a laser 404 is optically coupled to six sensor heads 402, each of which can be implemented as the lidar sensor unit 10. The sensor heads 402A and 402G are disposed at the front of the vehicle 400, the sensor heads 402B and 402F are disposed in the side view mirrors, and the sensor heads 402C-E are disposed on the trunk. In particular, the sensor head 402D is oriented to face backward relative to the orientation of the vehicle 400, and the sensor heads 402E and 402C are oriented at approximately 45 degrees relative to the axis of orientation of the sensor head 402D.

V. Manufacturing a Highly Balanced Polygon Mirror

The reflective surfaces 18-24 of the polygon mirror 12 may be manufactured using surface replication techniques. Coarse and fine balancing techniques, including (by way of example only) the use of drilling, milling, etching, and polishing, can be employed prior to mounting the polygon mirror 12 to a motor 32, and subsequent to mounting, high-energy laser pulses can be utilized to remove matter at precise locations on the polygon mirror 12. The coarse balancing techniques employed may include utilizing a shaft-balancing machine. Further, in forming the block 16, a hollowed-out substrate may be used to reduce the weight of the block.

Figure 34:
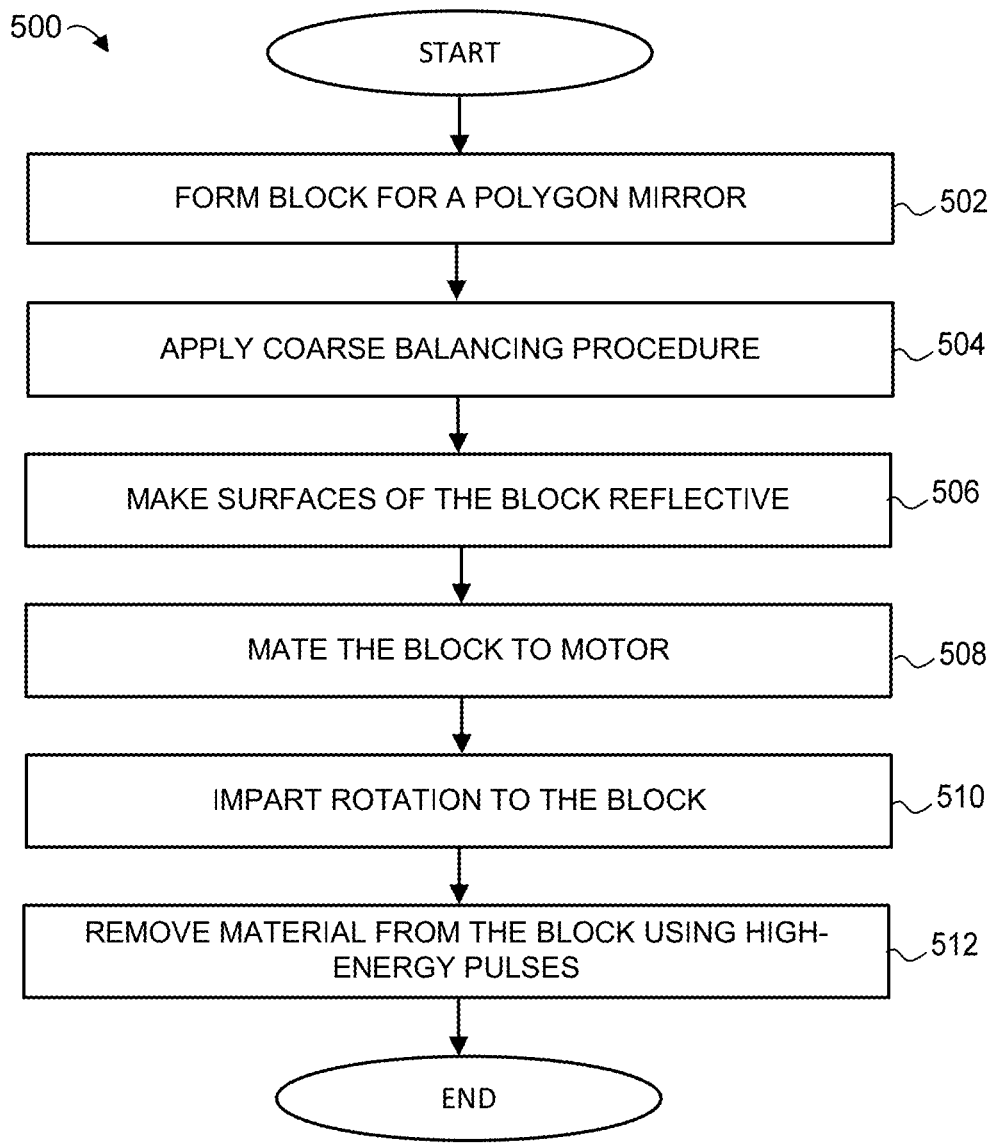
FIG. 34 is a flow diagram of an example method for manufacturing a highly balanced rotatable polygon mirror that can be used in the lidar sensor unit of FIG. 1.

More particularly, FIG. 34 depicts a flow diagram of an example method 500 for manufacturing a highly balanced rotatable polygon mirror that can be used as the polygon mirror 12 in the lidar sensor unit 10.

First, a block for a polygon mirror is formed (502). A glass substrate is used in an example implementation. In general, any suitable material such as a plastic, a polycarbonate, a composite material, metal, carbon fiber, or a ceramic can be used. It is also possible to use a metal frame with inserts of material susceptible to ablation by high-powered lasers. For example, a metal frame can contain glass or plastic cylinders at or near the corners of the block.

Next, a coarse balancing procedure is used (504) to obtain a relatively balanced block. The coarse balancing procedure can involve one or more of drilling, milling, etching, polishing, or any other suitable technique. Balancing machines available today from various manufacturers can be used during coarse balancing. However, many balancing machines, even small-part balancing machines, cannot provide precise balancing desirable in the lidar sensor unit 10. Small deviations in weight distribution can result in non-uniform angular velocity when the polygon mirror 12 rotates at a high rate, which in turn can result in distortion of scan lines (e.g., wrong distances between adjacent pixels).

Further, one or more surfaces of the block formed at block 502 can be made reflective (506). Referring to FIGS. 10-12, for example, all four surfaces of the polygon mirror block 12 can be made reflective, but in other implementations of the scanner only one of the surfaces can be made reflective, or two non-adjacent surfaces can be made reflective. In one implementation of the method 500, the one or more surfaces of the block are made reflective using surface replication, e.g., by creating a thin reflective film and applying the film to the surfaces of the block. Surface replication can be applied to two opposite sides of the block at the same time to accelerate the process of manufacturing a highly balanced mirror. Other coating (e.g., sputtering) and non-coating techniques also can be used to make the surfaces reflective, preferably those techniques that reduce the probability of damaging the reflective surfaces during the fine balancing procedure. In some implementations, the order of execution of procedures 504 and 506 can be reversed (i.e., coarse balancing can occur before making the surfaces reflective or after making the surfaces reflective).

Once the block acquires one or more reflective surfaces and is approximately balanced, the block is mated to a motor (508). To reduce the probability of subsequently damaging a precisely balanced block, the block is mated to the motor in the corresponding assembly of the lidar sensor unit 10. As a more specific example, the polygon mirror axle 30 is inserted through or attached to a coarsely balanced polygon mirror 12, and the coarsely balanced polygon mirror 12 is installed on the bracket 29 and mated to the motor 32 (see FIGS. 1 and 2). After the polygon mirror 12 is precisely balanced as discussed below, the assembly including the components 12, 29, 30, and 32 is used in the lidar sensor unit 10 as a single unit, i.e., is not disassembled into the individual components.

To balance the block more precisely, rotation is imparted to the block (510) and material is removed from the block using high-energy laser pulses or a continuous laser beam (512). The removal of the material can be optimized by selecting a laser having an appropriate operating wavelength based on the material from which the block is made. For example, a laser operating in the ultraviolet wavelength range (e.g., an excimer laser) may be used to ablate material from a block made of glass or plastic. As another example, a laser operating in the infrared wavelength range (e.g., a neodymium-doped yttrium-aluminum-garnet (Nd:YAG) laser operating at a wavelength of approximately 1.06 μm or a $CO_2$ laser operating at 9.4-10.6 μm) may be used to ablate material from a block made of metal. To continue with the example above, the motor 32 can impart rotation to the polygon mirror 12, and a high-power laser can aim at the wall 26 (best illustrated in FIGS. 2 and 3). The laser can be aimed at the regions close to the corners, where the impact on angular velocity due to torque is the greatest, due to the vertical orientation of the polygon mirror 12. In some implementations, material may be removed from the axle or shaft attached to the polygon mirror 12 and about which the polygon mirror 12 rotates.

As the block rotates and ablation is carried out, the changes in balancing can be monitored by, for example, determining rotational speed of the block and determining the differences between the speed of individual facets. To this end, a stationary photo-interrupter can be used, with tabs corresponding to each facet provided on the axis of rotation of the block (or on the block itself). As the tabs pass through the stationary photo-interrupter, the rate each facet is traveling can be measured. Thus, if for a block with four facets, the time between the first tab and the second tab traveling past the photo-interrupter is t, the time between the second tab and the third tab traveling past the photo-interrupter is t+e, the time between the third tab and the fourth tab traveling past the photo-interrupter is t+e', and the time between the third tab and the fourth tab traveling past the photo-interrupter is t+e''. Ablation can be applied to the block so as to make these measurements as close to each other as practically possible. After the procedure of rotation and material removal (510, 512) is completed, the time between each pair of adjacent tab traveling past the photo-interrupter is as close to t as possible. A controller, a workstation, or any suitable computing device can be used to control the high-powered laser used in ablation in view of the data from the photo-interrupter. The controller also can determine the changes in time between pairs of adjacent tabs traveling past the photo-interrupter and generate an appropriate notification for the operator to indicate when the process is complete, or automatically complete the method 500, depending on the implementation.

In another implementation, a light source (not necessarily a laser) can be used to direct a light at the block, with a temporary detector being in a fixed position relative to the block, so as to determine the rate at which each facet is moving. The light source can direct a beam of light at the block, which reflects the beam of light along a scan line. The temporary detector can be placed at a point on the scan line, in the path of the beam of light. The controller can measure the times at which the temporary detector detects the beam of light and derive the appropriate measurements of t+e, t+e', etc., similar to the example above. Similar to the example above, the controller then can automatically shut down the laser emitting high-energy pulses and/or provide a notification to the operator.

In yet another implementation, a balancing machine can be used along with a high-energy laser for the fine-balancing process.

In some implementations, all or part of a method for manufacturing a highly balanced rotatable polygon mirror as described herein may be applied to any suitable rotating object. For example, material removal by a laser source to form a high-balanced rotatable object may be applied to a high-speed motor, dental drill, or hard disk drive.

VI. Scan Patterns and Scan Pattern Modifications in a Lidar Sensor Unit

Figure 35:
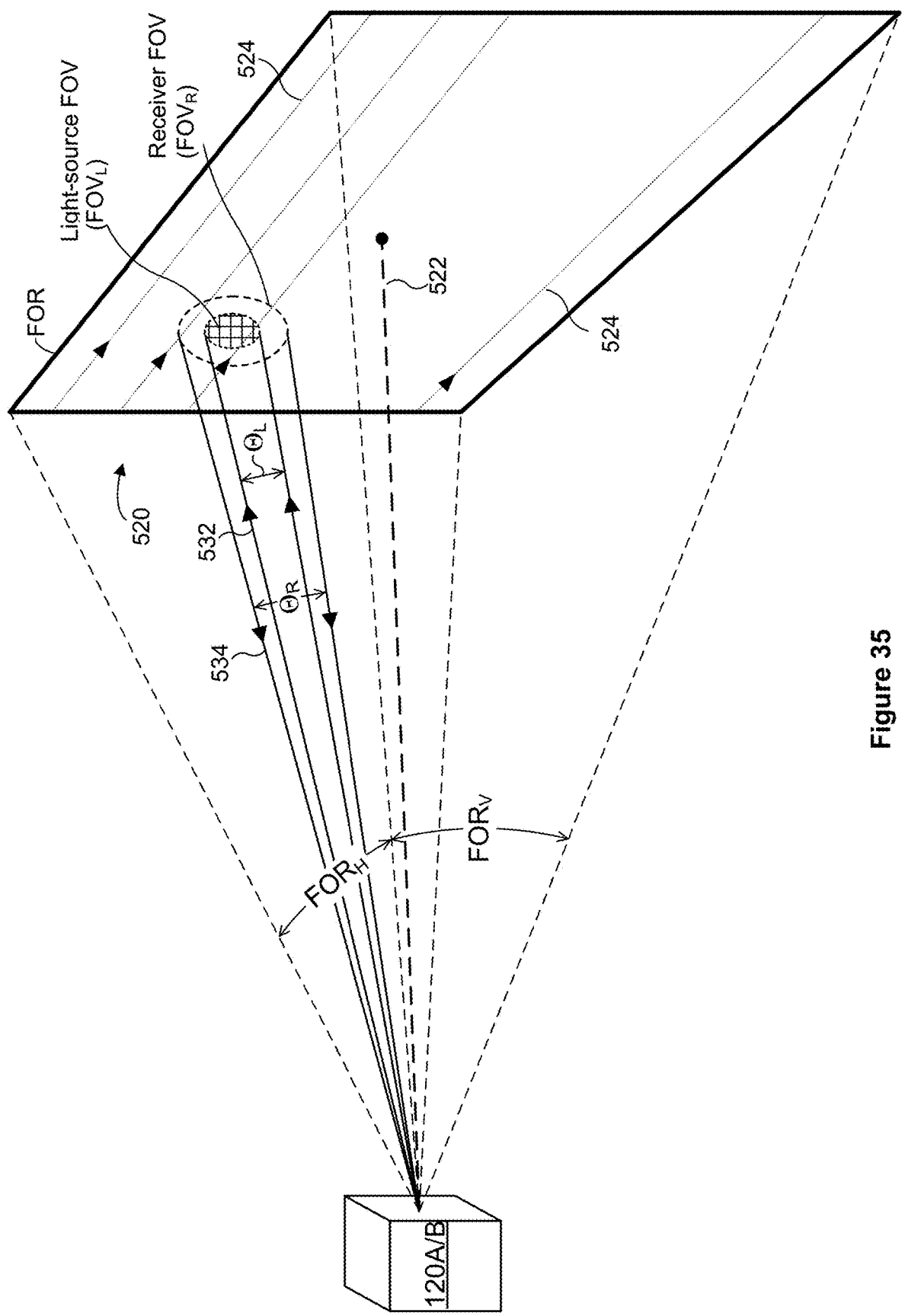
FIG. 35 schematically illustrates fields of view (FOVs) of a light source and a detector that can operate in the lidar sensor unit of FIG. 1.

FIG. 35 illustrates an example light-source field of view ($FOV_L$) and receiver field of view ($FOV_R$) for the lidar sensor unit 10 and/or the lidar system 120A or 120B, as well as a scan pattern 520 which the lidar sensor unit 10 and/or the lidar system 120 can produce.

The scan pattern 520 corresponds to a scan across any suitable field of regard (FOR) having any suitable horizontal FOR ($FOR_H$) and any suitable vertical FOR ($FOR_V$). For example, a certain scan pattern may have a field of regard represented by angular dimensions (e.g., $FOR_H \times FOR_V$) 40°×30°, 90°×40°, or 60°×15°. As another example, a certain scan pattern may have a $FOR_H$ greater than or equal to 10°, 25°, 30°, 40°, 60°, 90°, or 120°. As yet another example, a certain scan pattern may have a $FOR_V$ greater than or equal to 2°, 5°, 10°, 15°, 20°, 30°, or 45°. In the example of FIG. 35, a reference line 522 represents a center of the field of regard of the scan pattern 520. The reference line 522 may have any suitable orientation, such as, a horizontal angle of 0° (e.g., reference line 522 may be oriented straight ahead) and a vertical angle of 0° (e.g., reference line 522 may have an inclination of 0°), or the reference line 522 may have a nonzero horizontal angle or a nonzero inclination (e.g., a vertical angle of +10° or −10°). In FIG. 35, if the scan pattern 520 has a 60×15° field of regard, then the scan pattern 520 covers a ±30° horizontal range with respect to reference line 522 and a ±7.5° vertical range with respect to reference line 522. Additionally, an optical beam 532 in FIG. 35 has an orientation of approximately −15° horizontal and +3° vertical with respect to reference line 522. The beam 532 may be referred to as having an azimuth of −15° and an altitude of +3° relative to the reference line 246. An azimuth (which may be referred to as an azimuth angle) may represent a horizontal angle with respect to the reference line 522, and an altitude (which may be referred to as an altitude angle, elevation, or elevation angle) may represent a vertical angle with respect to the reference line 522.

The scan pattern 520 may include multiple pixels along scan lines 524, each pixel corresponding to instantaneous light-source $FOV_L$. Each pixel may be associated with one or more laser pulses and one or more corresponding distance measurements. A cycle of the scan pattern 520 may include a total of $P_x \times P_y$ pixels (e.g., a two-dimensional distribution of $P_x$ by $P_y$ pixels). For example, the scan pattern 520 may include a distribution with dimensions of approximately 100-2,000 pixels along a horizontal direction and approximately 4-200 pixels along a vertical direction. As another example, the scan pattern 520 may include a distribution of 1,000 pixels along the horizontal direction by 64 pixels along the vertical direction (e.g., the frame size is 1000×64 pixels) for a total of 64,000 pixels per cycle of scan pattern 520. The number of pixels along a horizontal direction may be referred to as a horizontal resolution of the scan pattern 520, and the number of pixels along a vertical direction may be referred to as a vertical resolution of the scan pattern 520. As an example, the scan pattern 520 may have a horizontal resolution of greater than or equal to 100 pixels and a vertical resolution of greater than or equal to 4 pixels. As another example, the scan pattern 520 may have a horizontal resolution of 100-2,000 pixels and a vertical resolution of 4-400 pixels.

Each pixel may be associated with a distance (e.g., a distance to a portion of a target 160 from which the corresponding laser pulse was scattered) or one or more angular values. As an example, the pixel may be associated with a distance value and two angular values (e.g., an azimuth and altitude) that represent the angular location of the pixel with respect to the lidar system 120A or 120B. A distance to a portion of the target 160 may be determined based at least in part on a time-of-flight measurement for a corresponding pulse. An angular value (e.g., an azimuth or altitude) may correspond to an angle (e.g., relative to reference line 522) of the output beam 532 (e.g., when a corresponding pulse is emitted from the lidar sensor unit 10 or the lidar system 120) or an angle of the input beam 534 (e.g., when an input signal is received by the lidar sensor unit 10 or the lidar system 120A or 120B). In some implementations, the lidar sensor unit 10 or the lidar system 120A or 120B determines an angular value based at least in part on a position of a component of the scanner 11. For example, an azimuth or altitude value associated with the pixel may be determined from an angular position of one or more corresponding scanning mirrors of the scanner 11.

The light source 122A or 122B may emit pulses of light as the $FOV_L$ and $FOV_R$ are scanned by the scanner 11 across the FOR. The light-source field of view may refer to an angular cone illuminated by the light source 122A or 122B at a particular instant of time or an angular cone that would be illuminated by the light source 122A or 122B at a particular instant of time if the light source 122A or 122B were to emit light at that instant of time. For example, when the light source 122A or 122B operates in a pulsed mode, the light source 122A or 122B may continuously change its orientation relative to the external world but actively illuminate corresponding regions only during the duty cycle.

Similarly, a receiver field of view may refer to an angular cone over which the receiver 128A or 128B may receive or detect light at a particular instant of time, and any light outside the receiver field of view may not be received or detected. For example, as the scanner 11 scans the light-source field of view across a field of regard, the lidar sensor unit 10 or the lidar system 120A or 120B may send the pulse of light in the direction the $FOV_L$ is pointing at the time the light source 122A or 122B emits the pulse. The pulse of light may scatter off the target 160, and the receiver 128A or 128B may receive and detect a portion of the scattered light that is directed along or contained within the $FOV_R$.

An instantaneous FOV may refer to an angular cone being illuminated by a pulse directed along the direction the light-source FOV is pointing at the instant the pulse of light is emitted. Thus, while the light-source FOV and the detector FOV are scanned together in a synchronous manner (e.g., the scanner 11 scans both the light-source FOV and the detector FOV across the field of regard along the same scan direction and at the same scan speed, maintaining the same relative position to each other), the instantaneous FOV remains "stationary," and the detector FOV effectively moves relative to the instantaneous FOV. More particularly, when a pulse of light is emitted, the scanner 11 directs the pulse along the direction in which the light-source FOV currently is pointing. Each instantaneous FOV (IFOV) corresponds to a pixel. Thus, each time a pulse is emitted, the lidar sensor unit 10 or the lidar system 120A or 120B produces or defines an IFOV (or pixel) that is fixed in place and corresponds to the light-source FOV at the time when the pulse is emitted. During operation of the scanner 11, the detector FOV moves relative to the light-source IFOV but does not move relative to the light-source FOV.

In some implementations, the scanner 11 is configured to scan both a light-source field of view and a receiver field of view across a field of regard of the lidar system 120A or 120B. The lidar system 120A or 120B may emit and detect multiple pulses of light as the scanner 11 scans the $FOV_L$ and $FOV_R$ across the field of regard while tracing out the scan pattern 520. The scanner 11 in some implementations scans the light-source field of view and the receiver field of view synchronously with respect to one another. In this case, as the scanner 11 scans $FOV_L$ across a scan pattern 520, the $FOV_R$ follows substantially the same path at the same scanning speed. Additionally, the $FOV_L$ and $FOV_R$ may maintain the same relative position to one another as the scanner 11 scans $FOV_L$ and $FOV_R$ across the field of regard. For example, the $FOV_L$ may be substantially overlapped with or centered inside the $FOV_R$, and the scanner 11 may maintain this relative positioning between $FOV_L$ and $FOV_R$ throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction). As yet another example, during a time between the instant when a pulse is emitted and prior to the time when the pulse can return from a target located at the maximum distance $R_{MAX}$, $FOV_R$ may move relative to the IFOV or pixel to define different amounts of overlap, as discussed in more detail below.

The $FOV_L$ may have an angular size or extent $\Theta_L$ that is substantially the same as or that corresponds to the divergence of the output beam 532, and the $FOV_R$ may have an angular size or extent $\Theta_R$ that corresponds to an angle over which the receiver 128 may receive and detect light. The receiver field of view may be any suitable size relative to the light-source field of view. For example, the receiver field of view may be smaller than, substantially the same size as, or larger than the angular extent of the light-source field of view. In some implementations, the light-source field of view has an angular extent of less than or equal to 50 milliradians, and the receiver field of view has an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. The light-source field of view and the receiver field of view may have approximately equal angular extents. As an example, $\Theta_L$ and $\Theta_R$ may both be approximately equal to 1 mrad, 2 mrad, or 3 mrad. In some implementations, the receiver field of view is larger than the light-source field of view, or the light-source field of view is larger than the receiver field of view. For example, $\Theta_L$ may be approximately equal to 1.5 mrad, and $\Theta_R$ may be approximately equal to 3 mrad. As another example, $\Theta_R$ may be approximately L times larger than $\Theta_L$, where L is any suitable factor, such as for example, 1.1, 1.2, 1.5, 2, 3, 5, or 10.

As indicated above, a pixel may represent or correspond to an instantaneous light-source FOV. As the output beam 532 propagates from the light source 122A or 122B, the diameter of the output beam 532 (as well as the size of the corresponding pixel) may increase according to the beam divergence $\Theta_L$. As an example, if the output beam 532 has a $\Theta_L$ of 2 mrad, then at a distance of 100 m from the lidar system 120A or 120B, the output beam 532 may have a size or diameter of approximately 20 cm, and a corresponding pixel may also have a corresponding size or diameter of approximately 20 cm. At a distance of 200 m from the lidar system 120, the output beam 532 and the corresponding pixel may each have a diameter of approximately 40 cm.

The scanner 11 may be configured to scan the output beam 532 over a 5-degree angular range, 20-degree angular range, 30-degree angular range, 60-degree angular range, or any other suitable angular range. The FOR of the lidar system 120A or 120B may refer to an area, region, or angular range over which the lidar system 120A or 120B may be configured to scan or capture distance information. When the lidar system 120 scans the output beam 532 within a 30-degree scanning range, the lidar system 120A or 120B may be referred to as having a 30-degree angular field of regard. In various implementations, the lidar system 120A or 120B may have a FOR of approximately 10°, 20°, 40°, 60°, 120°, or any other suitable FOR. The FOR also may be referred to as a scan region.

The scanner 11 is configured to scan the output beam 532 horizontally, with each reflective surface of the polygon mirror 12 defining a respective scan line 524, and vertically, where the oscillation of the planar mirror 14 moves the scan lines 524 upward or downward. The lidar system 120 may have a particular FOR along the horizontal direction and another particular FOR along the vertical direction. For example, the lidar system 120 may have a horizontal FOR of 10° to 120° and a vertical FOR of 2° to 450°.

Referring back to FIGS. 1 and 26A/26B, the controller 130 in one implementation generates and dynamically modifies the drive signal for the motor 64 which oscillates the planar mirror 14. The motor 32 driving rotation of the polygon mirror 12 may operate in an open-loop mode, without relying on control signals from the controller 130. In this implementation, the motor 32 driving the polygon mirror 12 may rotate at a constant speed to generate similar scan lines, while variations in the speed at which the planar mirror 14 moves relative to the axis of oscillation can result in some scan lines being farther apart, some scan lines being closer together, etc. Further, the controller 130 can modify the drive signal for the motor 64 to reposition the entire operational FOR of the lidar sensor unit 10 within the larger range motion available to the planar mirror 14. Still further, the controller 130 can modify the drive signal for the motor 64 to "stretch" the FOR of the operational FOR of the lidar sensor unit 10 so as to encompass the entire available FOR. In some implementations, the motor 32 driving rotation of the polygon mirror 12 may operate in a closed-loop mode, where the motor 32 receives a control signal that regulates, stabilizes, or adjusts the rotational speed of the polygon mirror 12. For example, the polygon mirror 12 may be provided with a tab that passes through one or more stationary photo-interrupters as the polygon mirror 12 rotates. The signals from the photo-interrupters may be sent to the controller 130, and the controller 130 may provide a control signal to the motor 32 to maintain the rotation speed of the polygon mirror 12 at a substantially constant value.

In other implementations, however, the controller 130 modifies the drive signal supplied to the motor 32 to thereby adjust the rotation of the polygon mirror 12. For example, the controller 130 may slow down the rotation of the polygon mirror 12 when the output beam (or a pair of output beams associated with the same eye) traverses the middle of the scan line, so that pixel density near the center of the $FOR_H$ is higher than at the periphery of the $FOR_H$.

The controller may modify the drive signal for the motor 32 and/or the drive signal for the motor 64 dynamically in response to various triggering events. In addition to detection of an upward or downward slope, as discussed in more detail below, examples of suitable triggering events include detection of a particular object in a certain direction relative to the vehicle (e.g., if an object is moving quickly across the path of the vehicle, the lidar system 120A and 120B may modify the scan pattern to obtain a higher density rate where the object is detected to be able to better respond to the potential threat of collision), a sound detected at in a certain direction relative to the vehicle, a heat signature detected at in a certain direction relative to the vehicle, etc.

Figure 36:
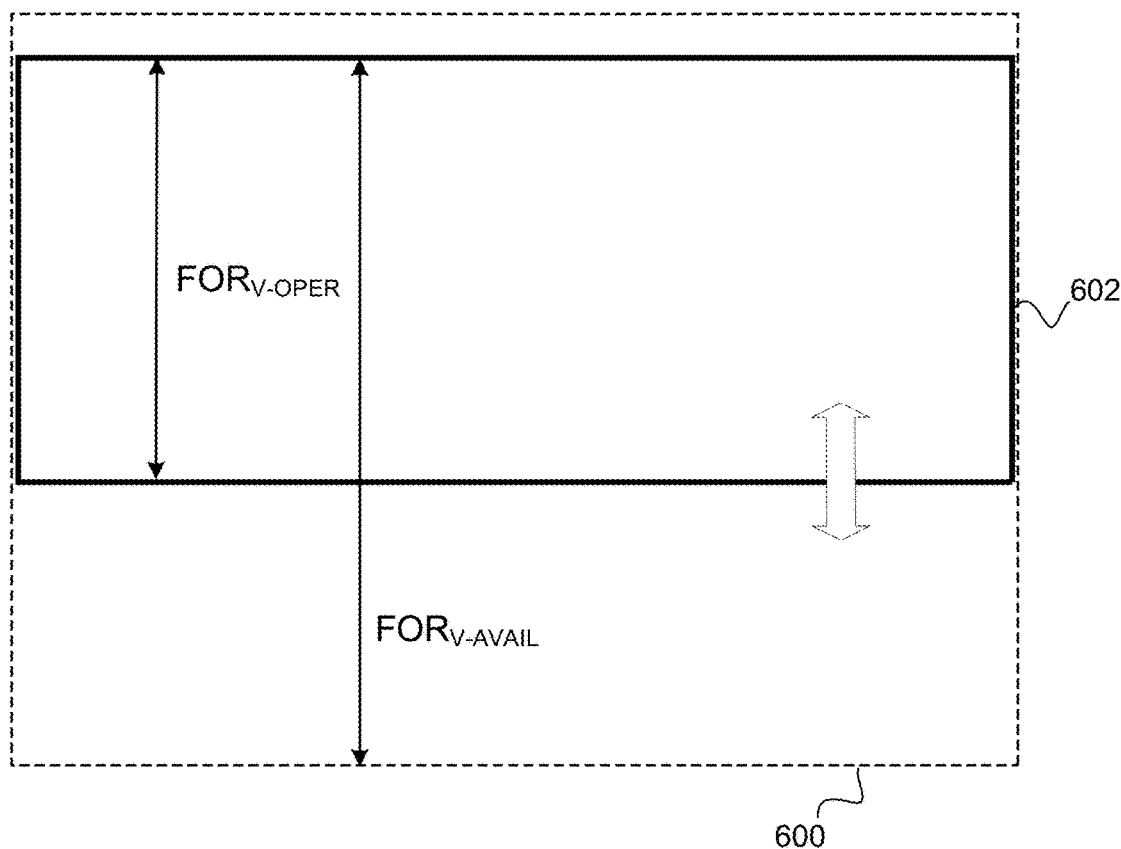
FIG. 36 schematically illustrates the operational vertical field of regard $FOR_V$ of the lidar sensor unit of FIG. 1 relative to the available $FOR_{V\text{-}AVAIL}$ of the lidar sensor unit, within which the operational $FOR_V$ can be adjusted.

FIG. 36 depicts an example range 600 within which the lidar system 120 can set the operational FOR 602. In the lidar system 120A or 120B, the range of motion for the planar mirror 14 can define a vertical dimension of the available $FOR_{V\text{-}AVAIL}$ (e.g., 90°, 100°, 110°, 120°) that exceeds the vertical dimension of the operational $FOR_{V\text{-}OPER}$ (e.g., 60°). The controller 130 can adjust the drive signal for the motor 64 so as to move the FOR 602 upward or downward relative to the center of the available FOR 600.

In some implementations or scenarios, the controller 130 adjusts the drive signal for the motor 64 so that the $FOR_{V\text{-}OPER}$ "stretches" out to cover a larger portion of the $FOR_{V\text{-}AVAIL}$. For example, the controller 130 may cause the $FOR_{V\text{-}OPER}$ to temporarily change from 60°×30° to 60°×40° or 60°×30° to 60°×50°. The controller may modify the drive signal for the motor 64 without modifying the operation of the motor 32 driving the polygon mirror and, as a result, the modification of the $FOR_{V\text{-}OPER}$ from 60°×30° to 60°×40° results in changes in distances between at least some of the scan lines. The controller 130 may cause these changes to be uniform or non-uniform (e.g., separate the scan lines near the edges of the $FOR_V$ by a larger amount).

Figure 37:
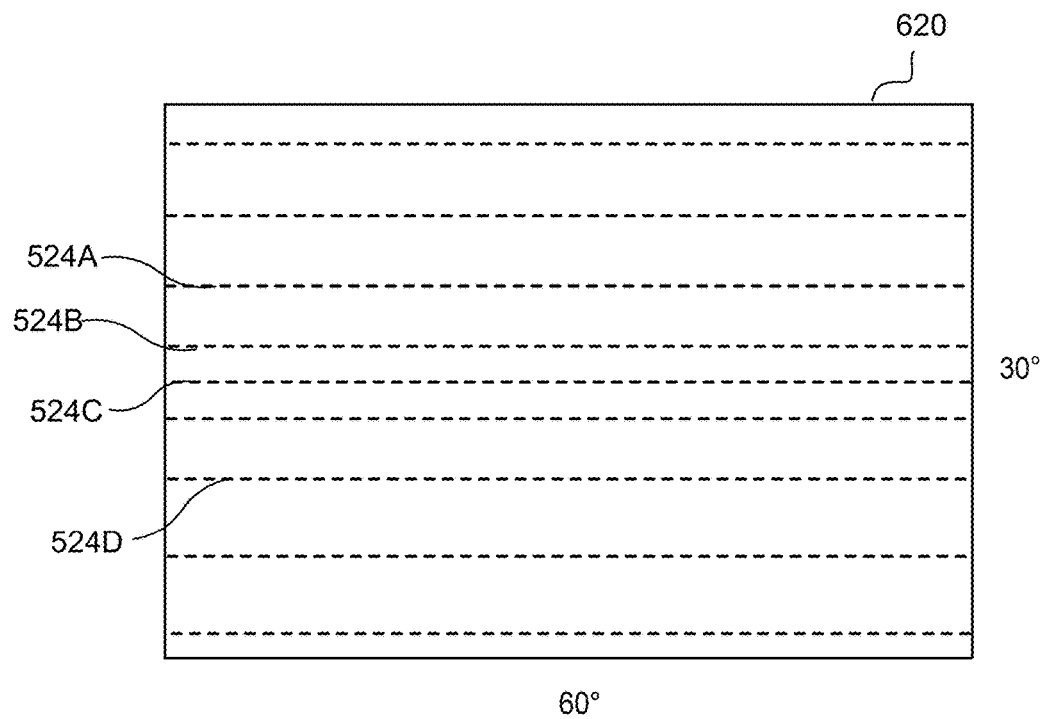
FIG. 37 schematically illustrates non-equal distribution of scan lines within a vertical field of regard $FOR_V$ of the lidar sensor unit of FIG. 1, in a certain operational mode of the lidar sensor unit.

Further, the lidar system 120A or 120B can modify the drive signal for the motor 64 to adjust distances between scan lines. As illustrated in FIG. 37, the distance between the scan lines 524A and 524B is greater than the distance between the scan lines 524B and 524C in the example FOR 620. The controller 130 generates a drive signal such that the planar mirror 14 slows down near the middle of the $FOR_V$, and speeds up near the fringes of the $FOR_V$. The lidar system 120A and 120B can adjust this distance temporarily in view of certain triggering conditions, in some implementations.

The controller 130 can be configured to modify the one or both drive signals for the motors 32, 64 on a frame-by-frame basis, with each frame corresponding to a complete scan of the field of regard of the lidar system 120A or 120B. In other implementations or scenarios, the controller 130 modifies the scan pattern for a certain pre-configured time interval (e.g., 10 milliseconds, 100 milliseconds, one second, two seconds, four seconds). In yet other implementations or scenarios, the controller 130 modifies the scan pattern in response to a triggering event and restores the default configuration in response to another triggering event.

Figure 38:
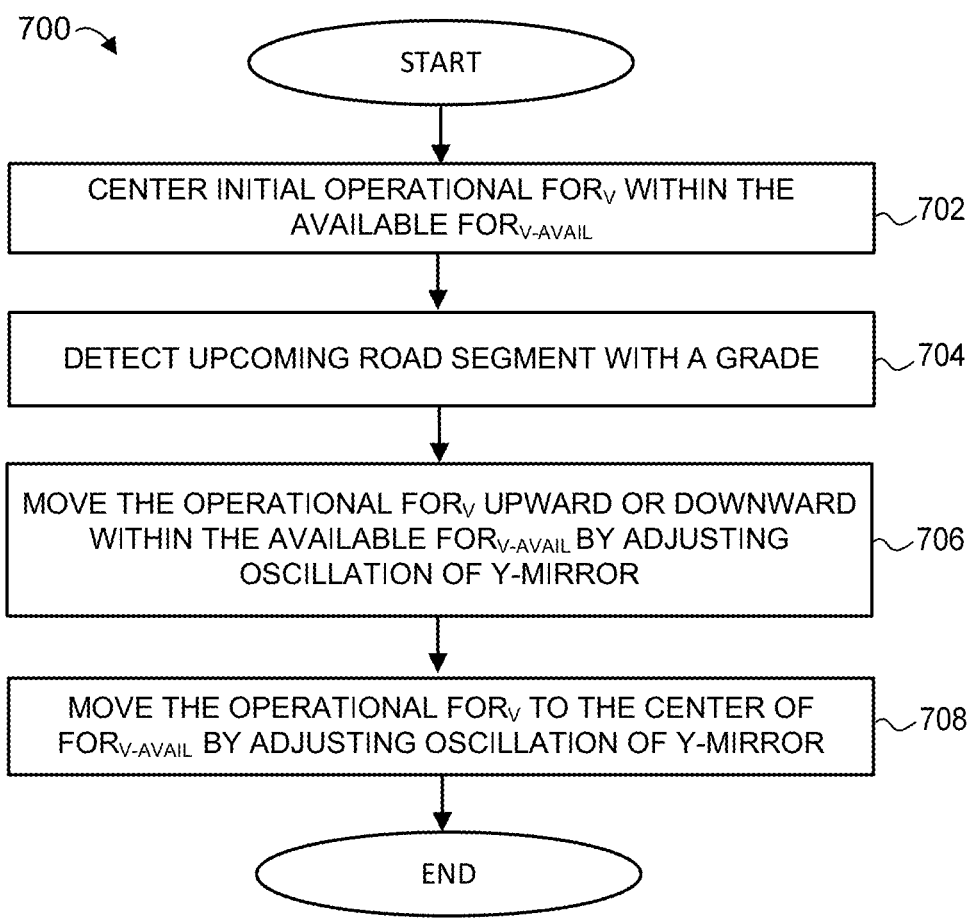
FIG. 38 is a flow diagram of an example method for repositioning the vertical field of regard $FOR_V$ within the available $FOR_{V\text{-}AVAIL}$ by adjusting the oscillation of the planar mirror of the lidar sensor unit of FIG. 1.

FIG. 38 is a flow diagram of an example method 700 for modifying the FOR. The method 38 can be implemented in the controller 130, for example, as a set of instructions. The method 700 begins at block 702, where the initial operational FOR for the scanner is selected. The centerline of the $FOR_{V\text{-}OPER}$ initially can coincide with the centerline of the $FOR_{V\text{-}AVAIL}$. Referring back to FIGS. 1-20, the planar mirror 14 at block 702 oscillates near the middle of its available range of motion.

Figures 39A, 39B:
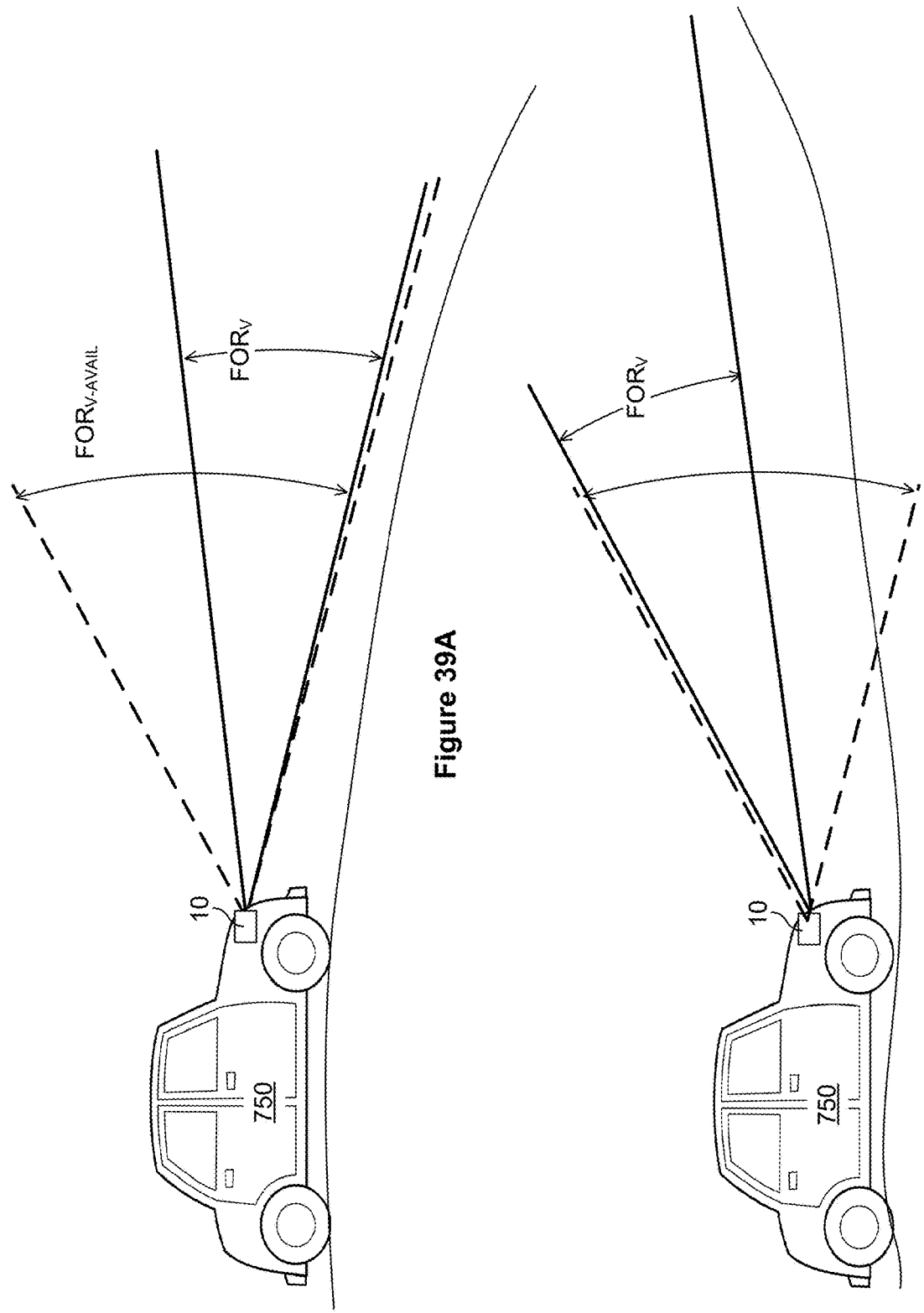
FIGS. 39A and 39B schematically illustrate adjusting the vertical field of regard $FOR_V$ based on detected changes in the grade of the road, which can be implemented in the lidar sensor unit of FIG. 1.

At block 704, an upcoming road segment with a grade is detected. Referring to FIG. 39A, for example, a vehicle 750 can detect a downward slope using the lidar sensor unit 10 and/or other sensors. In the scenario illustrated in FIG. 39B, on the other hand, the vehicle detects an upward slope. At block 706, the operational FOV is moved upward or downward. The lidar sensor unit 10 accordingly moves $FOR_{V\text{-}OPER}$ downward or upward, respectively, to better "see" along the surface of the road. To this end, the controller 130 can adjust the drive signal for the motor 64. At block 708, the default position of the $FOR_{V\text{-}OPER}$ within the $FOR_{V\text{-}AVAIL}$ is restored when the vehicle 750 detects that the road again is level. The controller 130 again can provide the corresponding drive signals to the motor 64.

VII. Generating Pixels with Non-Integer Separation in a Lidar Sensor Unit

The lidar sensor unit 10 in a two-eye configuration directs output beams on two reflective surfaces of the polygon mirror 12. Moreover, the lidar sensor unit 10 can angularly separate each of the output beams into two output beams (see FIG. 25). The two output beams of the same eye may have different wavelengths. The lidar sensor unit 10 can use the two output beams to scan different pixels in a same scan line during a single ranging event. The pixels can have non-integer separation such as 5.5 pixels or 9.5 pixels, for example. Further, the two eyes of the sensor unit 10 can define an overlap region in which the interleave between pixels and/or lines does not correspond to an integer value. Measured angularly, the width of the overlap region may have any suitable value such as 1, 2, 5, 10, 20, 30, or 40 degrees. The width of the overlap region may be determined, at least in part, by the angle of incidence at which the two output beams which are directed onto the two reflective surfaces of the polygon mirror 12. Interleaving pixels and interleaving scan lines in this manner can be implemented separately or together in a lidar system.

Figure 40:
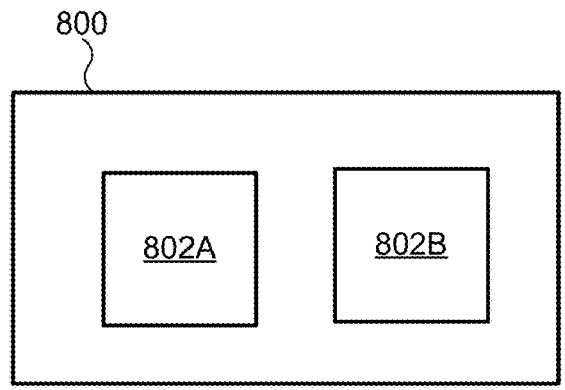
FIG. 40 is a diagram of an example detector array with two detectors configured to detect return pulses associated with different respective output beams, which can be implemented in the lidar system of FIG. 26A or 26B.

To detect two pulses within a ranging event for the same eye, the lidar sensor unit 10 can include two detectors for each optical path. FIG. 40 is a diagram of a detector array 800 which includes two detector sites 802A, 802B, which can be used in the lidar system 120A or 120B, for example, or another suitable lidar system. Each of the detector sites 802A and 802B may include a single detector or a cluster of individual detectors (APDs, SPADs, etc.) to mitigate potential registration, tolerance, and capacitance issues. The two detector sites 802A and 802B may be offset from one another along a direction corresponding to the scanning direction of the light source. The lidar system 120A or 120B may use the detector site 802A to scan even pixels and the detector site 802B to scan odd pixels. For convenience, detector sites such as the sites 802A and 802B are referred to herein simply as detectors.

In one implementation, a DOE or a free-space splitter disposed in the path of an output beam may separate pulses by any suitable angle Θ, such as for example, 1 mrad, 2 mrad, 5 mrad, 10 mrad, 20 mrad, or 50 mrad. As an example, the splitter may split an emitted pulse into two pulses of angularly separated light (e.g., a first pulse and a second pulse). In another implementation, a pair of collimators may be used to produce any suitable angle Θ between two pulses. As an example, an emitted pulse may be split into two pulses by a fiber-optic splitter, and two collimators (e.g., collimators 92A and 94A in FIG. 23) may be arranged to produce an angle of approximately 20 mrad between the two pulses. The scanner 11 may scan these pulses of light along a scanning direction across pixels located downrange from the lidar system 120A or 120B. The detectors 802A and 802B in this implementation may be separated by a detector-separation distance along a direction corresponding to the scanning direction of the light pulses. The detector 802A may be configured to detect scattered light from the first pulse of light, and the detector 802B may be configured to detect scattered light from the second pulse of light. The controller 130 is configured to determine one or more distances to one or more targets based at least in part on a time of flight of the first pulse of light or a time of flight of the second pulse of light. A respective splitter, DOE, or pair of collimators can be used with each of the two eyes of the lidar sensor unit 10.

Figure 41:
FIG. 41 illustrates an example forward scan of a pair of spaced-apart pixels based on the detector array of FIG. 40.

Referring to FIG. 41, the output beams can be aimed so that the detector FOV 812A of the detector 802A and the detector FOV 812B of the detector 802B initially have little or no overlap (e.g., less than 10% overlap) with the corresponding instantaneous light-source FOVs, or pixel #i or #j. The scanner 11 can be configured so that after the round-trip time corresponding to the maximum range of the lidar system 120A or 120B has elapsed, the detector FOV 812A has moved so as to coincide with pixel #i, and the detector FOV 812B has moved so as to coincide with pixel #j. In other words, when a scattered pulse of light returns from a target at maximum operational distance of the lidar system 120, e.g., $R_{MAX}$, the instantaneous light-source FOV is located in the detector FOV 812A or 812B. If a light pulse returns from a location beyond the maximum range $R_{MAX}$ (if the target is highly cooperative, for example), the detector 802A and 802B generates a weaker signal, which the lidar system 120 can ignore, because the FOV 812A or 812B overlaps pixel #i or #j only partially.

In one implementation, pulses of light in each output beam are angularly separated so as to scan two lines in parallel. Thus, a pulse of light P can be split into pulse P' and P" to generate pixels in scan lines $L_i$ and $L_{i+1}$, so that the planar mirror then can be repositioned to scan lines $L_{i+2}$ and $L_{i+3}$ in the next instance. In another implementation, pulses of light in each output beam are angularly and/or spatially separated and directed toward different sections of a same scan line, so as to produce two pixels within the time of a single ranging event. The two beams in this implementation can be separated by a non-integer number of pixels (e.g., 3.5, 5.5, 7.5, 10.5) so as improve the resulting pixel quality. More particularly, for a pair of adjacent pixels generated using one beam, another pixel centered at the midpoint between the pair of pixels can be generated using the other beam, and the two adjacent pixels can be corrected as necessary using the midpoint pixel.

Figure 42:
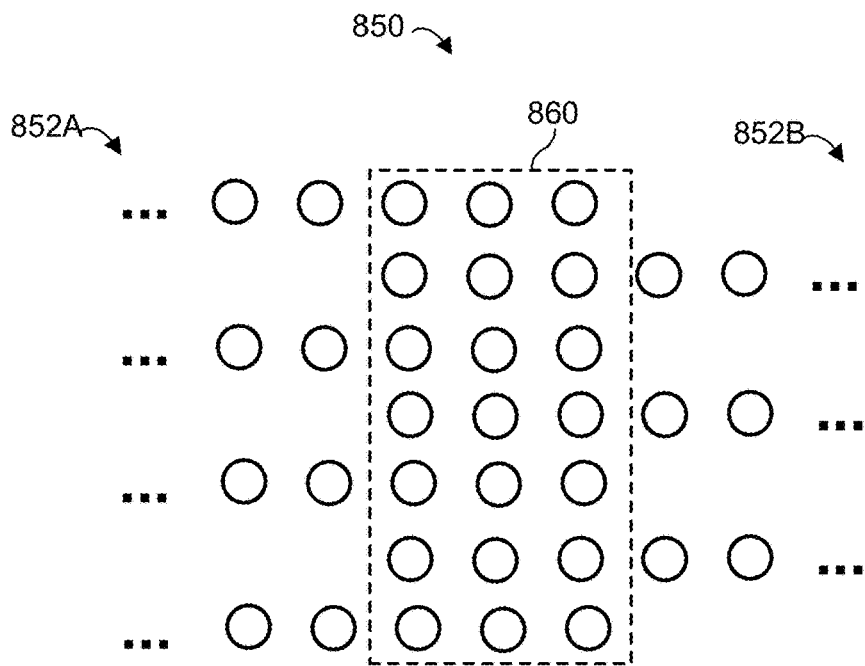
FIG. 42 illustrates an example interleave of scan lines in an overlap region, which the lidar system of FIG. 26A or 26B can generate.

FIG. 42 illustrates an example combined scan pattern 850 according to which the lidar system 120 can scan the combined FOR of the lidar sensor unit 10. The combined scan pattern 850 includes a scan pattern 852A of the first eye of the lidar sensor unit 10 and a scan pattern 852B of the second eye of the lidar sensor unit 10. Referring back to FIG. 26B, the scan pattern 852A can correspond to the first eye corresponding to the receiver 128A, and the scan pattern 852B can correspond to the second eye corresponding to the receiver 128B. The scan patterns 852A and 852B overlap in a region 860. In the region 860, the scan lines in the scan pattern 852A are offset relative to scan lines of the scan pattern 852B by approximately one half of a scan line to yield double pixel density within the overlap region 860. In the forward orientation of the lidar sensor unit 10, the overlap region 860 corresponds to the area directly ahead of the vehicle. The controller 130 or the vehicle controller 372 can use the increased pixel density to more accurately identify objects within overlap region 860.

Figure 43:
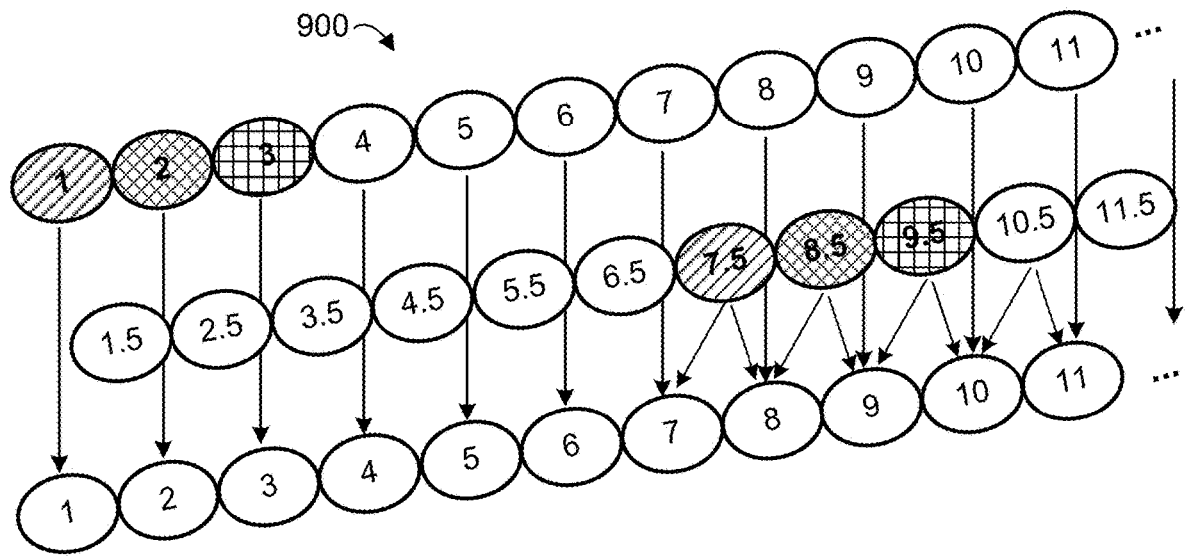
FIG. 43 illustrates an example scan using output beams with non-integer pixel separation, which the lidar system of FIG. 26A or 26B can generate.

FIG. 43 schematically illustrates a technique for scanning pixels with non-integer separation. In an example scenario 900, pulses of light in each output beam are directed toward different sections of a same scan line, so as to produce two pixels within the time of a single ranging event. For example, referring back to FIG. 25, the lidar sensor unit 10 during a first ranging event can direct the output beams 110A and 110B at pixels 1 and 7.5, respectively. In the next ranging event, the lidar sensor unit 10 can direct the output beams 110A and 110B at pixels 2 and 8.5, respectively, and during the third ranging event the output beams 110A and 110B can be aimed at pixels 3 and 9.5. When the controller 130 and/or the vehicle controller 372 processes data from the receiver 128A of 128B, the values corresponding to pixels with fractional indices (7.5, 8.5, 9.5, etc.) can be used to more accurately determine the values of pixels with neighboring integer indices (7, 8, 9, 10, etc.), as illustrated in FIG. 43.

Thus, the lidar sensor unit 10 in this example configuration concurrently scans pixels with a separation of 6.5 using two output beams of the same eye. More generally, the lidar sensor unit 10 can apply non-integer separation of pixels to beams associated with the same eye or two different eyes. Also, as discussed above, the lidar sensor unit 10 also can apply non-integer separation of pixels to beams associated with different eyes.

Figure 44:
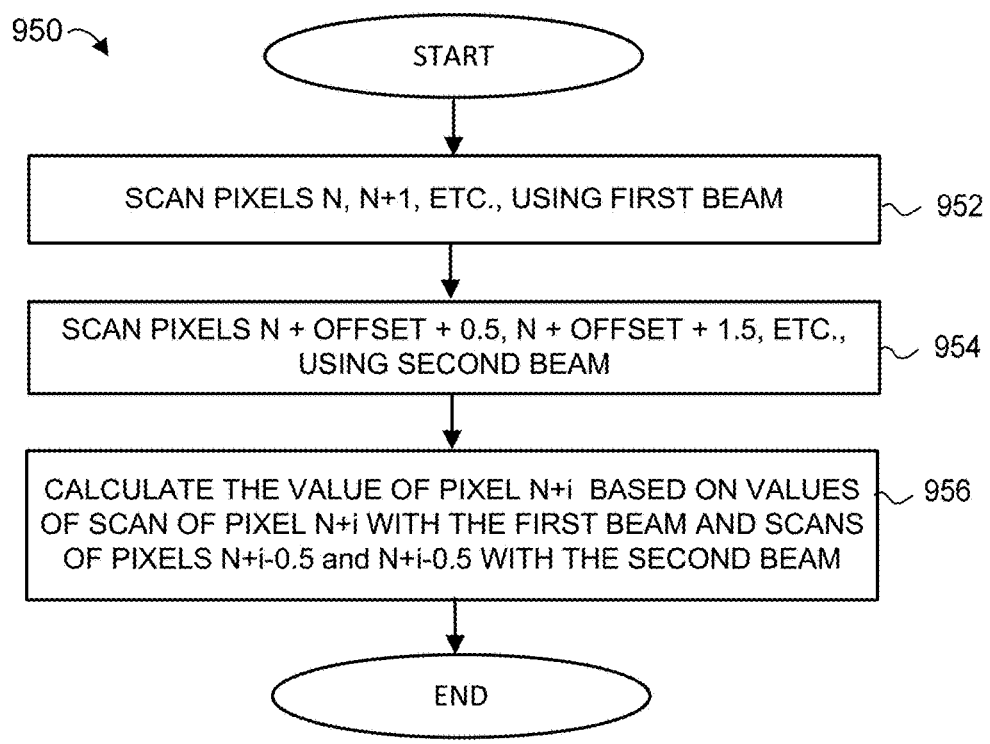
FIG. 44 is a flow diagram of an example method for generating pixel values using output beams with non-integer pixel separation.

FIG. 44 is a flow diagram of an example method 950 for generating pixel values using output beams with non-integer pixel separation, which can be implemented in the controller 130 of the lidar system 120A or 120B and/or vehicle controller 372.

At block 952, pixels N, N+1, and N+2 are scanned using a first output beam. Pixels N, separated by a non-integer offset, are scanned at block 954 to generate pixels N+ integer offset+0.5, pixels N+integer offset+1.5, pixels N+integer offset+2.5, etc. The blocks 954 and 956 are executed concurrently. At block 956, the values of pixels are calculated using the data generated by scanning the FOR with the first beam and the second beam. For example, the value of pixel #27 can be calculated using the result of scanning pixel #27 using the first output beam as well as the result of scanning pixels #26.5 and 27.5 using the second output beam. Block 956 can be implemented in the controller 130, for example.

VIII. General Considerations

In some cases, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In some cases, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various implementations have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A lidar system comprising:
   one or more light sources configured to generate a first beam of light and a second beam of light, the first beam of light comprising a pulse of light;
   a scanner configured to scan the first and second beams of light across a field of regard of the lidar system, the scanner comprising:
      a rotatable polygon mirror comprising a plurality of reflective surfaces angularly offset from one another along a periphery of the polygon mirror, the reflective surfaces configured to reflect the first and second beams of light to produce a series of scan lines as the polygon mirror rotates; and
      a pivotable scan mirror configured to (i) reflect the first and second beams of light and (ii) pivot to distribute the scan lines across the field of regard; and
   a receiver configured to detect the first beam of light and the second beam of light scattered by one or more remote targets, wherein the receiver comprises:
      a first detector configured to detect the first beam of scattered light, wherein the first detector includes an avalanche photodiode (APD) configured to produce an electrical-current pulse corresponding to scattered light from the pulse of light;
      a second detector configured to detect the second beam of scattered light; and
      a pulse-detection circuit coupled to the APD, the pulse-detection circuit comprising:
         a transimpedance amplifier (TIA) configured to receive the electrical-current pulse from the APD and produce a voltage pulse that corresponds to the received electrical-current pulse;
         a gain circuit configured to amplify the voltage pulse;
         a comparator configured to produce an electrical-edge signal when the amplified voltage pulse rises above or falls below a particular threshold voltage; and
         a time-to-digital converter (TDC) configured to determine an interval of time between emission of the pulse of light and receipt of the electrical-edge signal.

2. The lidar system of claim 1, wherein the first and second beams of light are directed to the polygon mirror so that the first and second beams of light are both reflected by one reflective surface at a time as the polygon mirror rotates.

3. The lidar system of claim 1, wherein the first and second beams of light are directed to the polygon mirror so that, as the polygon mirror rotates, the first and second beams of light are reflected by different reflective surfaces of the polygon mirror.

4. The lidar system of claim 1, wherein the first and second beams of light are directed (i) from the one or more light sources to the polygon mirror and (ii) then from the polygon mirror to the scan mirror, wherein the scan mirror directs the first and second beams of light to the field of regard of the lidar system.

5. The lidar system of claim 4, wherein the first and second beams of scattered light travel in an opposite direction with respect to the first and second beams of light, wherein the first and second beams of scattered light are directed (i) from the scan mirror to the polygon mirror and (ii) then from the polygon mirror to the receiver.

6. The lidar system of claim 1, wherein:
the first and second beams of light have a particular spatial or angular offset; and
the first and second beams of scattered light have a corresponding spatial or angular offset.

7. The lidar system of claim 1, wherein the scanner is configured to scan the first and second beams of light across the field of regard synchronously, wherein the first and second beams of light are scanned across the field of regard at approximately equal scanning rates.

8. The lidar system of claim 1, further comprising a controller configured to modify a drive signal for a motor of the scan mirror to adjust distances between the scan lines.

9. The lidar system of claim 1, wherein a width of a reflective surface of the scan mirror is greater than a width of each of the reflective surfaces of the polygon mirror.

10. The lidar system of claim 1, further comprising a lens configured to focus the first and second beams of scattered light onto the first and second detectors, respectively.

11. The lidar system of claim 1, wherein the first and second detectors are separated by a distance of 0.5 mm to 2 mm.

12. The lidar system of claim 1, wherein the one or more light sources comprise a laser diode that is current-modulated to produce optical pulses, wherein the laser diode is followed by one or more optical-amplification stages.

13. The lidar system of claim 1, wherein each of the first and second beams of light comprises pulses of light, wherein each pulse of light has (i) a wavelength between 1400 nm and 1600 nm, (ii) a pulse duration between 1 nanosecond and 20 nanoseconds, and (iii) a pulse energy between 0.1 microjoules and 100 microjoules.

14. The lidar system of claim 1, wherein:
the polygon mirror further comprises one or more tabs configured to pass through a stationary photo-interrupter as the polygon mirror rotates, wherein the photo-interrupter is configured to provide data to a controller indicating a rotational speed of the polygon mirror; and
the controller is configured to provide a control signal to a motor of the polygon mirror to regulate, stabilize, or adjust the rotational speed of the polygon mirror.

15. The lidar system of claim 1, further comprising a baffle or shroud that partially surrounds or encloses the polygon mirror.

16. The lidar system of claim 1, wherein the rotatable polygon mirror is a highly balanced rotatable polygon mirror comprising a block, wherein the highly balanced rotatable polygon mirror is manufactured by:
applying a coarse balancing procedure to the block; and
thereafter applying a precise balancing procedure to the block, comprising (i) imparting rotation to the block and (ii) removing material from the block using high-energy laser pulses.

17. The lidar system of claim 1, wherein the rotatable polygon mirror comprises a block that is made from glass, plastic, polycarbonate, metal, carbon fiber, or ceramic.

18. The lidar system of claim 1, wherein the rotatable polygon mirror comprises a block having edges or corners that are rounded or chamfered.

19. A lidar system comprising:
one or more light sources configured to generate a first beam of light, a second beam of light, a third beam of light, and a fourth beam of light;
a scanner configured to (i) scan the first and second beams of light across a first field of regard of the lidar system and (ii) scan the third and fourth beams of light across a second field of regard of the lidar system, the scanner comprising:
a rotatable polygon mirror comprising a plurality of reflective surfaces angularly offset from one another along a periphery of the polygon mirror, the reflective surfaces configured to reflect the first and second beams of light to produce a series of scan lines as the polygon mirror rotates; and
a pivotable scan mirror configured to (i) reflect the first and second beams of light and (ii) pivot to distribute the scan lines across the field of regard;
a first receiver configured to detect the first beam of light and the second beam of light scattered by one or more remote targets, wherein the first receiver comprises:
a first detector configured to detect the first beam of scattered light, and
a second detector configured to detect the second beam of scattered light; and
a second receiver configured to detect the third beam of light and the fourth beam of light scattered by one or more other remote targets, wherein the second receiver comprises:
a third detector configured to detect the third beam of scattered light, and
a fourth detector configured to detect the fourth beam of scattered light.

20. The lidar system of claim 19, wherein:
the first and second beams of light are directed to the polygon mirror so that the first and second beams of light are both reflected by one reflective surface at a time as the polygon mirror rotates;
the third and fourth beams of light are directed to the polygon mirror so that the third and fourth beams of light are both reflected by a different reflective surface as the polygon mirror rotates, wherein the reflective surfaces are further configured to reflect the third and fourth beams of light to produce another series of scan lines as the polygon mirror rotates; and
the pivotable scan mirror is further configured to (i) reflect the third and fourth beams of light and (ii) pivot to distribute the another series of scan lines across the second field of regard.

21. The lidar system of claim 19, wherein the first field of regard and the second field of regard partially overlap to define an overlap region.

22. A lidar system comprising:
one or more light sources configured to generate a first beam of light and a second beam of light;
a first fiber-optic cable terminated by a first collimator, wherein the first collimator is configured to direct the first beam of light to a scanner;
a second fiber-optic cable terminated by a second collimator, wherein the second collimator is configured to direct the second beam of light to the scanner;
the scanner, wherein the scanner is configured to scan the first and second beams of light across a field of regard of the lidar system, the scanner comprising:
a rotatable polygon mirror comprising a plurality of reflective surfaces angularly offset from one another along a periphery of the polygon mirror, the reflective surfaces configured to reflect the first and second beams of light to produce a series of scan lines as the polygon mirror rotates; and
a pivotable scan mirror configured to (i) reflect the first and second beams of light and (ii) pivot to distribute the scan lines across the field of regard; and a receiver configured to detect the first beam of light and the second beam of light scattered by one or more remote targets, wherein the receiver comprises:
- a first detector configured to detect the first beam of scattered light, and
- a second detector configured to detect the second beam of scattered light.

23. The lidar system of claim 22, wherein the first and second collimators are configured to launch the first and second beams of light, respectively, with a particular spatial offset or angular offset.

24. A lidar system comprising:
- one or more light sources configured to generate a first beam of light and a second beam of light;
- a scanner configured to scan the first and second beams of light across a field of regard of the lidar system, the scanner comprising:
  - a rotatable polygon mirror comprising a plurality of reflective surfaces angularly offset from one another along a periphery of the polygon mirror, the reflective surfaces configured to reflect the first and second beams of light to produce a series of scan lines as the polygon mirror rotates; and
  - a pivotable scan mirror configured to (i) reflect the first and second beams of light and (ii) pivot to distribute the scan lines across the field of regard; and
- a receiver configured to detect the first beam of light and the second beam of light scattered by one or more remote targets, wherein the receiver comprises:
  - a first detector configured to detect the first beam of scattered light, and
  - a second detector configured to detect the second beam of scattered light, wherein the first and second beams of light and the first and second beams of scattered light are arranged on a reflective surface of the scan mirror to minimize a surface area associated with the four beams, wherein the first and second beams of scattered light define a larger circle and the first and second beams of light each define a smaller circle arranged adjacent to the larger circle on the reflective surface of the scan mirror, wherein a line segment connecting centers of the smaller circles is displaced relative to a diameter of the larger circle.

25. The lidar system of claim 24, wherein:

the first and second beams of light are directed (i) from the one or more light sources to the polygon mirror and (ii) then from the polygon mirror to the scan mirror; and the first and second beams of scattered light travel in an opposite direction with respect to the first and second beams of light, wherein the first and second beams of scattered light are directed (i) from the scan mirror to the polygon mirror and (ii) then from the polygon mirror to the receiver.

* * * * *